(12) United States Patent
Tsang et al.

(10) Patent No.: US 11,101,440 B2
(45) Date of Patent: Aug. 24, 2021

(54) ORGANIC ELECTROLUMINESCENT DEVICE

(71) Applicant: KYUSHU UNIVERSITY, NATIONAL UNIVERSITY CORPORATION, Fukuoka (JP)

(72) Inventors: Ping Kuen Daniel Tsang, Fukuoka (JP); Chihaya Adachi, Fukuoka (JP)

(73) Assignee: KYUSHU UNIVERSITY, NATIONAL UNIVERSITY CORPORATION, Fukuoka (JP)

(*) Notice: Subject to any disclaimer, the term of this patent is extended or adjusted under 35 U.S.C. 154(b) by 701 days.

(21) Appl. No.: 15/740,145

(22) PCT Filed: Jun. 30, 2016

(86) PCT No.: PCT/JP2016/069373
§ 371 (c)(1),
(2) Date: Dec. 27, 2017

(87) PCT Pub. No.: WO2017/002893
PCT Pub. Date: Jan. 5, 2017

(65) Prior Publication Data
US 2018/0190924 A1 Jul. 5, 2018

(30) Foreign Application Priority Data

Jul. 1, 2015 (JP) .................................. 2015-133001
Jan. 7, 2016 (JP) .............................. JP2016-001879

(51) Int. Cl.
*H01L 51/54* (2006.01)
*H01L 51/50* (2006.01)
*H01L 51/00* (2006.01)
*H01L 51/52* (2006.01)

(52) U.S. Cl.
CPC ...... *H01L 51/5016* (2013.01); *H01L 51/0077* (2013.01); *H01L 51/5024* (2013.01); *H01L 51/5056* (2013.01); *H01L 51/5072* (2013.01); *H01L 51/5092* (2013.01); *H01L 51/5096* (2013.01); *H01L 51/5206* (2013.01); *H01L 51/5221* (2013.01); *H01L 51/0067* (2013.01); *H01L 51/0085* (2013.01); *H01L 51/508* (2013.01); *H01L 2251/5384* (2013.01)

(58) Field of Classification Search
CPC ......... H01L 2251/5384; H01L 51/0032; H01L 51/0067; H01L 51/005; H01L 51/0062; H01L 51/0071; H01L 51/0072; H01L 51/0077; H01L 51/0079; H01L 51/0081; H01L 51/0085; H01L 51/50; H01L 51/508; H01L 51/5012; H01L 51/5016; H01L 51/5024; H01L 51/5092; H01L 51/5096; H01L 51/5221; H01L 51/5206; H01L 51/5056; H01L 51/5072
See application file for complete search history.

(56) References Cited

U.S. PATENT DOCUMENTS

| 2013/0112949 A1 | 5/2013 | Sim et al. |
| 2013/0228753 A1 | 9/2013 | Moon et al. |

FOREIGN PATENT DOCUMENTS

| EP | 2963696 A1 | 1/2016 |
| JP | 11-233262 A | 8/1999 |
| JP | 2005-268022 A | 9/2005 |
| JP | 2008-524848 A | 7/2008 |
| JP | 2008-258603 A | 10/2008 |
| JP | 2009-231265 A | 10/2009 |
| JP | 2011-503879 A | 1/2011 |
| JP | 2012-248405 A | 12/2012 |
| JP | 2013-116975 A | 6/2013 |
| JP | 2013-253121 A | 12/2013 |
| JP | 2013-256490 A1 | 12/2013 |
| JP | 2014-9224 A | 1/2014 |
| JP | 2014-9352 A | 1/2014 |
| JP | 2015-019071 A | 1/2015 |
| JP | 2015-119182 A | 6/2015 |
| JP | 2015-129240 A | 7/2015 |
| KR | 20100003632 A * | 1/2010 |
| TW | 201320431 A | 5/2013 |
| TW | 201332970 A | 8/2013 |
| WO | 2006-076092 A1 | 7/2006 |
| WO | 2009-061926 A2 | 5/2009 |
| WO | 2012-008331 A1 | 1/2012 |
| WO | 2012-070330 A1 | 5/2012 |
| WO | 2013-011954 A | 1/2013 |
| WO | 2013-011955 A | 1/2013 |
| WO | 2013-076948 A1 | 5/2013 |
| WO | 2013-081088 A1 | 6/2013 |
| WO | 2013-0154064 A | 10/2013 |

(Continued)

OTHER PUBLICATIONS

Chen et al. J. Mater. Chem. 2012, 22, 15620-15627. (Year: 2012).*
Machine translation of KR-2010-0003632. (Year: 2010).*
Office Action dated Oct. 31, 2018 for Chinese patent application No. 201680038144.3 with English Translation.
Extended European Search Report issued in the corresponding European patent application No. 16818001.6 dated Feb. 14, 2019.
International Preliminary Report on Patentability for corresponding PCT International Application No. PCT/JP2016/069373, dated Jun. 30, 2016 with English translation.
International Search Report for corresponding PCT International Application No. PCT/JP2016/069373.

(Continued)

*Primary Examiner* — Andrew K Bohaty
(74) *Attorney, Agent, or Firm* — Browdy and Neimark, PLLC

(57) ABSTRACT

An organic electroluminescent device having a structure of at least an anode 2, a light-emitting layer 3, an electron transporting layer 5 and a cathode 6 layered in that order, and having a charge trap concentration reducing layer 4 in the interface between the light-emitting layer 3 and the electron transporting layer 5 can suppress performance deterioration with time in driving to prolong the lifetime thereof.

23 Claims, 20 Drawing Sheets

(56) References Cited

FOREIGN PATENT DOCUMENTS

| | | |
|---|---|---|
| WO | 2013-161437 A1 | 10/2013 |
| WO | 2013-133359 A1 | 12/2013 |
| WO | 2014-34535 A1 | 3/2014 |
| WO | 2014-115743 A1 | 7/2014 |
| WO | 2014-122895 A1 | 8/2014 |
| WO | 2014-126200 A1 | 8/2014 |
| WO | 2014-133121 A1 | 9/2014 |
| WO | 2014-136758 A1 | 9/2014 |
| WO | 2014-136860 A1 | 9/2014 |
| WO | 2014-168101 A1 | 10/2014 |
| WO | 2014-189122 A1 | 11/2014 |
| WO | 2014-196585 A1 | 12/2014 |
| WO | 2014-203840 A1 | 12/2014 |
| WO | 2015/000548 A1 | 1/2015 |
| WO | 2015-008580 A1 | 1/2015 |
| WO | WO2015-002213 A1 | 1/2015 |
| WO | 2015-016200 A1 | 2/2015 |
| WO | 2015-019725 A1 | 2/2015 |
| WO | 2015-072537 A1 | 2/2015 |
| WO | 2015-072470 A1 | 5/2015 |
| WO | 2015-080182 A1 | 6/2015 |
| WO | 2015-080183 A1 | 6/2015 |
| WO | 2015-108049 A1 | 7/2015 |
| WO | 2015-129714 A1 | 9/2015 |
| WO | 2015-129715 A1 | 9/2015 |
| WO | 2015-133501 A1 | 9/2015 |
| WO | 2015-136880 A1 | 9/2015 |
| WO | 2015-137136 A1 | 9/2015 |
| WO | 2015-137202 A1 | 9/2015 |
| WO | 2015-137244 A1 | 9/2015 |
| WO | 2015-146541 A1 | 10/2015 |
| WO | 2015-159541 A1 | 10/2015 |

OTHER PUBLICATIONS

Office Action dated Oct. 30, 2019, in corresponding Taiwanese patent application No. 105121032 with its English Translation.

* cited by examiner

ORGANIC ELECTROLUMINESCENT DEVICE

TECHNICAL FIELD

The present invention relates to an organic electroluminescent device, in particular to prolongation of lifetime of an organic electroluminescent device.

BACKGROUND ART

Studies are being actively performed for enhancing the performance of organic light-emitting devices such as organic electroluminescent devices (organic EL devices), etc. In particular, various ingenious attempts for constituting an organic electroluminescent device by using various functional layers for promoting injection and transfer of charges from electrodes as combined with a light-emitting layer to thereby enhance the performance thereof are being made. Among these, there are seen studies relating to an organic electroluminescent device using a Group-1 atom-containing organic metal complex such as Liq (8-hydroxyquinolinolate-lithium) or the like as a material of a functional layer.

PTL 1 describes production of an organic EL device by forming a hole injection layer, a hole transporting layer, a light-emitting layer and an electron transporting layer in that order on a glass substrate with an indium-tin oxide (ITO) formed thereon (ITO glass substrate), then forming an electron injection layer above the electron transporting layer by vapor deposition with Liq thereon, and thereafter forming an electrode by vapor deposition with Al thereon.

PTL 2 describes production of an organic EL device by forming a hole transporting layer and a light-emitting layer in that order on an ITO glass substrate, then forming an electron injection layer on the light-emitting by vapor deposition with Liq thereon, and further forming a cathode by vapor deposition with Al thereon.

CITATION LIST

Patent Literature

PTL 1: JP2008-258603A
PTL 2: JP11-233262A

SUMMARY OF INVENTION

Technical Problem

As described above, in the organic EL device produced in PTL 1, the Liq layer is formed in the interface between the electron transporting layer and the cathode, and in the organic EL device produced in PTL 2, the Liq layer is formed in the interface between the light-emitting layer and the cathode. Both these references clearly describe provision of the Liq layer as an electron injection layer.

Regarding these, the present inventors have made exhaustive investigations of evaluating the performance of organic electroluminescent devices where a Liq layer is provided in the other site than the position adjacent to the cathode therein, and have found for the first time that, especially when a Liq layer is provided in the interface between a light-emitting layer and an electron transporting layer, then brightness reduction and voltage increase to occur with time in long-term driving of the organic EL device can be significantly suppressed and the lifetime of the organic EL device is greatly prolonged. Both PTLs 1 and 2 presuppose that the Liq layer is provided in the position adjacent to the cathode so as to function as an electron injection layer, and have neither examples of actually forming a Liq layer in the interface between a light-emitting layer and an electron transporting layer nor description relating to the Liq layer to express any other function than an electron injection layer. Consequently, from these references, anyone could not anticipate an effect device lifetime prolongation to be attained by providing a Liq layer in the interface between a light-emitting layer and an electron transporting layer.

Given the situation, the present inventors have made further investigations relating to a layer to be provided in the interface between a light-emitting layer and an electron transporting layer, and made assiduous studies for the purpose of obtaining a long-life organic electroluminescent device capable of suppressing performance deterioration with time in driving.

Solution to Problem

For the purpose of solving the above-mentioned problems, the present inventors have made assiduous studies, specifically having noted that the performance degradation of organic electroluminescent devices to occur with time in driving is mainly caused by charge accumulation in the deep trap level inside the devices. As a result, the inventors have found that, when a layer having a function to decrease the charge trap concentration is inserted in the interface between a light-emitting layer and an electron transporting layer, the performance deterioration with time in device driving can be effectively suppressed and the lifetime of the resultant organic electroluminescent device can be noticeably prolonged. In that manner, the technical idea of noticeably prolonging the lifetime of an organic electroluminescent device merely by inserting an extremely thin layer into the interface between an electron transporting layer and a light-emitting layer is a surprising finding.

The present invention has been made on the basis of this finding, and specifically has the following constitution.

[1] An organic electroluminescent device having a structure of at least an anode, a light-emitting layer, an electron transporting layer and a cathode layered in that order, and having a charge trap concentration reducing layer in the interface between the light-emitting layer and the electron transporting layer.

[2] The organic electroluminescent device according to [1], wherein the mean thickness of the charge trap concentration reducing layer is 0.1 to 100 nm.

[3] The organic electroluminescent device according to [1] or [2], wherein the charge trap concentration reducing layer contains a Group-1 atom, a Group-2 atom or a transition metal atom.

[4] The organic electroluminescent device according to [3], wherein the charge trap concentration reducing layer is a layer containing Li.

[5] The organic electroluminescent device according to [4], wherein the charge trap concentration reducing layer is a layer formed of a 8-hydroxyquinolinolate derivative.

[6] The organic electroluminescent device according to any one of [1] to [5], wherein the electron transporting layer does not contain a metal atom.

[7] The organic electroluminescent device according to any one of [1] to [6], having a second electron transporting layer on the cathode side of the electron transporting layer, and having a functional layer containing a Group-1 atom, a Group-2 atom or a transition metal atom between the electron transporting layer and the second electron transporting layer.

[8] The organic electroluminescent device according to [7], wherein the mean thickness of the functional layer is 0.1 to 100 nm.

[9] The organic electroluminescent device according to [7] or [8], wherein the functional layer is a layer containing Li.

[10] The organic electroluminescent device according to [9], wherein the functional layer is a layer formed of a 8-hydroxyquinolinolate derivative.

[11] The organic electroluminescent device according to any one of [7] to [10], wherein the second electron transporting layer does not contain a metal atom.

[12] The organic electroluminescent device according to any one of [1] to [11], wherein the light-emitting layer contains a first host material and a second host material.

[13] The organic electroluminescent device according to [12], wherein the first host material and the second host material both have a lowest excited triplet energy level higher than the lowest excited triplet energy level of the light-emitting material that the light-emitting layer contains.

[14] The organic electroluminescent device according to [12] or [13], wherein the second host material has electron transportability.

[15] The organic electroluminescent device according to any one of [12] to [14], wherein the second host material is the same material as the constituent material of the electron transporting layer adjacent to the charge trap concentration reducing layer.

[16] The organic electroluminescent device according to any one of [12] to [15], wherein the second host material is a compound represented by the following general formula (1):

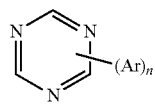

[In the general formula (1), Ar represents a substituted or unsubstituted aryl group, or a substituted or unsubstituted heteroaryl group, n represents an integer of 1 to 3, and when n is 2 or more, plural Ar's may be the same or different.]

[17] The organic electroluminescent device according to [16] wherein the compound represented by the general formula (1) is a compound represented by the following general formula (2):

General Formula (2)

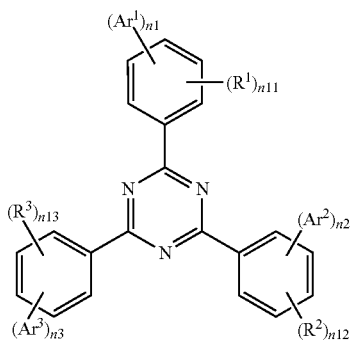

[In the general formula (2), $Ar^1$, $Ar^2$ and $Ar^3$ each independently represent a substituted or unsubstituted aryl group, or a substituted or unsubstituted heteroaryl group, $R^1$, $R^2$ and $R^3$ each independently represent a substituent, and the substituent is neither a substituted or unsubstituted aryl group nor a substituted or unsubstituted heteroaryl group, n1, n2 and n3 each independently represent an integer of 1 to 5, n11, n12 and n13 each independently represent an integer of 0 to 4.]

[18] The organic electroluminescent device according to any one of [1] to [17], wherein the light-emitting layer has a multilayer structure having a different light-emitting material concentration in each layer.

[19] The organic electroluminescent device according to any one of [7] to [18], wherein at least one of the electron transporting layer and the second electron transporting layer contains a compound containing Group-1 atom, a Group-2 atom or a transition metal atom.

[20] The organic electroluminescent device according to [19], wherein the second electron transporting layer contains a compound containing a Group-1 atom, a Group-2 atom or a transition metal atom.

[21] The organic electroluminescent device according to [19] or [20], wherein the compound is a compound containing Li.

[22] The organic electroluminescent device according to any one of [19] to [21], wherein the compound is a 8-hydroxyquinolinolate derivative.

[23] The organic electroluminescent device according to any one of [7] to [22], wherein the second electron transporting layer contains the same material as the constituent material of the charge trap concentration reducing layer.

Advantageous Effects of Invention

The organic electroluminescent device of the present invention has a charge trap concentration reducing layer in the interface between the light-emitting layer and the electron transporting layer therein, and therefore can suppress performance deterioration with time in driving to greatly prolong the lifetime thereof.

DESCRIPTION OF EMBODIMENTS

Figure 1:
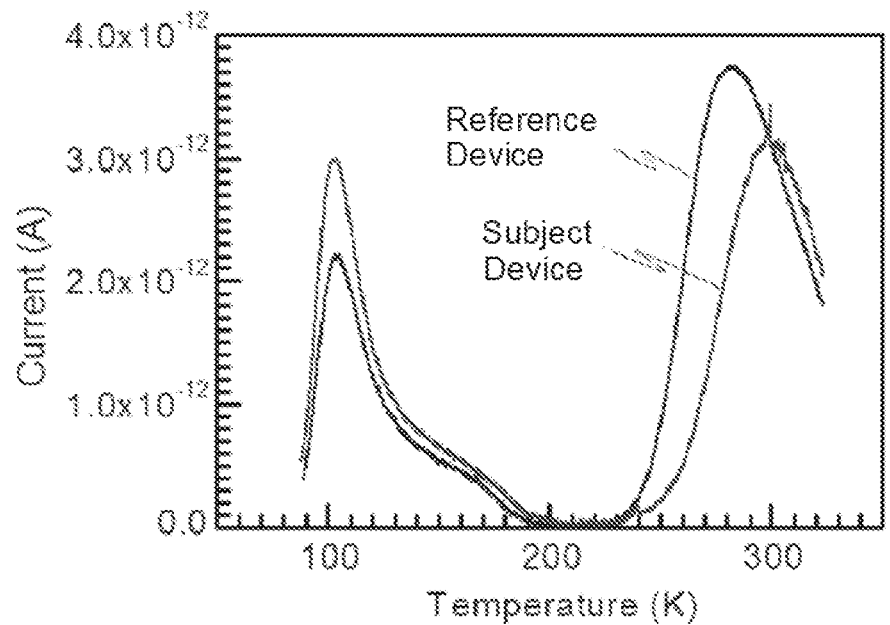
FIG. 1 This is a characteristic graph showing an example of a TSC profile measured with an organic electroluminescent device.

The contents of the invention will be described in detail below. The constitutional elements may be described below with reference to representative embodiments and specific examples of the invention, but the invention is not limited to the embodiments and the examples. In the description, a numerical range expressed with reference to an upper limit and/or a lower limit means a range that includes the upper limit and/or the lower limit. In the invention, the hydrogen atom that is present in a molecule of the compound used in the invention is not particularly limited in isotope species, and for example, all the hydrogen atoms in the molecule may be $^1H$, and all or a part of them may be $^2H$ (deuterium (D)).

The organic electroluminescent device of the present invention has a structure of at least an anode, a light-emitting layer, an electron transporting layer and a cathode layered in that order, and has a charge trap concentration reducing layer in the interface between the light-emitting layer and the electron transporting layer.

In the present invention, the "charge trap concentration reducing layer" means a layer by which the peak area between 250 and 320 K in measurement of thermal stimulated current (TSC) is reduced. In other words, the layer is such that, when an organic electroluminescent device having a charge trap concentration reducing layer and an organic electroluminescent device having the same configuration as that of the former organic electroluminescent device except that the later does not have a charge trap concentration reducing layer are subjected to thermal stimulated current measurement, the peak area of a peak appearing between 250 and 320 K in the profile of the former organic electroluminescent device is smaller than that of the latter organic electroluminescent device owing to the formation of the layer. In the following description, the organic electroluminescent device having a charge trap concentration reducing layer may be referred to as "subject device", and the organic electroluminescent device having the same configuration as that of the subject device except that it does not have a charge trap concentration reducing layer may be referred to as "reference device".

For measuring the peak area between 250 and 320 K in the TSC profile, first, the organic electroluminescent device is subjected to thermal stimulated current measurement.

Thermal stimulated current measurement is such that the charges trapped on a localized level of an organic semiconductor thin film are released by heat and are detected as a current value to provide a TSC profile (temperature profile of current value). From the temperature at the peak of the TSC profile, the depth of the localized level can be determined, and from the peak area of the peak, the charge concentration at the localized level can be estimated. Here, the charge includes both a negative charge of an electron and a positive charge of a hole.

In the present invention, specifically, thermal stimulated current measurement is carried out as follows. An organic electroluminescent device of a subject for measurement is cooled in a vacuum chamber to a liquid nitrogen temperature (77 K). Next, while kept at 77 K, a bias current of 2 mA/cm$^2$ is applied to the organic electroluminescent device for 2 minutes for charge accumulation at the trap level inside the device. Subsequently, while a correcting voltage of −0.01 V is kept applied thereto, the organic electroluminescent device is heated at a rate of 5°/min, whereupon the current detected during the process is measured to give a TSC profile. Such thermal stimulated current measurement may be carried out using a thermal stimulated current indicator (product name TSC-FETT EL2000) manufactured by Rigaku Corporation.

In the resultant TSC profile, the peak area of the peak appearing between 250 and 320 K is measured. Here, the number of the peak appearing between 250 and 320 K may be one or more. In the case where plural peaks appear between 250 and 320 K, the sum total of the peak areas of the peaks corresponds to the "peak area between 250 and 320 K".

Some typical examples of a TSC profile measured with an organic electroluminescent device is shown in FIG. 1. The TSC profiles shown in FIG. 1 are examples, and the TEC profile to be observed with the organic electroluminescent device of the present invention is not limitatively interpreted as in FIG. 1. In FIG. 1, "subject device" is an organic electroluminescent device having a Liq layer formed as the charge trap concentration reducing layer, and "reference device" is an organic electroluminescent device produced in the same manner as that for the subject device except that a charge trap concentration reducing layer was not formed therein.

As shown in FIG. 1, the TSC profiles of the subject device and the reference device each have one peak in low-temperature region at around 105 K and in a high-temperature region at 250 to 320 K. Among these, the peak in the low-temperature region corresponds to release of charges accumulated in a shallow trap level, while the peak in the high-temperature region corresponds to release of charges accumulated in a deep trap level. The peak area of each peak reflects the concentration of the charges accumulated in each trap level. Here, the peaks in a high-temperature range in the two devices are compared with each other. The peak strength in the high-temperature region of the subject device noticeably reduced as compared with that of the reference device, and the peak area of the former is 1/1.41 of the peak area of the reference device. This means that, owing to the charge trap concentration reducing layer therein, the charge concentration at the deep trap level in the subject device reduced.

The "charge trap concentration reducing layer" in the present invention is a material layer provided in the interface between a light-emitting layer and an electron transporting layer, and the peak area in the high-temperature region (250 to 320 K) of the thus-determined TSC profile of the subject device is smaller than that of the reference device. The charge trap concentration reducing layer of the type is considered to be able to effectively suppress formation of a deep trap level inside the device and suppress accumulation of charges in a deep trap level in driving an organic electroluminescent device. Consequently, the organic electroluminescent device of the type can suppress EL performance deterioration with time and can attain noticeable prolongation of lifetime.

Figure 2:
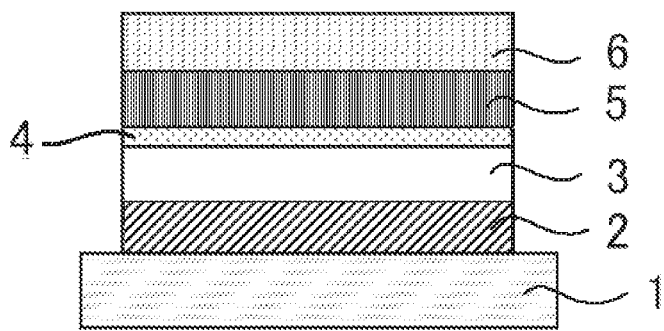
FIG. 2 This is a schematic cross-sectional view showing a layer configuration example of an organic electroluminescent device.
Figure 3:
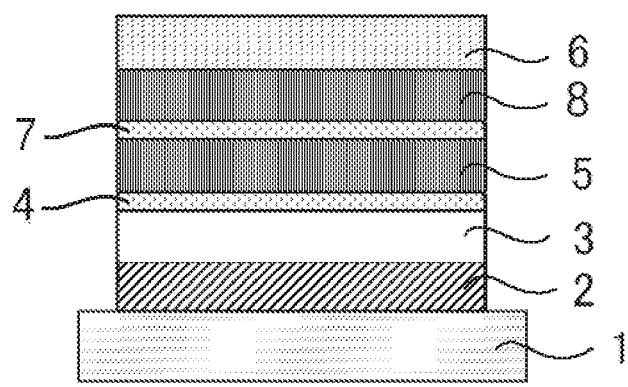
FIG. 3 This is a schematic cross-sectional view showing another layer configuration example of an organic electroluminescent device.

As described above, the organic electroluminescent device of the present invention has a structure of at least an anode, a light-emitting layer, an electron transporting layer and a cathode laminated in that order, and has a charge trap concentration reducing layer in the interface between the light-emitting layer and the electron transporting layer. Further, the organic electroluminescent device of the present invention may have a second electron transporting layer on the cathode side of the electron transporting layer, and may have a functional layer containing a Group-1 atom, a Group-2 atom or a transition metal atom between the electron transporting layer and the second electron transporting layer. Having the functional layer along with the charge trap concentration reducing layer, the organic electroluminescent device may have a more prolonged lifetime. So far as the organic electroluminescent device of the present invention has such a basic structure, the layer configuration thereof is not specifically limited. Specific examples of the layer configuration include a structure of an anode 2, a light-emitting layer 3, a charge trap concentration reducing layer 4, an electron transporting layer 5 and a cathode 6 layered in that order on a substrate 1, as shown in FIG. 2; and a structure of an anode 2, a light-emitting layer 3, a charge trap concentration reducing layer 4, an electron transporting layer 5, a functional layer 7, a second electron transporting layer 8 and a cathode 6 layered in that order on a substrate 1, as shown in FIG. 3.

Figure 4:
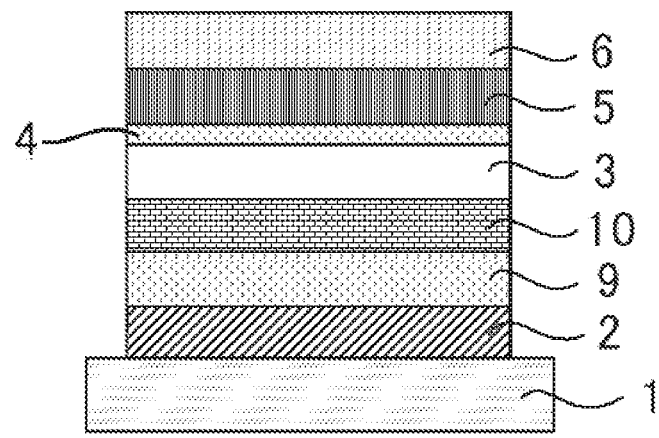
FIG. 4 This is a schematic cross-sectional view showing still another layer configuration example of an organic electroluminescent device.

As combined with the charge trap concentration reducing layer, the electron transporting layer and the functional layer therein, the organic electroluminescent device may have any other organic layer having a different function. The other organic layer includes a hole transporting layer, a hole injection layer, an electron barrier layer, a hole barrier layer, an electron injection layer, an electron transporting layer, and an exciton barrier layer, etc. The hole transporting layer may be a hole injection/transporting layer having a hole injection function, and the electron transporting layer may be an electron injection/transporting layer having an electron injection function. A configuration example of the organic electroluminescent device additionally having these organic layers is shown in FIG. 4. In FIG. 4, 1 is a substrate, 2 is an anode, 9 is a hole injection layer, 10 is a hole transporting layer, 3 is a light-emitting layer, 4 is a charge trap concentration reducing layer, 5 is an electron transporting layer, and 6 is a cathode.

In the following, the constituent members and layers of the organic electroluminescent device are described.

[Substrate]

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

Anode

The anode of the organic electroluminescent device used is preferably formed of as an electrode material a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred Ohm per square or less. The thickness thereof may be generally selected from a range of from 10 to 1,000 nm, and preferably from 10 to 200 nm, while depending on the material used.

[Cathode]

The cathode is preferably formed of as an electrode material a metal (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode 5 may be produced by forming the electrode material into a thin film by such a method as vapor deposition or sputtering. The cathode preferably has a sheet resistance of several hundred Ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

[Light-Emitting Layer]

The light-emitting layer is a layer in which holes and electrons injected from an anode and a cathode are recombined to give excitons for light emission, and a light-emitting material may be used alone as the light-emitting layer, but preferably the layer contains a light-emitting material and a host material.

The light-emitting material to be contained in the light-emitting layer may be a fluorescent light-emitting material or a phosphorescent light-emitting material. The light-emitting material may also be a delayed florescent material to emit delayed fluorescence along with ordinary fluorescence. Among these, when a delayed fluorescent material is used as a light-emitting material, high emission efficiency can be obtained.

In order that the organic electroluminescent device of the present invention can express high emission efficiency, it is important to trap singlet excitons and triplet excitons formed in a light-emitting material inside the light-emitting material. Accordingly, preferably, a host material is used in the light-emitting layer along with the light-emitting material therein. The host material to be used may be an organic compound of such that at least any one of the excited singlet energy and the excited triplet energy thereof is higher than that of the light-emitting material. As a result, the singlet excitons and the triplet excitons formed in the light-emitting material can be trapped in the molecule of the light-emitting material for use in the present invention, and the emission efficiency can be fully expressed. Needless-to-say, even when singlet excitons and triplet excitons could not be fully trapped, high emission efficiency may be obtained as the case may be, and therefore, any and every host material capable of realizing high emission efficiency can be used in the present invention with no specific limitation. In the organic electroluminescent device of the present invention, light emission results from the light-emitting material contained in the light-emitting layer in the present invention. The emission may be any of fluorescent emission, delayed fluorescent emission or phosphorescent emission, and even may be a mixture of these emission modes. In addition, a part of light emission may be partially from a host material.

In the case where a host material is used, the amount of the light-emitting material to be contained in the light-emitting layer is preferably 0.10% by weight or more, more preferably 1% by weight or more, and is preferably 50% by weight or less, more preferably 20% by weight or less, even more preferably 10% by mass or less.

The host material in the light-emitting layer is preferably an organic compound having hole transportability and electron transportability, capable of preventing the wavelength of light to be emission from being prolonged, and having a high glass transition temperature.

In the case where a host material is used, one alone of a host material may be contained in the light-emitting layer, or two or more kinds of host materials may be contained in the light-emitting layer as combined. In the case where two or more kinds of host materials are used, preferably, at least a first host material and a second host material differing from the first host material in point of characteristics such as energy level, carrier transportability and the like, are combined. Accordingly, characteristics such as emission efficiency, lifetime and the like of the organic electroluminescent device can be controlled with ease.

In such a case, in addition, from the viewpoint of more prolonging the lifetime of the device, preferably, both the first host material and the second host material has a lowest excited triplet energy level higher than the lowest excited triplet energy level of the light-emitting material, and more preferably, the difference between the lowest excited triplet energy level $T1_h$ of at least one of the first host material and the second host material and the lowest excited triplet energy level $T1_d$ of the light-emitting material, $T1_h$-$T1_d$ (hereinafter referred to as "energy level difference $\Delta T1$) is more than 0 eV, and is preferably 1 eV or less, more preferably 0.7 eV or less, even more preferably 0.5 eV or less.

The relationship between the lowest excited singlet energy level $S1_d$ of the light-emitting material and the lowest excited singlet energy level $S1_h$ of each of the first host material and the second host material is not specifically limited, but preferably, the first hose material and the second host material each have a lowest excited singlet energy level $S1_h$ higher than the lowest excited singlet energy level $S1_d$ Of the light-emitting material. Accordingly, the singlet excitons formed in the light-emitting material can be trapped in the molecule of the light-emitting material and the energy of the singlet excitons can be effectively utilized for light emission.

In this description, the lowest excited singlet energy level $S1_d$ and $S1_h$, and the lowest excited triplet energy level $T1_d$ and $T1_h$ of the light-emitting material, and the first host material and the second host material are values to be determined according to the following procedures.

(1) Lowest Excited Singlet Energy Level S1 ($S1_d$, $S1_h$)

The compound to be measured is vapor-deposited on a Si substrate to produce a specimen, and the specimen is measured for a fluorescent spectrum at ordinary temperature (300 K). In the fluorescent spectrum, the ordinate is the light emission, and the abscissa is the wavelength. A tangent line is drawn for the downfalling part of the light emission spectrum on the short wavelength side, and the wavelength λedge (nm) of the intersection point of the tangent line and the abscissa is obtained. The wavelength value is converted to an energy value according to the following conversion expression to provide the singlet energy S1.

$S1$ [eV]=1239.85/λedge     Conversion Expression:

The light emission spectrum is measured with a nitrogen laser (MNL200, produced by Lasertechnik Berlin GmbH) as an excitation light source and Streak Camera (C4334, produced by Hamamatsu Photonics K.K.) as a detector.

(2) Lowest Excited Triplet Energy Level T1 ($T1_d$, $T1_h$)

The same specimen as used for the singlet energy S1 is cooled to 77 [K], the specimen for measuring phosphorescent light is irradiated with excitation light (337 nm), and the phosphorescence intensity is measured with a streak camera. A tangent line is drawn for the upstanding part of the phosphorescent spectrum on the short wavelength side, and the wavelength λedge (nm) of the intersection point of the tangent line and the abscissa is obtained. The wavelength value is converted to an energy value according to the following conversion expression to provide the triplet energy T1.

$T1$ [eV]=1239.85/λedge     Conversion Expression:

The tangent line for the upstanding part of the phosphorescent spectrum on the short wavelength side is drawn in the following manner. Over the range in the phosphorescent spectrum curve of from the short wavelength end to the maximum peak value closest to the short wavelength end among the maximum peak values of the spectrum, a tangent line is assumed while moving within the range toward the long wavelength side. The gradient of the tangent line is increased while the curve is standing up (i.e., the value of the ordinate is increased). The tangent line that is drawn at the point where the gradient thereof becomes maximum is designated as the tangent line for the upstanding part of the phosphorescent spectrum on the short wavelength side.

A maximum peak having a peak intensity that is 10% or less of the maximum peak point intensity of the spectrum is not included in the maximum peak values and thus is not designated as the maximum peak value closest to the short wavelength end, and the tangent line that is drawn at the point where the gradient becomes maximum that is closest to the maximum peak value closest to the short wavelength end is designated as the tangent line for the upstanding part of the phosphorescent spectrum on the short wavelength side.

Of the first host material and the second host material, preferably, at least the second host material has electron transportability. Accordingly, electrons can be smoothly moved in the light-emitting layer to prevent performance deterioration with time and to attain further prolongation of lifetime. The second material of the type is preferably the same material as the constituent material for the electron transporting layer adjacent to the cathode side of the charge trap concentration reducing layer.

Also preferably, the second host material significantly differs from the first host material in point of the HOMO level and the LUMO level. Accordingly, the recombination zone for electrons and holes can be controlled for enhancing characteristics such as lifetime prolongation etc. The second host material of the type is, for example, preferably such that the HOMO level thereof is lower than the HOMO level of the light-emitting material and the first host material, and the LUMO level thereof is higher than the LUMO level of the light-emitting material is lower than the LUMO level of the first host material.

For example, the following compounds are preferred for the first host material.

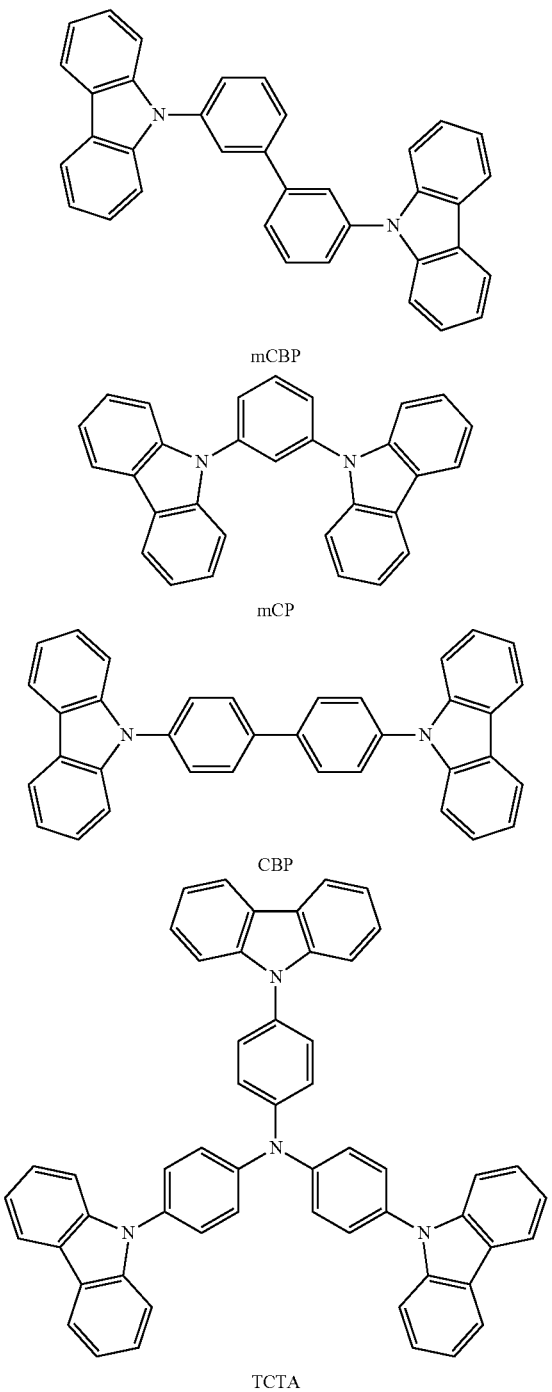

mCBP mCP

CBP

TCTA

For example, compounds represented by the following general formula (1) are preferred for the second host material.

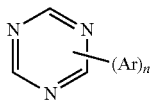

In the general formula (1). Ar represents a substituted or unsubstituted aryl group, or a substituted or unsubstituted heteroaryl group. n represents an integer of 1 to 3. n is preferably 2 or more. When n is 2 or more, plural Ar's may be the same as or different from each other, but are preferably the same. For the explanation and the preferred embodiments of Ar, the explanation and the preferred embodiments of $Ar^1$. $Ar^2$ and $Ar^1$ in the following general formula (2) may be referred to. The compounds represented by the general formula (1) may have a rotationally symmetrical structure or may not have a rotationally symmetrical structure.

The compound represented by the general formula (1) is preferably a compound represented by the following general formula (2).

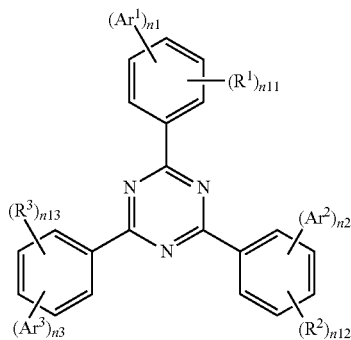

In the general formula (2), $Ar^1$, $Ar^2$ and $Ar^3$ each independently represent a substituted or unsubstituted aryl group, or a substituted or unsubstituted heteroaryl group. $Ar^1$, $Ar^2$ and $Ar^3$ may be the same as or different from each other, but are preferably the same. n1, n2 and n3 each independently represent an integer of 1 to 5. n1, n2 and n3 each are preferably 1 to 3, more preferably 1 or 2. n1, n2 and n3 may be the same as or different from each other, but are preferably the same. When n1 is 2 or more, two or more $Ar^1$'s may be the same as or different from each other. When n2 is 2 or more, two or more $Ar^2$'s may be the same as or different from each other. When n3 is 2 or more, two or more $Ar^3$'s may be the same as or different from each other.

The aromatic ring to constitute the substituted or unsubstituted aryl group that $Ar^1$, $Ar^2$ and $Ar^3$ each may represent may be a single ring or a condensed ring of two or more aromatic rings. The number of carbon atoms to constitute the ring skeleton of the aromatic ring is preferably 6 to 22, more preferably 6 to 18, even more preferably 6 to 14, still more preferably 6 to 10. Specific examples of the aromatic ring to constitute the aryl group include a benzene ring, and a naphthalene ring. The heterocyclic aromatic ring to constitute the substituted or unsubstituted heteroaryl group that $Ar^1$, $Ar^2$ and $Ar^3$ each may represent may be a single ring or may be a condensed ring of one or more hetero rings and one or more aromatic rings, or a condensed ring of two or more hetero rings. However, the ring having the bond of $Ar^1$, $Ar^2$ and $Ar^3$ is a hetero ring. The number of atoms to constitute the ring skeleton of the hetero ring is preferably 5 to 22, more preferably 5 to 18, even more preferably 5 to 14, still more preferably 5 to 10. The number of carbon atoms to constitute the ring skeleton of the hetero ring is preferably 4 to 21, more preferably 4 to 17, even more preferably 4 to 13, still more preferably 4 to 9. The hetero atom to constitute the ring skeleton of the hetero ring is preferably a nitrogen atom, an oxygen atom and a sulfur atom, more preferably a nitrogen atom. Specific examples of the heteroaromatic ring to constitute the heteroaryl group include a pyridine ring, a pyridazine ring, a pyrimidine ring, a triazine ring, a triazole ring, and a benzotriazole ring.

The substituent that may substitute for the aryl group to be represented by $Ar^1$, $Ar^2$ and $Ar^3$, and the substituent that may substitute for the heteroaryl group to be represented by $Ar^1$, $Ar^2$ and $Ar^3$ are not specifically limited. Examples of the substituent include a hydroxyl group, a halogen atom, a cyano group, an alkyl group having 1 to 20 carbon atoms, an alkoxy group having 1 to 20 carbon atoms, an alkylthio group having 1 to 20 carbon atoms, an alkyl-substituted amino group having 1 to 20 carbon atoms, an acyl group having 2 to 20 carbon atoms, an aryl group having 6 to 40 carbon atoms, an aryloxy group having 6 to 40 carbon atoms, an arylthio group having 6 to 40 carbon atoms, a heteroaryl group having 3 to 40 carbon atoms, a heteroaryloxy group having 3 to 40 carbon atoms, a heteroarylthio group having 3 to 40 carbon atoms, an alkenyl group having 2 to 10 carbon atoms, an alkynyl group having 2 to 10 carbon atoms, an alkoxycarbonyl group having 2 to 10 carbon atoms, an alkylsulfonyl group having 1 to 10 carbon atoms, a haloalkyl group having 1 to 10 carbon atoms, an amide group, an alkylamide group having 2 to 10 carbon atoms, a trialkylsilyl group having 3 to 20 carbon atoms, a trialkylsilylalkyl group having 4 to 20 carbon atoms, a trialkylsilylalkenyl group having 5 to 20 carbon atoms, a trialkylsilylalkynyl group having 5 to 20 carbon atoms, a nitro group, etc. Of these specific examples, those that are substitutable with any other substituent may be further substituted. More preferred substituents include a halogen atom, a cyano group, a substituted or unsubstituted alkyl group having 1 to 20 carbon atoms, an alkoxy group having 1 to 20 carbon atoms, a substituted or unsubstituted aryl group having 6 to 40 carbon atoms, a substituted or unsubstituted aryloxy group having 6 to 40 carbon atoms, a substituted or unsubstituted heteroaryl group having 3 to 40 carbon atoms, a substituted or unsubstituted heteroaryloxy group having 3 to 40 carbon atoms, and a dialkyl-substituted amino group having 1 to 20 carbon atoms. Even more preferred substituents include a fluorine atom, a chlorine atom, a cyano group, a substituted or unsubstituted alkyl group having 1 to 10 carbon atoms, a substituted or unsubstituted alkoxy group having 1 to 10 carbon atoms, a substituted or unsubstituted aryl group having 6 to 15 carbon atoms, and a substituted or unsubstituted heteroaryl group having 3 to 12 carbon atoms. The number of the substituents is preferably 0 to 5, more preferably 0 to 4.

$R^1$, $R^2$ and $R^3$ in the general formula (2) each independently represent a substituent. However, the substituent is neither a substituted or unsubstituted aryl group nor a substituted or unsubstituted heteroaryl group. n11, n12 and n13 each independently represent an integer of 0 to 4, preferably an integer of 0 to 2, more preferably 0 or 1. Also preferably, at least one of n11, n12 and n13 is 0, and more preferably, all of them are 0. When n11 is 2 or more, two or more $R^1$'s may be the same as or different from each other;

when n12 is 2 or more, two or more $R^2$'s may be the same as or different from each other; and when n13 is 2 or more, two or more $R^3$'s may be the same as or different from each other. $(R')_{n11}$, $(R^2)_{n12}$ and $(R^3)_{n13}$ may be the same as or different from each other, but are preferably the same.

For the explanation and the preferred range of the substituent represented by $R^1$, $R^2$ and $R^3$, the explanation and the preferred range of the substituent to substitute for the aryl group to be represented by $Ar^1$, $Ar^2$ and $Ar^1$ may be referred to.

The compound represented by the general formula (2) may have a rotationally symmetric structure where the structures at the 2-position, the 4-position and the 6-position of the triazine ring are all the same, or may have a structure where the structures at only two of the 2-position, the 4-position and the 6-position are the same, or may have a structure where the structures at all the three positions differ, but preferably, the compound has a rotationally symmetric structure.

Specific examples of the compound represented by the general formula (1) include T2T and derivatives thereof.

Not limited to the compound represented by the general formula (1), the following compounds are preferably usable as the second host material. However, the second host material for use in the present invention is not limitatively interpreted by these specific examples.

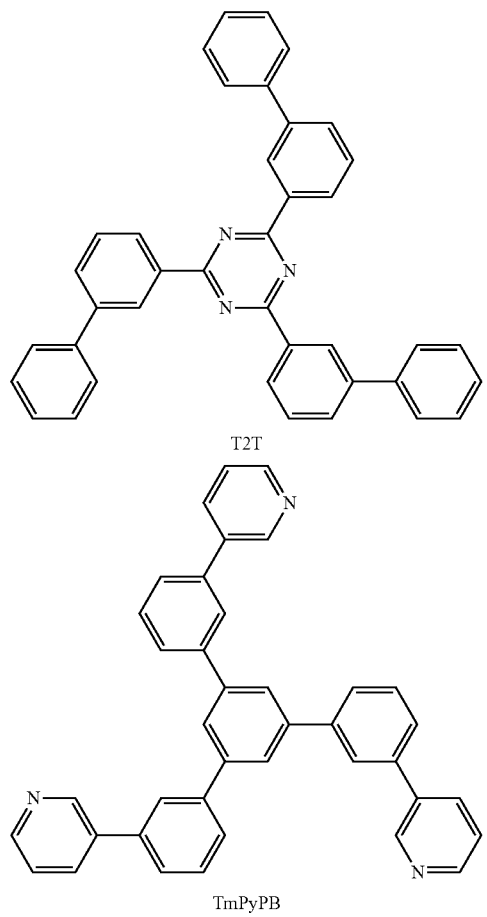

T2T

TmPyPB

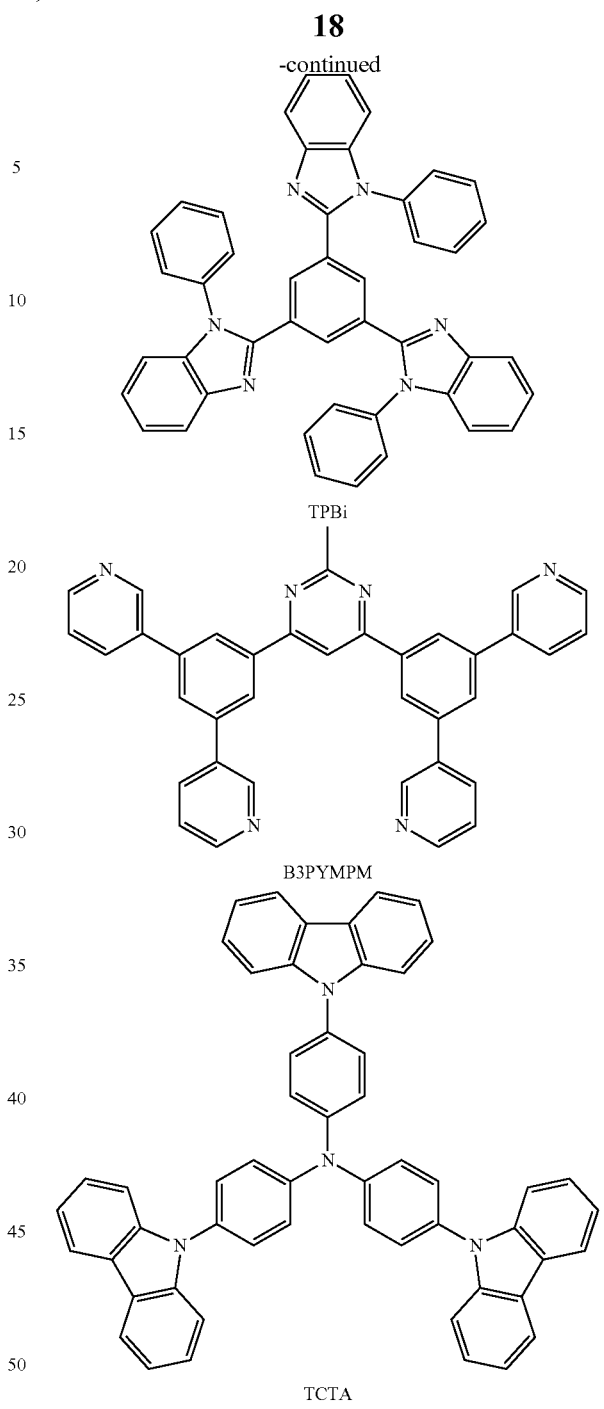

TPBi

B3PYMPM

TCTA

Specific examples of the combination of a first host material and a second host material include mCBP/T2T, mCP/T2T, CBP/T2T, mCBP/TmPyPB, mCP/TmPyPB, CBP/TmPyPB, TCTA/TPBi, TCTA/B3PYMPM, mCBP/TPBi, mCP/TPBi, CBP/TPBi, mCBP/TCTA, mCP/TCTA, CBP/TCTA, etc.

The content of the light-emitting material in the light-emitting layer is preferably 0.1% by weight or more relative to the total amount of the light-emitting layer, more preferably 1% by weight or more, even more preferably 5% by weight or more. The content of the light-emitting material in the light-emitting layer is also preferably 50% by weight or less relative to the total amount of the light-emitting layer, more preferably 20% by weight or less, even more preferably 15% by weight or less.

In the case where the light-emitting layer contains a first host material and a second host material, the content of the first host material in the light-emitting layer is preferably 10% by weight or more relative to the total amount of the host material that the light-emitting layer contains, more preferably 70% by weight or more, even more preferably 80% by weight or more. The content of the first host material in the light-emitting layer is also preferably 95% by weight or less relative to the total amount of the host material that the light-emitting layer contains, more preferably 90% by weight or less.

In the case where the light-emitting layer contains a first host material and a second host material, the content of the second host material in the light-emitting layer is preferably 5% by weight or more relative to the total amount of the host material that the light-emitting layer contains, more preferably 10% by weight or more. The content of the second host material in the light-emitting layer is also preferably 90% by weight or less relative to the total amount of the host material that the light-emitting layer contains, more preferably 30% by weight or less, even more preferably 20% by weight or less.

The light-emitting layer may have a multilayer structure where plural layers each having a different light-emitting material concentration are layered. The number of the layers in the multilayer structure is preferably 2 to 20, and for example, the upper limit thereof may be set to be 10 or less, 5 or less, or 3 or less. The concentration of the light-emitting material in each layer may be so varied as to increase toward the side of the charge trap concentration decreasing layer, or to decrease toward the side, or may be varied randomly, but from the viewpoint of lifetime prolongation, preferably, the concentration is so varied as to increase toward the side of the charge trap concentration decreasing layer. Especially preferably, the light-emitting material concentration in the layer on the side of the charge trap concentration reducing layer is made to be larger than the light-emitting material concentration in the other layers of constituting the light-emitting layer. The concentration difference between the layer having a smallest concentration and the layer having a largest concentration may be, for example, 0.1 to 50%, and is preferably 1 to 20%, more preferably 2 to 15%. The concentration difference between the neighboring layers may be, for example, 0.1 to 50%, but is preferably 1 to 10%, more preferably 2 to 7%. The thickness of each layer may be the same or different, but is preferably the same.

The concentration of the light-emitting material in the light-emitting layer may be made to continuously vary toward the side of the charge trap concentration reducing layer. For example, the concentration may be made to continuously increase toward the side of the charge trap concentration decreasing layer.

As described above, the light-emitting material in the light-emitting layer is preferably a delayed fluorescent material since it attains high emission efficiency. The reason why a delayed fluorescent material can attain high emission efficiency is because of the following principle.

In an organic electroluminescent device, carriers are injected from an anode and a cathode to a light-emitting material to form an excited state for the light-emitting material, with which light is emitted. In the case of a carrier injection type organic electroluminescent device, in general, excitons that are excited to the excited singlet state are 25% of the total excitons generated, and the remaining 75% thereof are excited to the excited triplet state. Accordingly, the use of phosphorescence, which is light emission from the excited triplet state, provides a high energy utilization. However, the excited triplet state has a long lifetime and thus causes saturation of the excited state and deactivation of energy through mutual action with the excitons in the excited triplet state, and therefore the quantum yield of phosphorescence may generally be often not high. A delayed fluorescent material emits fluorescent light through the mechanism that the energy of excitons transits to the excited triplet state through intersystem crossing or the like, and then transits to the excited singlet state through reverse intersystem crossing due to triplet-triplet annihilation or absorption of thermal energy, thereby emitting fluorescent light. It is considered that among the materials, a thermal activation type delayed fluorescent material emitting light through absorption of thermal energy is particularly useful for an organic electroluminescent device. In the case where a delayed fluorescent material is used in an organic electroluminescent device, the excitons in the excited singlet state normally emit fluorescent light. On the other hand, the excitons in the excited triplet state emit fluorescent light through intersystem crossing to the excited singlet state by absorbing the heat generated by the device. At this time, the light emitted through reverse intersystem crossing from the excited triplet state to the excited singlet state has the same wavelength as fluorescent light since it is light emission from the excited singlet state, but has a longer lifetime (light emission lifetime) than the normal fluorescent light and phosphorescent light, and thus the light is observed as fluorescent light that is delayed from the normal fluorescent light and phosphorescent light. The light may be defined as delayed fluorescent light. The use of the thermal activation type exciton transition mechanism may raise the proportion of the compound in the excited singlet state, which is generally formed in a proportion only of 25%, to 25% or more through the absorption of the thermal energy after the carrier injection. A compound that emits strong fluorescent light and delayed fluorescent light at a low temperature of lower than 100° C. undergoes the intersystem crossing from the excited triplet state to the excited singlet state sufficiently with the heat of the device, thereby emitting delayed fluorescent light, and thus the use of the compound may drastically enhance the light emission efficiency.

[Electron Transporting Layer]

The electron transporting layer is formed of a material having a function of transporting electrons, and the electron transporting layer may be a single layer or may be formed of plural layers.

The electron transporting material (often also acting as a hole barrier material) may have a function of transmitting the electrons injected from a cathode to a light-emitting layer, but is preferably one not containing a metal atom.

The electron transporting layer usable here includes, for example, nitro-substituted fluorene derivatives, diphenylquinone derivatives, thiopyran dioxide derivatives, carbodiimides, fluorenylidenemethane derivatives, anthraquinodimethane and anthrone derivatives, oxadiazole derivatives, etc. Further, thiadiazole derivatives derived from the above-mentioned oxadiazole derivatives by substituting the oxygen atom in the oxadiazole ring with a sulfur atom, and quinoxaline derivatives having a quinoxaline ring known as an electron-attractive group are also usable as the electron transporting material. Further, polymer materials prepared by introducing these materials into the polymer chain, or having these material in the polymer main chain are also usable.

[Charge Trap Concentration Reducing Layer]

The charge trap concentration reducing layer is provided in the interface between the light-emitting layer and the electron transporting layer. As described above, the charge trap concentration reducing layer is a layer that reduce, owing to the formation of the layer, the peak area between 250 and 320 K (peak area in a high-temperature region) in thermal stimulated current (TSC) measurement, and has a function of reducing the concentration of the charges (electrons and holes) in a deep trap level. The organic electroluminescent device of the present invention has the charge trap concentration reducing layer of the type and can therefore be protected from performance deterioration with time to have a long lifetime.

The peak area in a high-temperature region of the organic electroluminescent device having the charge trap concentration reducing layer is preferably less than $S_0$, where $S_0$ means the peak area of a high-temperature region of a reference device not having a charge trap concentration reducing layer, and is more preferably $0.71 \times S_0$ or less, even more preferably $0.30 \times S_0$ or less, still more preferably $0.10 \times S_0$ or less, and is ideally zero. The charge trap concentration reducing layer of the type can effectively reduce the charge concentration in a deep trap level, and can noticeably prolong the lifetime of the organic electroluminescent device having the layer.

The material of the charge trap concentration reducing layer is not specifically limited so far as a layer formed of the material can reduce the peak area between 250 and 320 K in TSC measurement, but is preferably one containing a Group-1 atom, a Group-2 atom or a transition metal atom, more preferably one containing a Group-1 atom or a Group-2 atom, even more preferably one containing a lithium atom. Among the material containing a transition metal atom, those containing europium, ruthenium, gadolinium, terbium, dysprosium, erbium, ytterbium, rhenium, osmium, platinum or gold are preferably used.

These atoms may be contained in the charge trap concentration reducing layer as elemental substances or may be contained in the charge trap concentration reducing layer as compounds containing these atoms, but are preferably containing in the charge trap concentration reducing layer as compounds containing these atoms. The compounds containing these atoms are preferably compounds of a combination of these atoms and an organic ligand or organic metal compounds, more preferably compounds of a combination of these atoms and an organic ligand, even more preferably 8-hydroxyquinolinolate derivatives, and above all, 8-hydroxyquinolinolate-lithium (Liq) is especially preferred. Exciton-polaron annihilation is known to cause formation a deep trap level inside a device; however, since Liq has a low excited triplet energy level, it is presumed that the excited triplet energy of excitons can readily move to Liq to suppress exciton-polaron annihilation. Accordingly, the charge trap concentration reducing layer formed of Liq can effectively reduce the amount of charges in a deep trap level.

The charge trap concentration reducing layer may contain a compound not containing a Group-1 atom, a Group-2 atom and a transition metal atom so far as the layer is formed of a material capable of reducing, owing to formation of the layer, the peak area between 250 and 320 K in TSC measurement. However, the content of the compound containing a Group-1 atom, a Group-2 atom or a transition metal atom in the charge trap concentration reducing layer is preferably 80% by mass or more of the total mass of the charge trap concentration reducing layer, more preferably 90% by mass or more, even more preferably 95% by mass or more, and may be 100% by mass. In particular, when a compound containing a combination of these atoms and an organic ligand is contained in the charge trap concentration reducing layer to have the above-mentioned content therein, performance degradation with time in driving can be noticeably suppressed.

The mean thickness of the charge trap concentration reducing layer is not specifically limited, but is preferably 0.1 to 100 nm, more preferably 0.5 to 10 nm, even more preferably 1 to 3 nm.

[Second Electron Transporting Layer]

The second electron transporting layer is formed of an electron transporting material, and may be a single layer or may have plural layers. For the description and the preferred range of the electron transporting material for use in the second electron transporting layer, the description and the preferred range of the above-mentioned electron transporting layer may be referred to.

Preferably, the organic electroluminescent device of the present invention contains a compound containing a Group-1 atom, a Group-2 atom or a transition metal atom in at least one layer of the electron transporting layer and the second electron transporting layer, and in the case where the electron transporting layer and the second electron transporting layer each are a single layer, more preferably, the compound containing a Group-1 atom, a Group-2 atom or a transition metal atom is contained in the second electron transporting layer. Accordingly, the organic electroluminescent device can be protected from performance deterioration with time and the lifetime thereof can be further prolonged. For preferred ranges and specific examples of the Group-1 atom, the Group-2 atom and the transition metal atom, and the compound containing these atoms, the preferred ranges and the specific examples of the Group-1 atom, the Group-2 atom and the transition metal atom and the compound containing these atoms for use in the above-mentioned charge trap concentration reducing layer may be referred to. Here, in the case where the electron transporting layer and the second electron transporting layer contain a compound containing these atoms, the compound may be the same as or different from the constituent material of the charge trap concentration reducing layer, but is preferably the same.

In the case where the electron transporting layer and the second electron transporting layer contains a compound containing a Group-1 atom, a Group-2 atom or a transition metal atom, the content of the compound containing these atoms is preferably 10% by weight or more relative to the total amount of each electron transporting layer, more preferably 50% by weight or more. Also preferably, the content is 90% by weight or less relative to the total amount of each electron transporting layer, more preferably 75% by weight or less.

[Functional Layer]

The functional layer is formed of a material containing a Group-1 atom, a Group-2 atom or a transition metal atom, and is provided between the electron transporting layer and the second electron transporting layer.

For the description and the preferred range of the material containing a Group-1 atom, a Group-2 atom or a transition metal atom for use in the functional layer, and the preferred range of the content ratio of the materials and the mean thickness of the functional layer, the corresponding description of the charge trap concentration reducing layer mentioned above may be referred to.

[Injection Layer]

The injection layer is a layer that is provided between the electrode and the organic layer, for decreasing the driving voltage and enhancing the light emission luminance, and includes a hole injection layer and an electron injection layer, which may be provided between the anode and the light-emitting layer or the hole transporting layer and between the cathode and the electron transporting layer. The injection layer may be provided depending on necessity.

[Barrier Layer]

The barrier layer is a layer that is capable of inhibiting charges (electrons or holes) and/or excitons present in the light-emitting layer from being diffused outside the light-emitting layer. The electron barrier layer may be disposed between the light-emitting layer and the hole transporting layer, and inhibits electrons from passing through the light-emitting layer toward the hole transporting layer. Similarly, the hole barrier layer may be disposed between the light-emitting layer and the electron transporting layer, and inhibits holes from passing through the light-emitting layer toward the electron transporting layer. In the present invention, the charge trap concentration reducing layer disposed between the light-emitting layer and the electron transporting layer may be made to additionally have a function of the hole barrier layer. For example, experiments have confirmed that the charge trap concentration reducing layer formed of Liq can have a function as a hole barrier layer. The barrier layer may also be used for inhibiting excitons from being diffused outside the light-emitting layer. Thus, the electron barrier layer and the hole barrier layer each may also have a function as an exciton barrier layer. The term "the electron barrier layer" or "the exciton barrier layer" referred to herein is intended to include a layer that has both the functions of an electron barrier layer and an exciton barrier layer by one layer.

[Hole Barrier Layer]

The hole barrier layer has the function of an electron transporting layer in a broad sense. The hole barrier layer has a function of inhibiting holes from reaching the electron transporting layer while transporting electrons, and thereby enhances the recombination probability of electrons and holes in the light-emitting layer. As described above, in the present invention, the charge trap concentration reducing layer may be made to additionally have the function of the hole barrier layer.

[Electron Barrier Layer]

The electron barrier layer has the function of transporting holes in a broad sense. The electron barrier layer has a function of inhibiting electrons from reaching the hole transporting layer while transporting holes, and thereby enhances the recombination probability of electrons and holes in the light-emitting layer.

[Exciton Barrier Layer]

The exciton barrier layer is a layer for inhibiting excitons generated through recombination of holes and electrons in the light-emitting layer from being diffused to the charge transporting layer, and the use of the layer inserted enables effective confinement of excitons in the light-emitting layer, and thereby enhances the light emission efficiency of the device. The exciton barrier layer may be inserted adjacent to the light-emitting layer on any of the side of the anode and the side of the cathode, and on both the sides. Specifically, in the case where the exciton barrier layer is present on the side of the anode, the layer may be inserted between the hole transporting layer and the light-emitting layer and adjacent to the light-emitting layer, and in the case where the layer is inserted on the side of the cathode, the layer may be inserted between the light-emitting layer and the cathode and adjacent to the light-emitting layer. Between the anode and the exciton barrier layer that is adjacent to the light-emitting layer on the side of the anode, a hole injection layer, an electron barrier layer and the like may be provided, and between the cathode and the exciton barrier layer that is adjacent to the light-emitting layer on the side of the cathode, an electron injection layer, an electron transporting layer, a hole barrier layer and the like may be provided. In the case where the barrier layer is provided, the material used for the barrier layer preferably has excited singlet energy and excited triplet energy, at least one of which is higher than the excited singlet energy and the excited triplet energy of the light-emitting layer, respectively. In the present invention, preferably, the charge trap concentration reducing layer is also made to additionally have the function of the exciton barrier layer.

[Hole Transporting Layer]

The hole transporting layer is formed of a hole transporting material having a function of transporting holes, and the hole transporting layer may be provided as a single layer or plural layers.

The hole transporting material has one of injection or transporting property of holes and barrier property of electrons, and may be any of an organic material and an inorganic material. Examples of known hole transporting materials that may be used herein include a triazole derivative, an oxadiazole derivative, an imidazole derivative, a carbazole derivative, an indolocarbazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

The organic electroluminescent device of the present invention may be produced, for example, by sequentially layering the above-mentioned layers in accordance with the layering position thereof. The method for forming each layer is not specifically limited, and may be formed in any of a dry process or a wet process.

Preferred materials for use for the organic electroluminescent device are concretely exemplified below. However, the materials for use in the present invention are not limitatively interpreted by the following exemplary compounds. Compounds, even though exemplified as materials having a specific function, can also be used as other materials having any other function. R, R', $R_1$ to $R_{10}$ in the structural formulae of the following exemplary compounds each independently represent a hydrogen atom or a substituent. X represent a carbon atom or a hetero atom to form the ring skeleton, n represents an integer of 3 to 5, Y represents a substituent, and m represents an integer of 0 or more.

The light-emitting material for use in the light-emitting layer may be a light-emitting material that emits fluorescent light, or may be a light-emitting material that emits phosphorescent light. The fluorescent light-emitting material may be a light-emitting material that emits delayed fluorescent light, or may be a light-emitting material that does not emit delayed fluorescent light. Preferred compounds for use as the light-emitting material for the light-emitting layer are mentioned below.

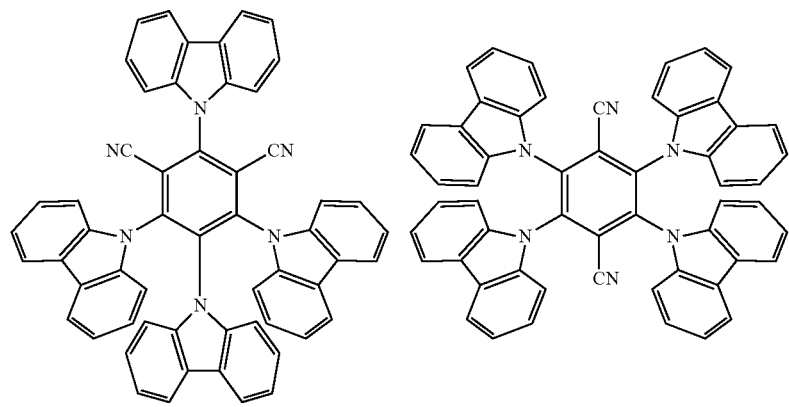
4CzIPN
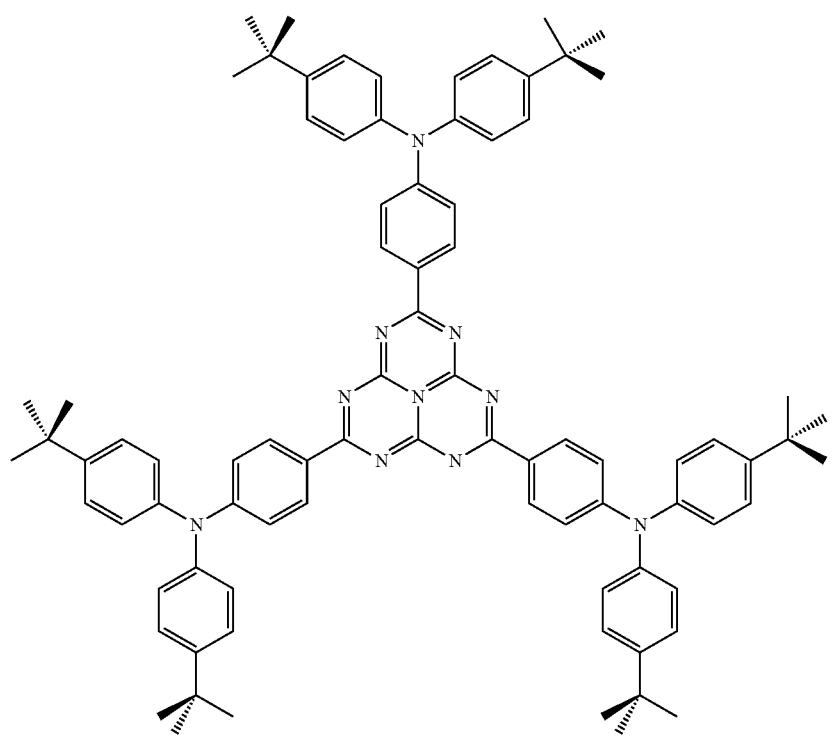

-continued
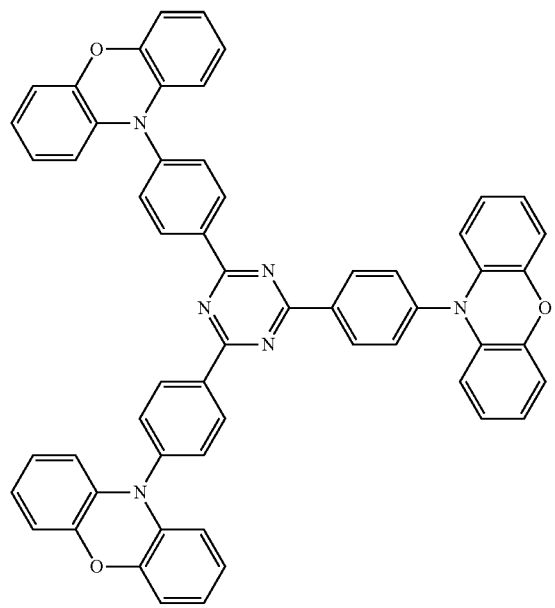
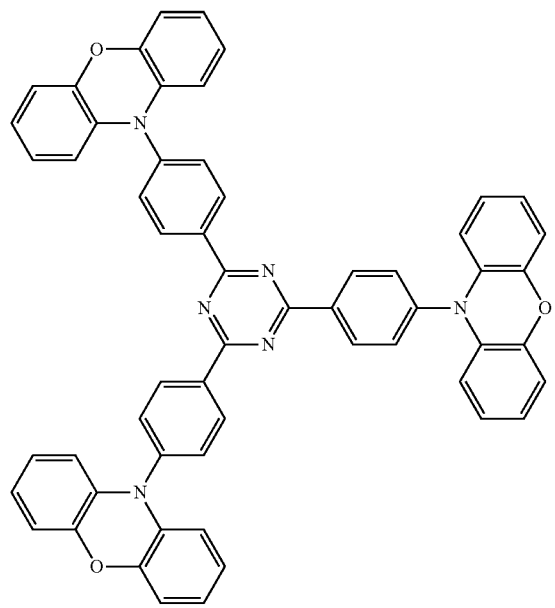
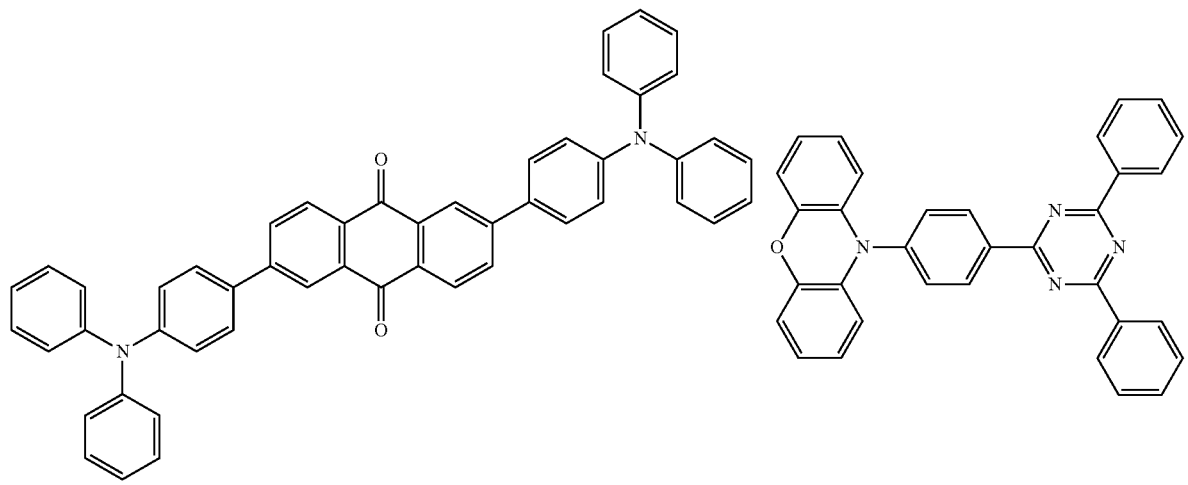
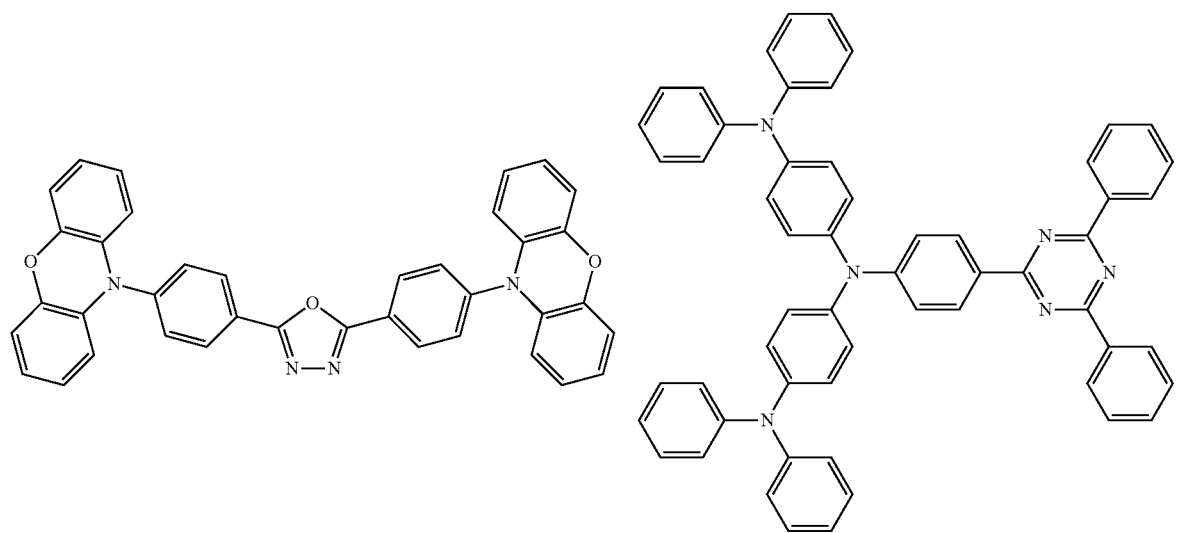

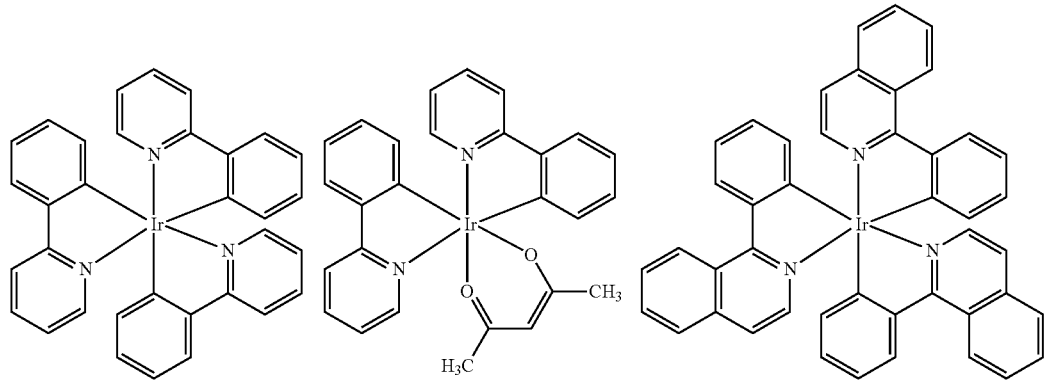

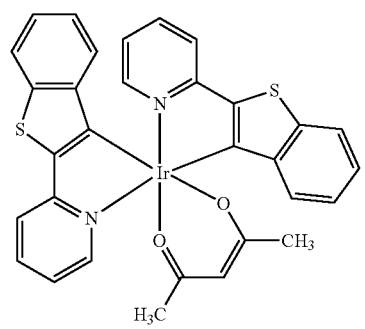

As the light-emitting material that emits delayed fluorescent light (delayed fluorescent material), compounds included in the general formulae described in WO2013/154064, paragraphs 0008 to 0048 and 0095 to 0133, WO2013/011954, paragraphs 0007 to 0047 and 0073 to 0085, WO2013/011955, paragraphs 0007 to 0033 and 0059 to 0066, WO2013/081088, paragraphs 0008 to 0071 and 0118 to 0133, JP-2013-256490A, paragraphs 0009 to 0046 and 0093 to 0134, JP-2013-116975A, paragraphs 0008 to 0020 and 0038 to 0040. WO2013/133359, paragraphs 0007 to 0032 and 0079 to 0084, WO2013/161437, paragraphs 0008 to 0054 and 0101 to 0121, JP-2014-9352A, paragraphs 0007 to 0041 and 0060 to 0069, JP-2014-9224A, paragraphs 0008 to 0048 and 0067 to 0076, especially the exemplary compounds therein are preferably mentioned. These patent publications are referred to herein as a part of the present description.

In addition, as the light-emitting material that emits delayed fluorescent light (delayed fluorescent material), compounds included in the general formulae described in JP-2013-253121A, WO2013/133359, WO2014/034535, WO2014/115743, WO2014/122895, WO2014/126200, WO2014/136758, WO2014/133121, WO2014/136860, WO2014/196585, WO2014/189122, WO2014/168101, WO2015/008580. WO2014/203840, WO2015/002213, WO2015/016200, WO2015/019725, WO2015/072470. WO2015/108049, WO2015/080182, WO2015/072537. WO2015/080183, JP-2015-129240A, WO2015/129714. WO2015/129715, WO2015/133501, WO2015/136880, WO2015/137244, WO2015/137202, WO2015/137136. WO2015/146541 and WO2015/159541, especially the exemplary compounds therein are preferably mentioned. These patent publications are also referred to herein as a part of the present description.

Next, preferred compounds for use as the host material in the light-emitting layer are mentioned below.

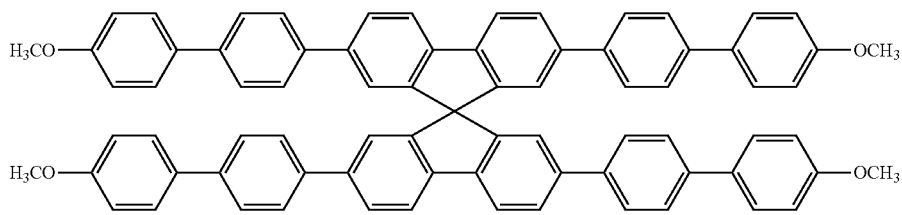

-continued
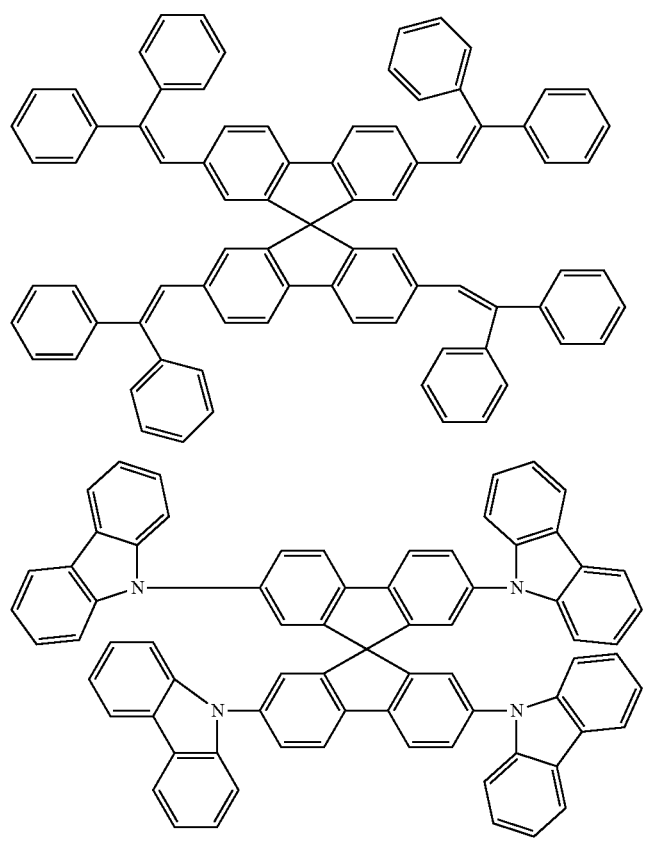
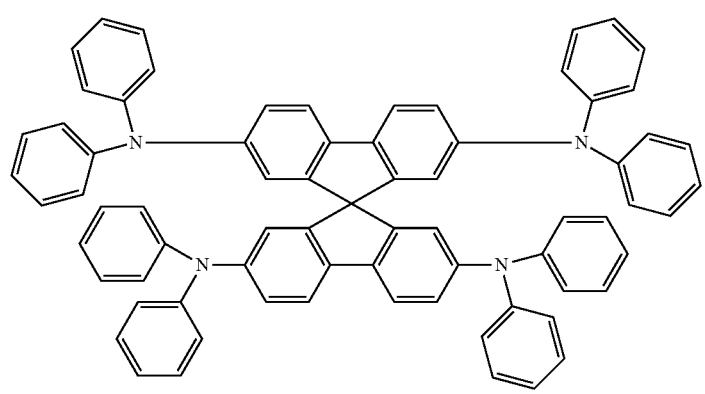
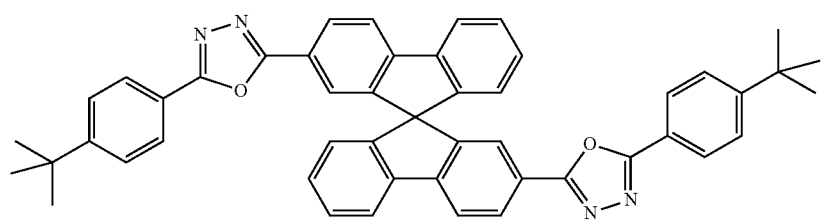

-continued
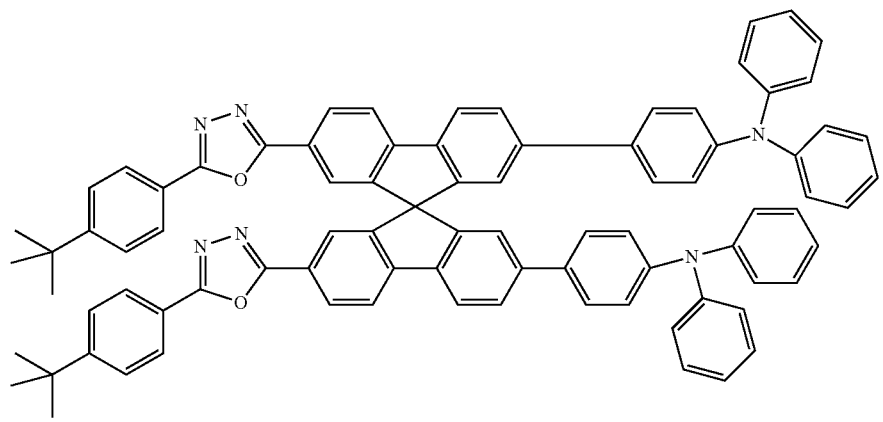
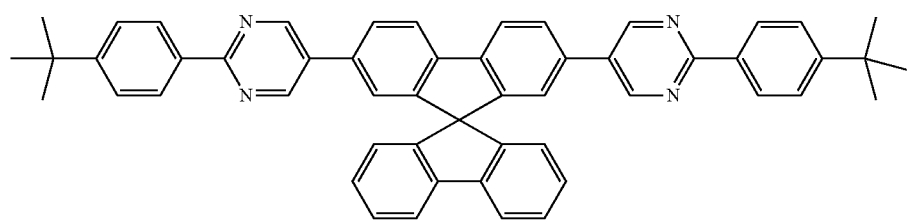
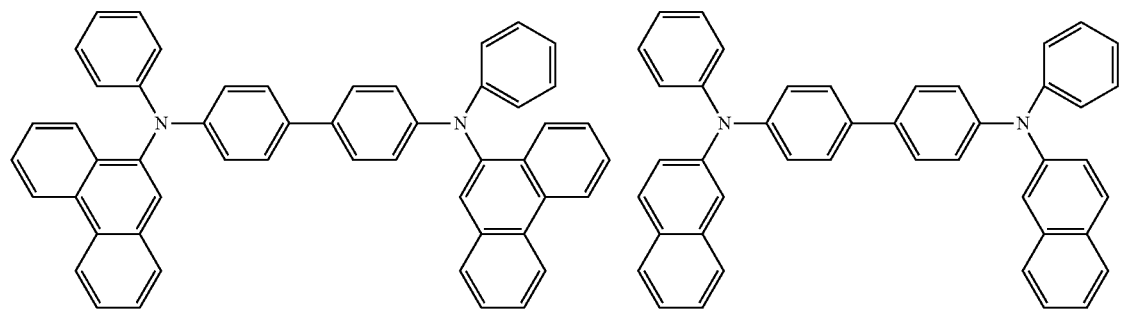
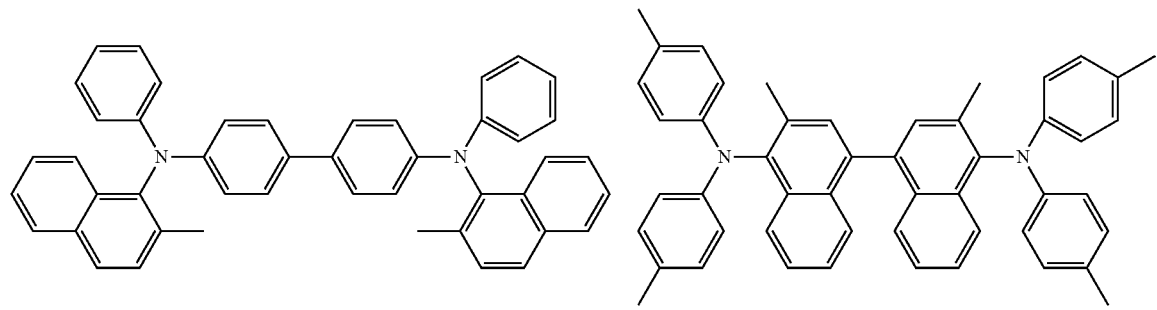

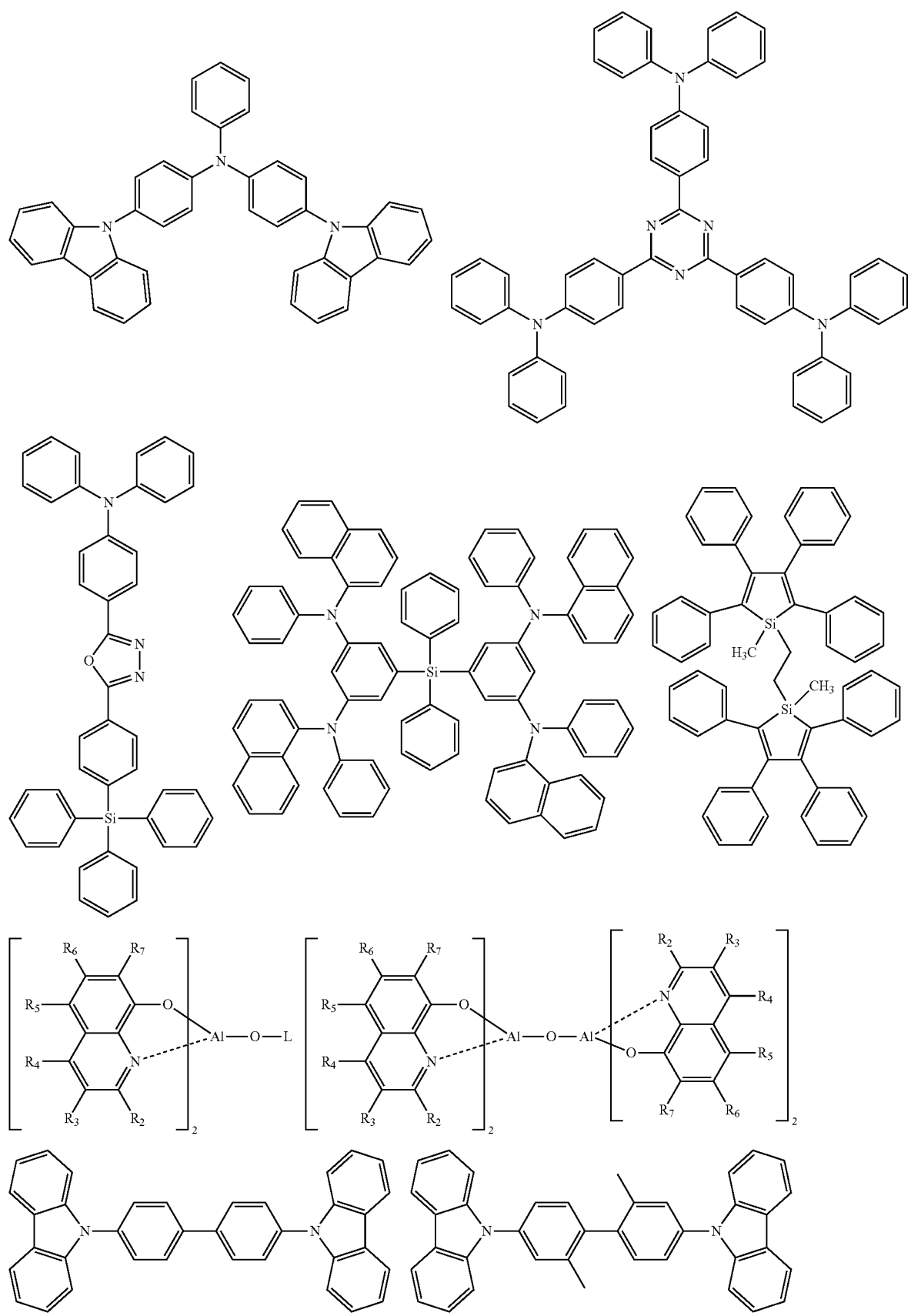

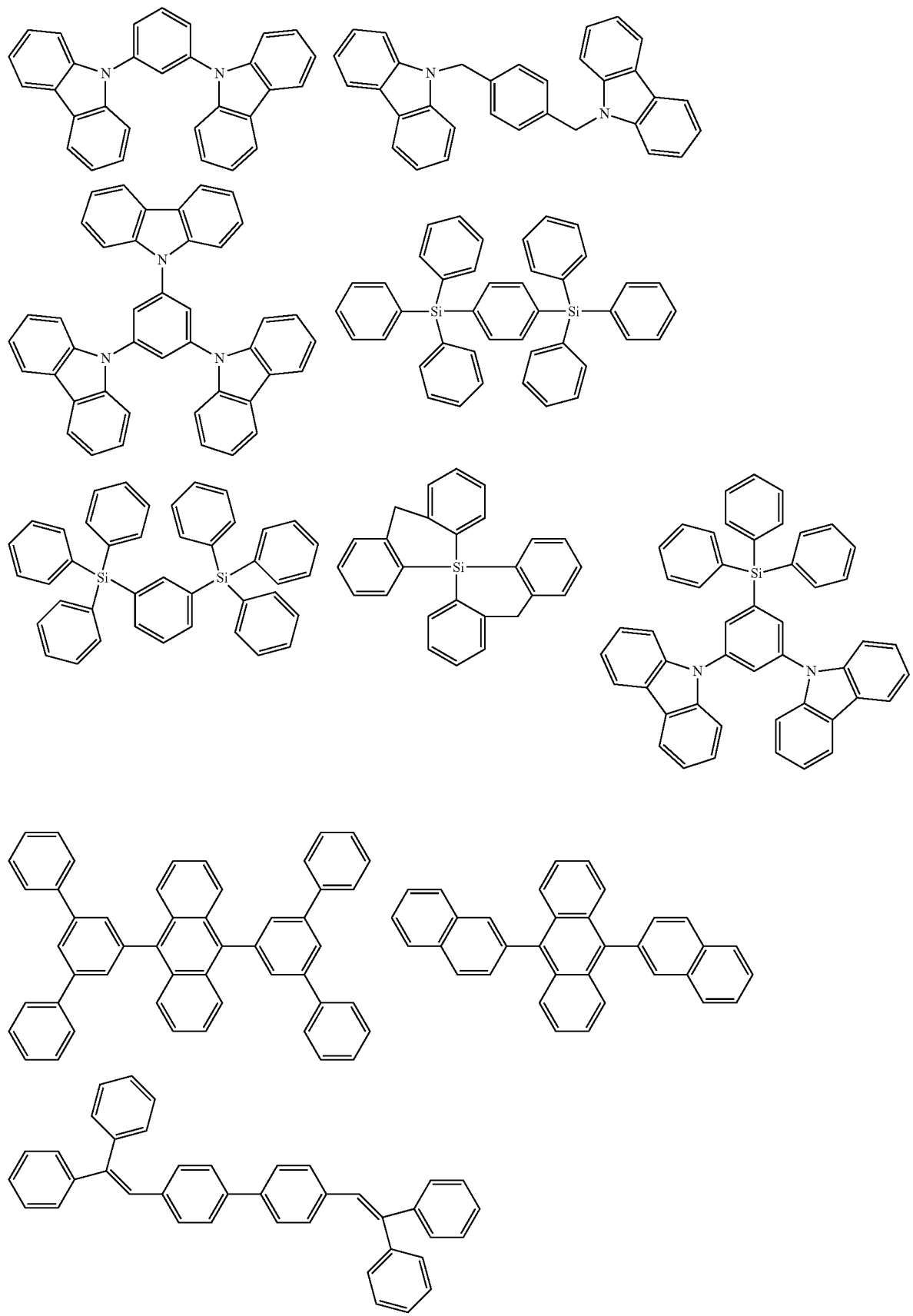

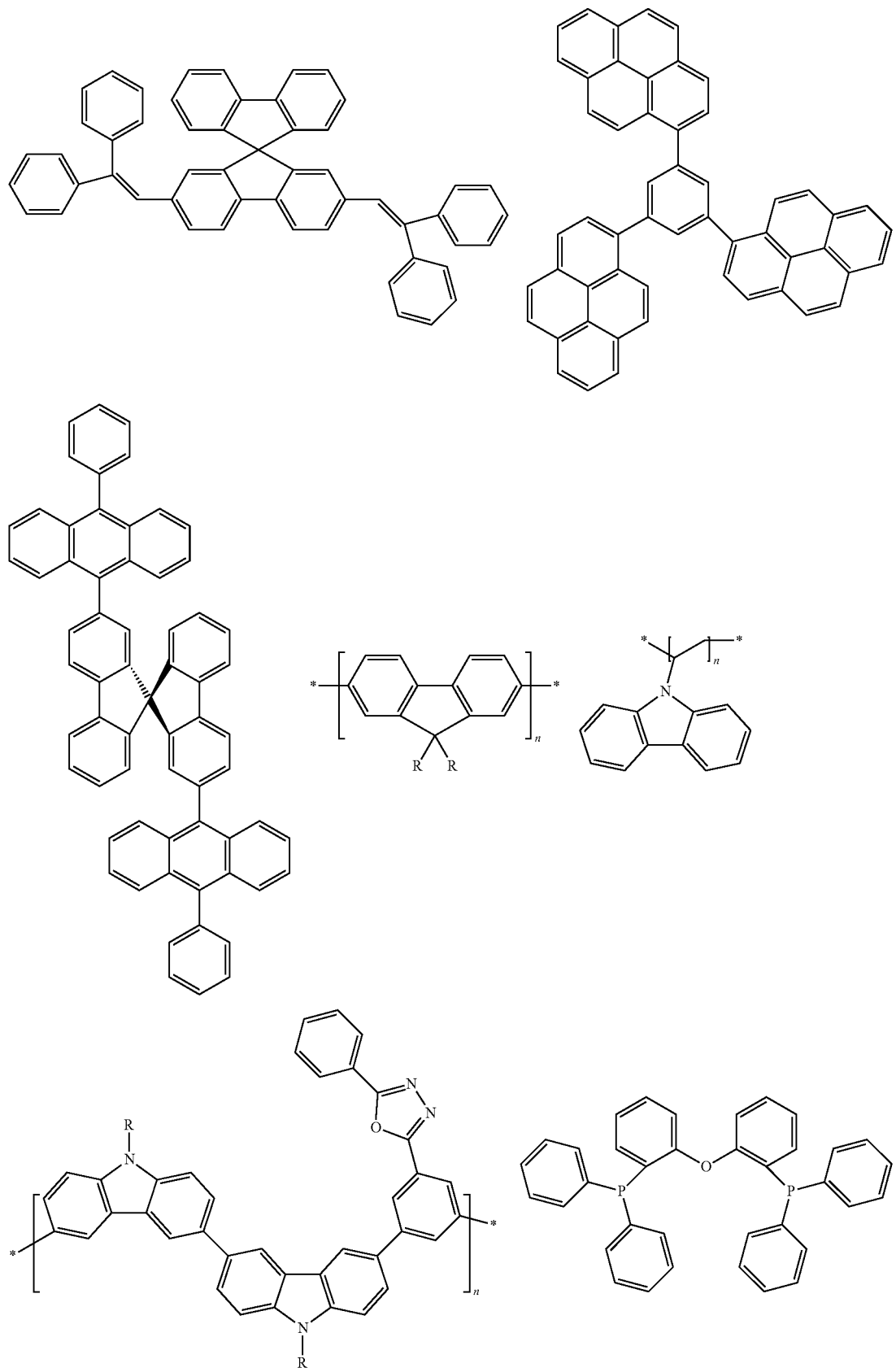

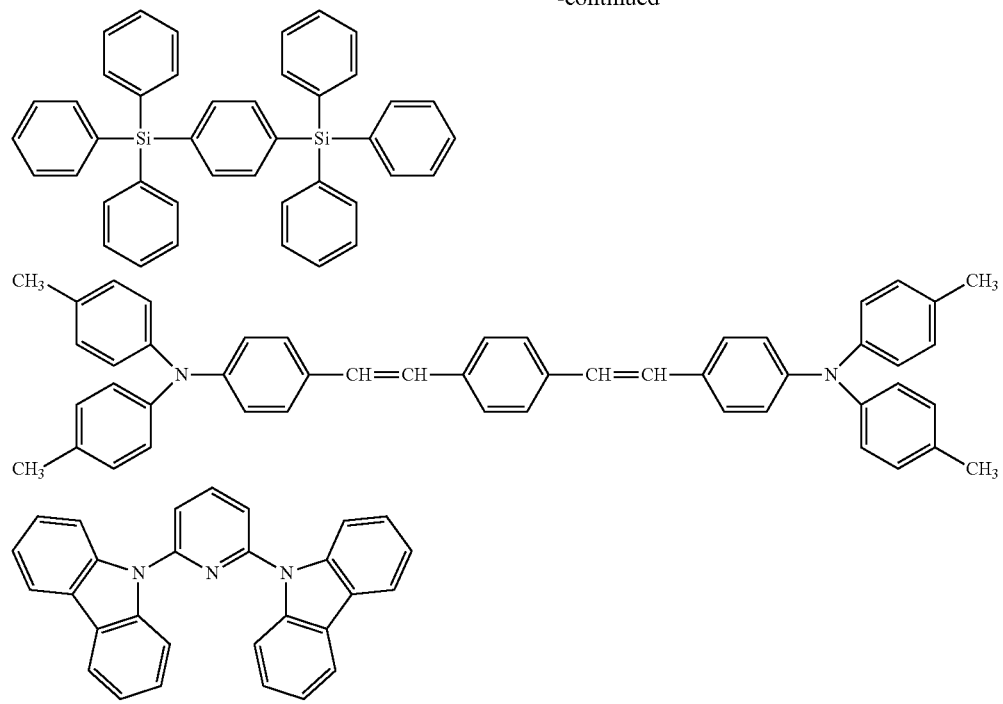
Next, preferred compound examples for use as the hole injection material are mentioned below.
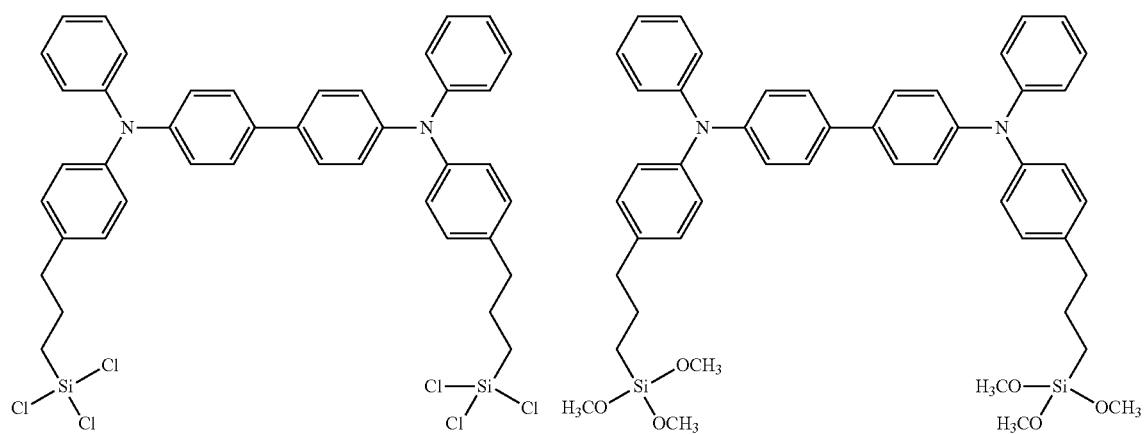
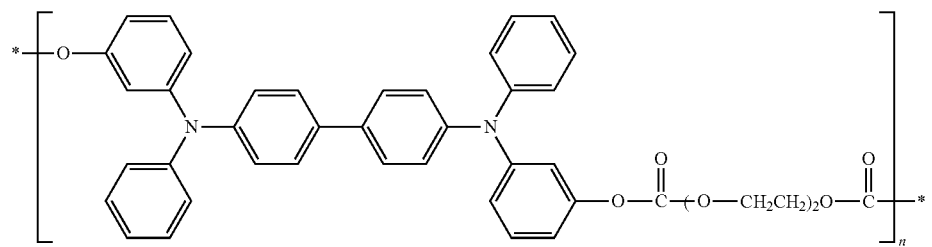

-continued
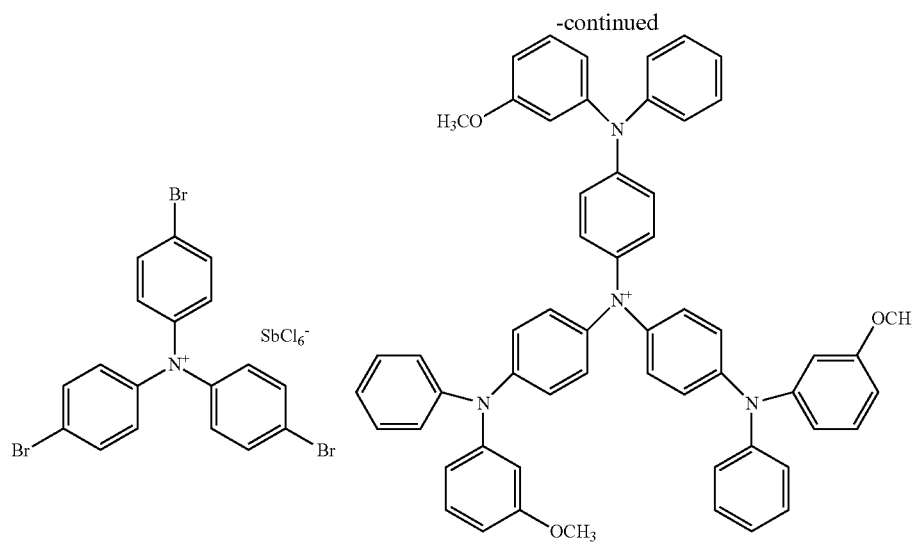
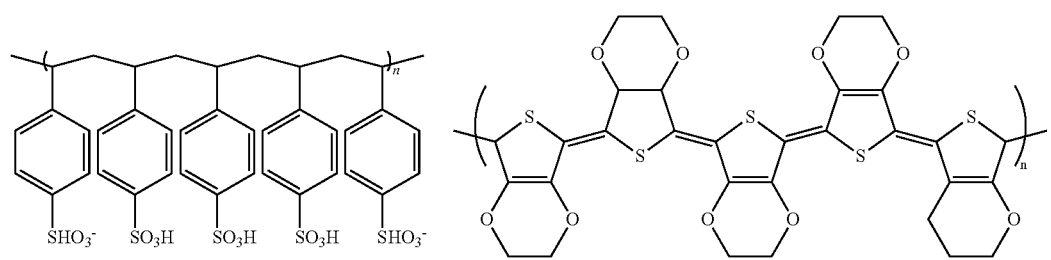
Next, preferred compound examples for use as the hole transporting material are mentioned below.
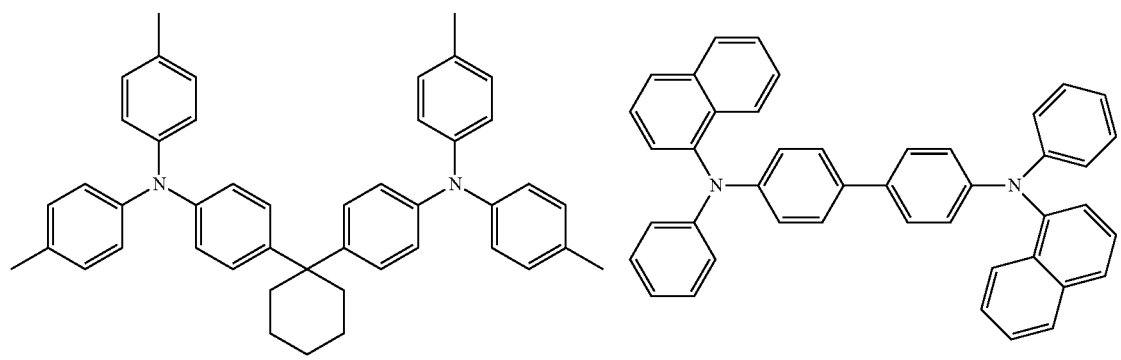

-continued
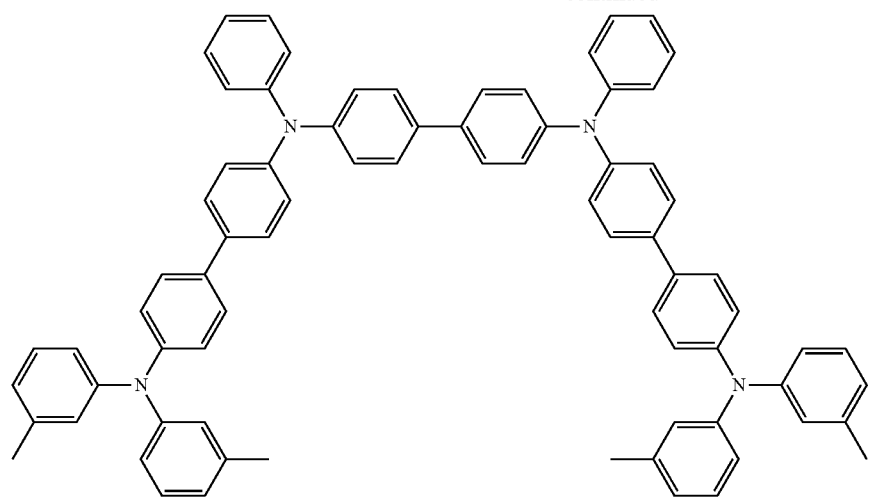
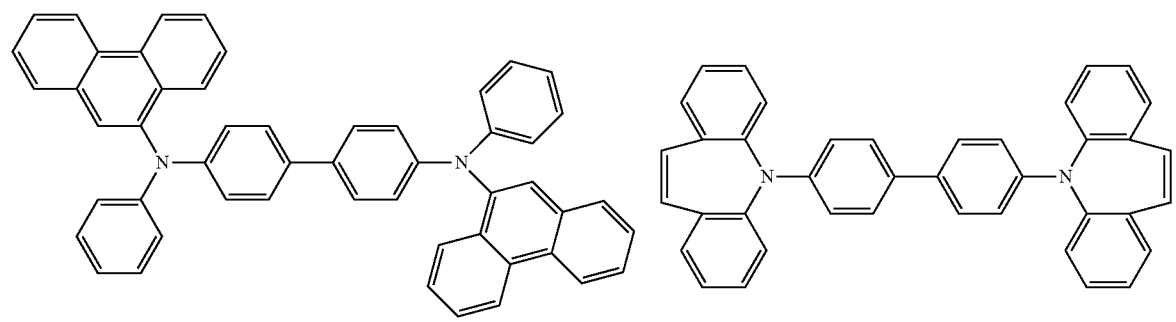
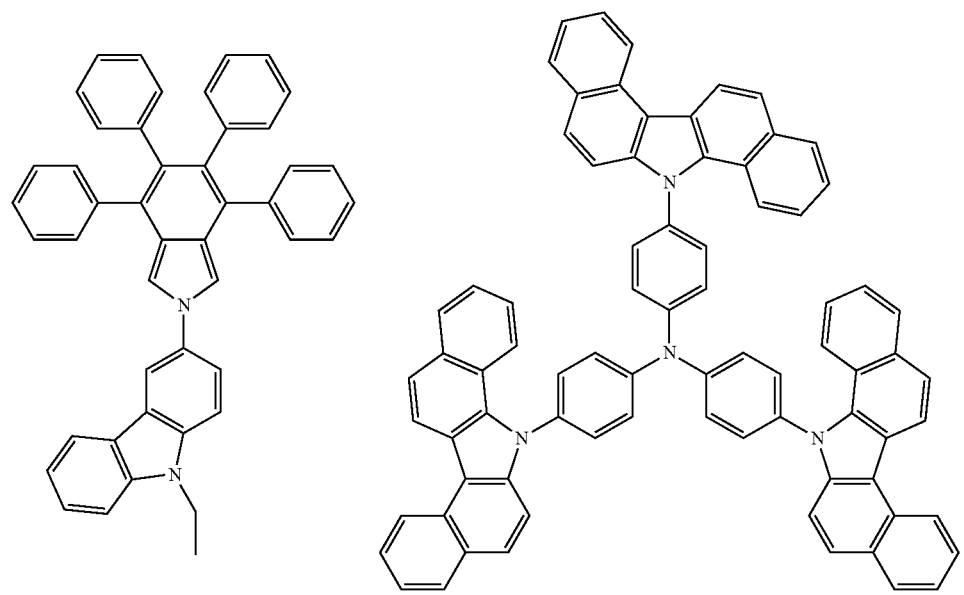

-continued
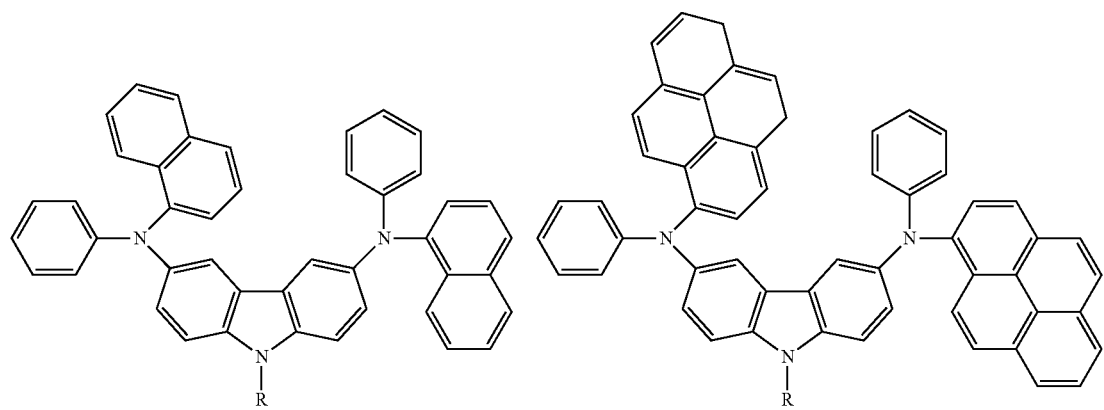
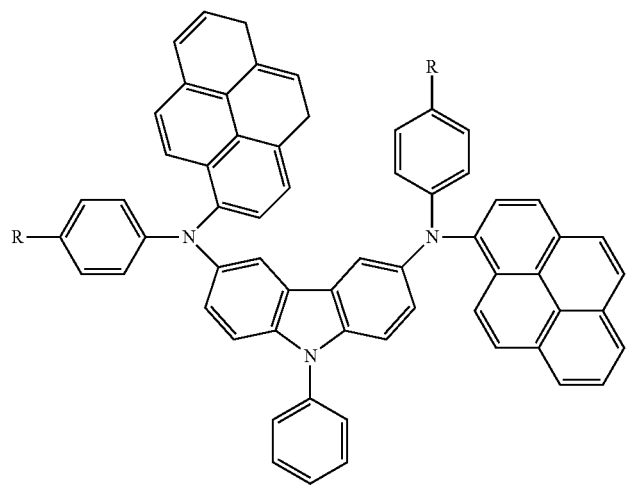
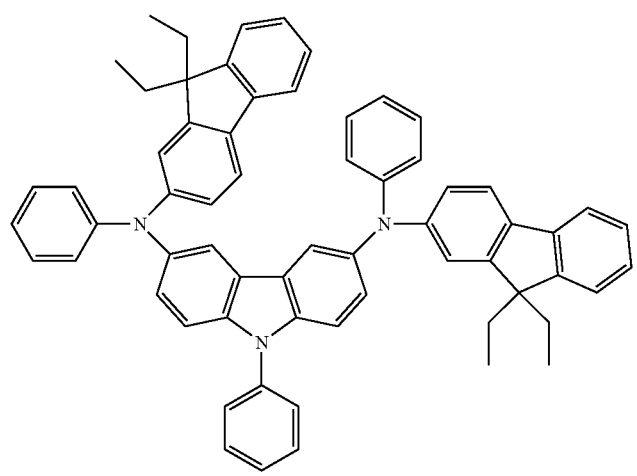

-continued
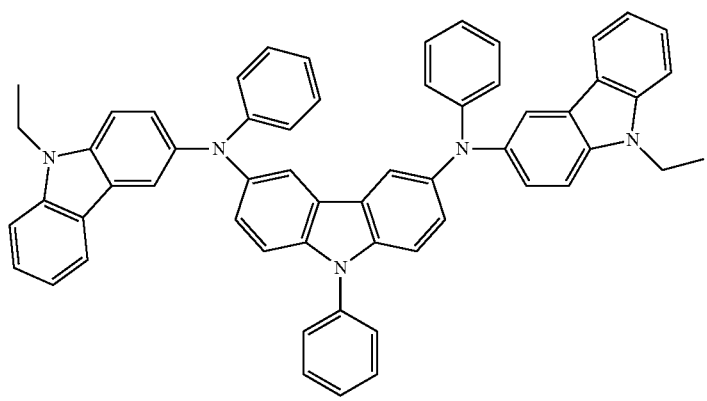
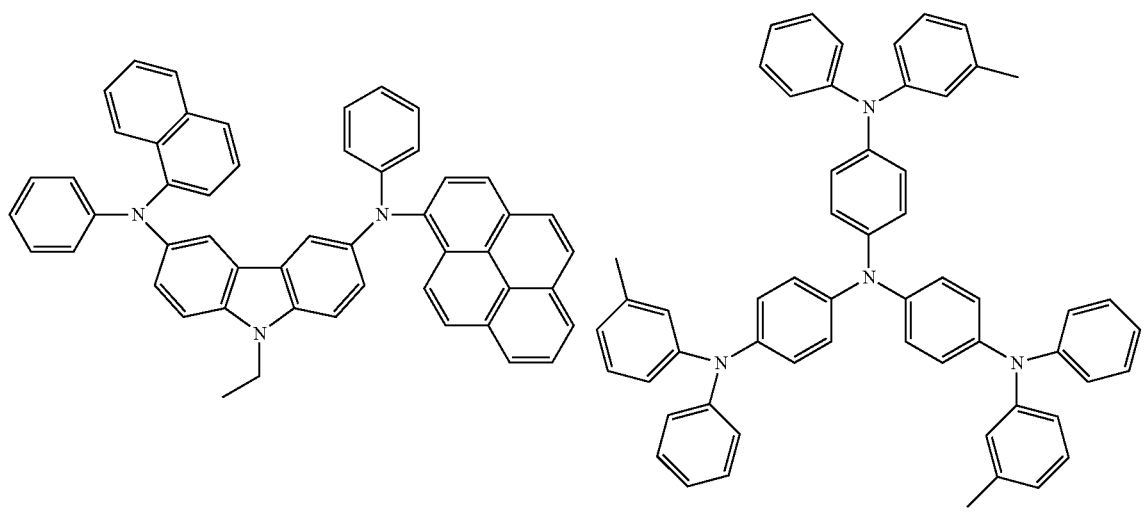
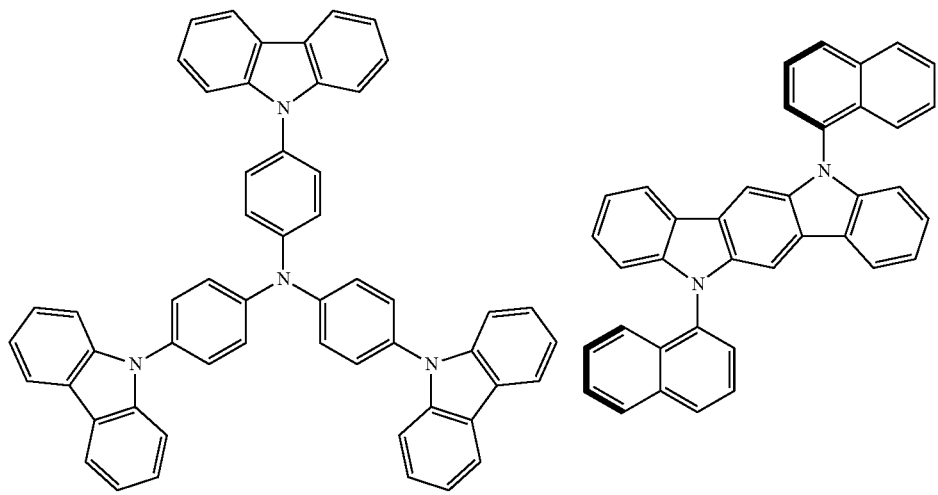

-continued
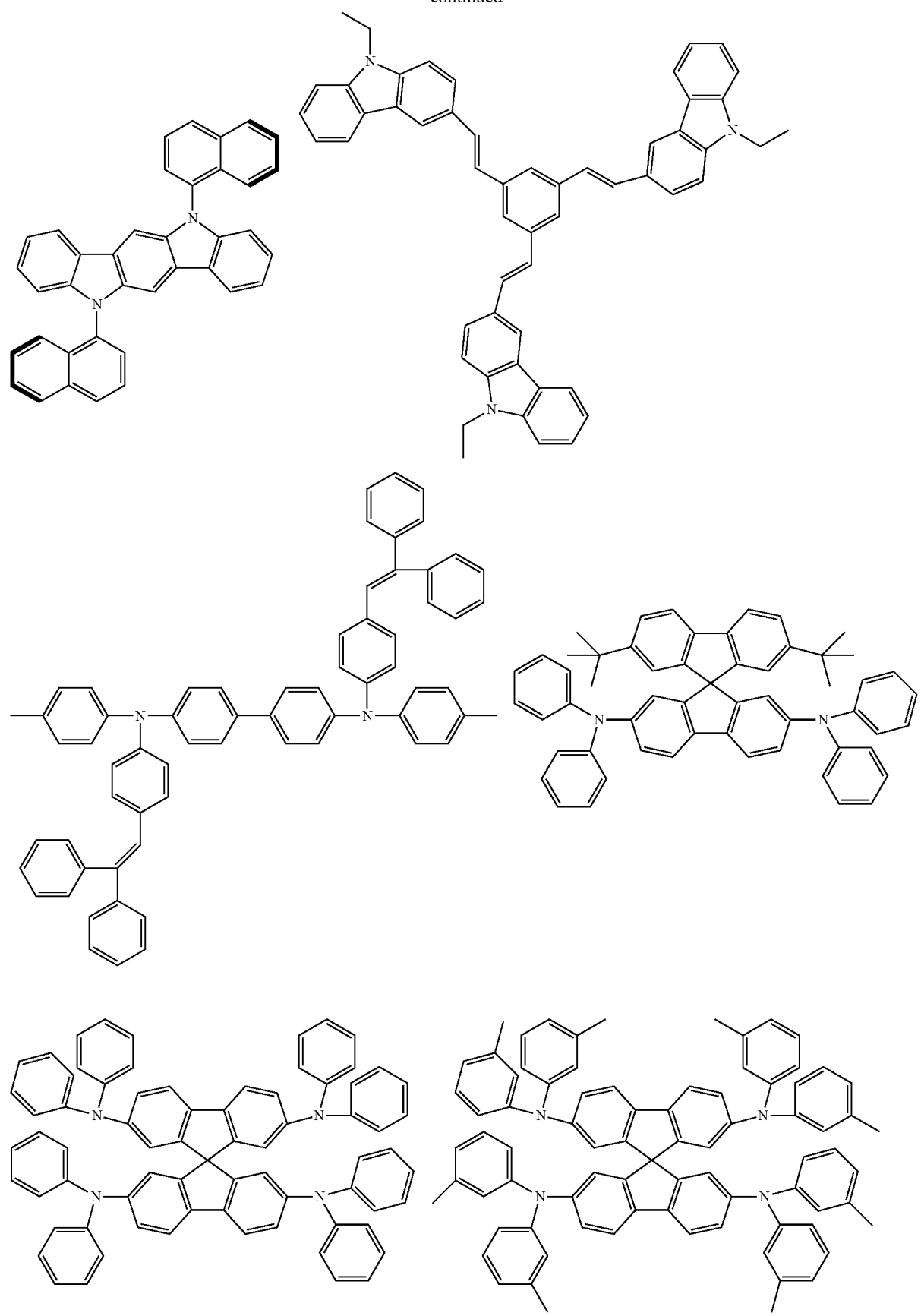

-continued
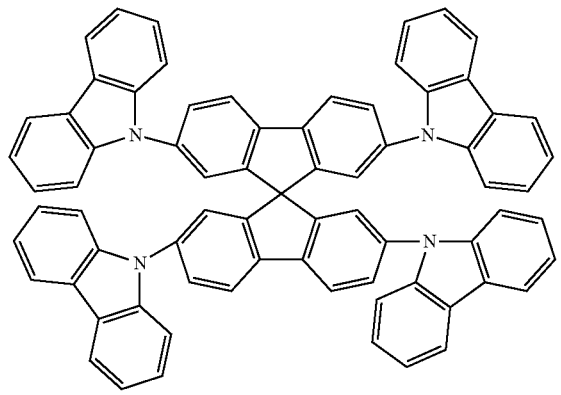
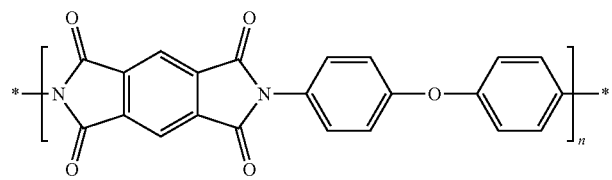
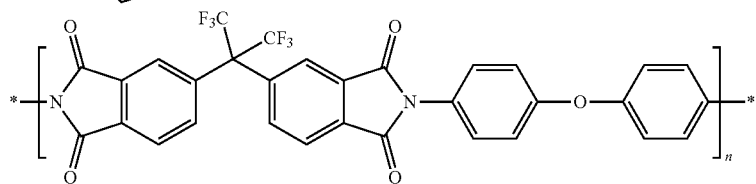
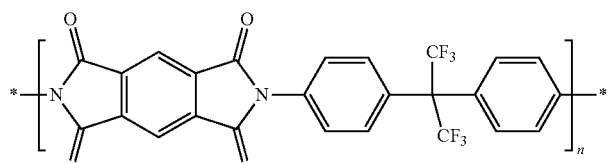
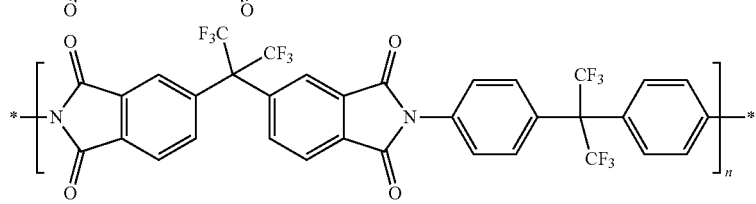
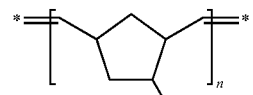
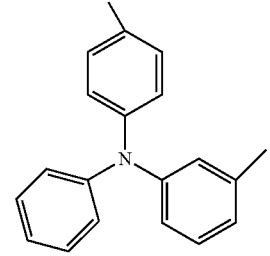
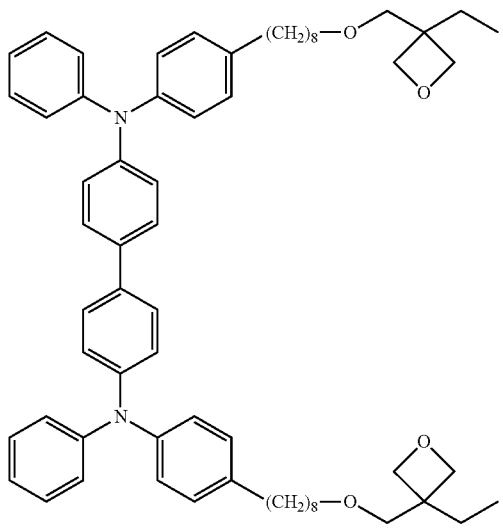
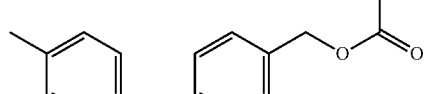
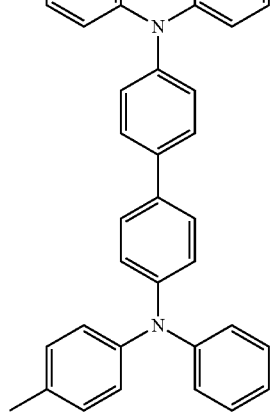

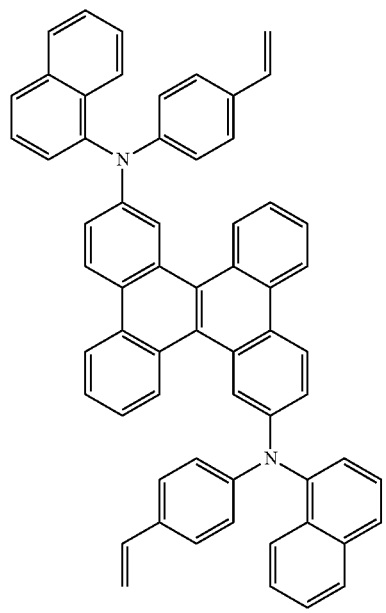
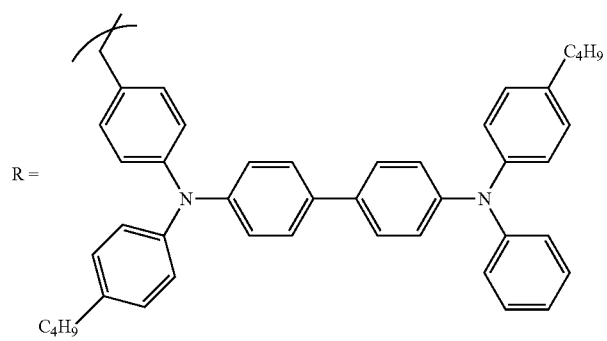
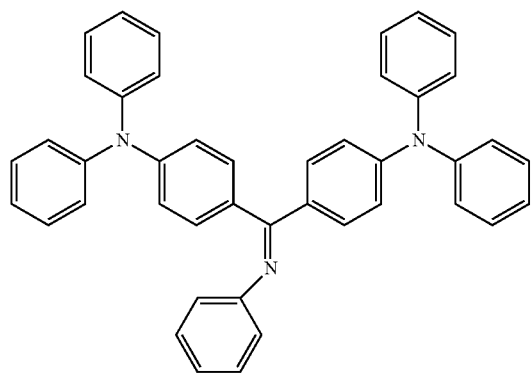
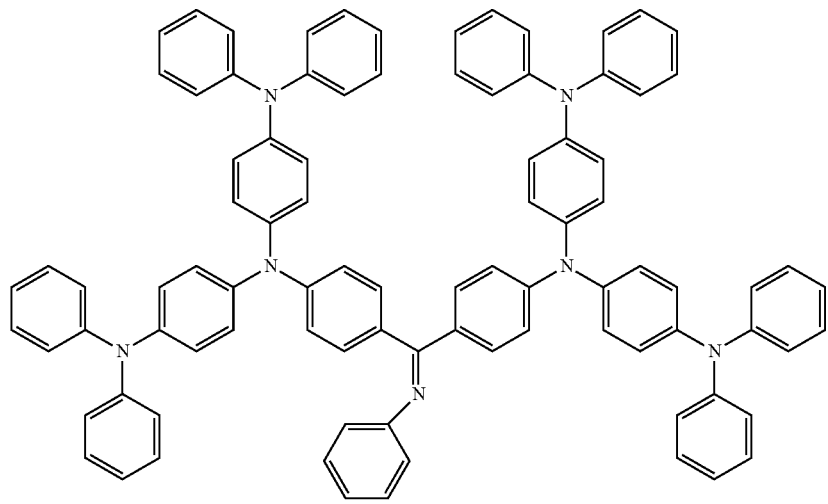

-continued
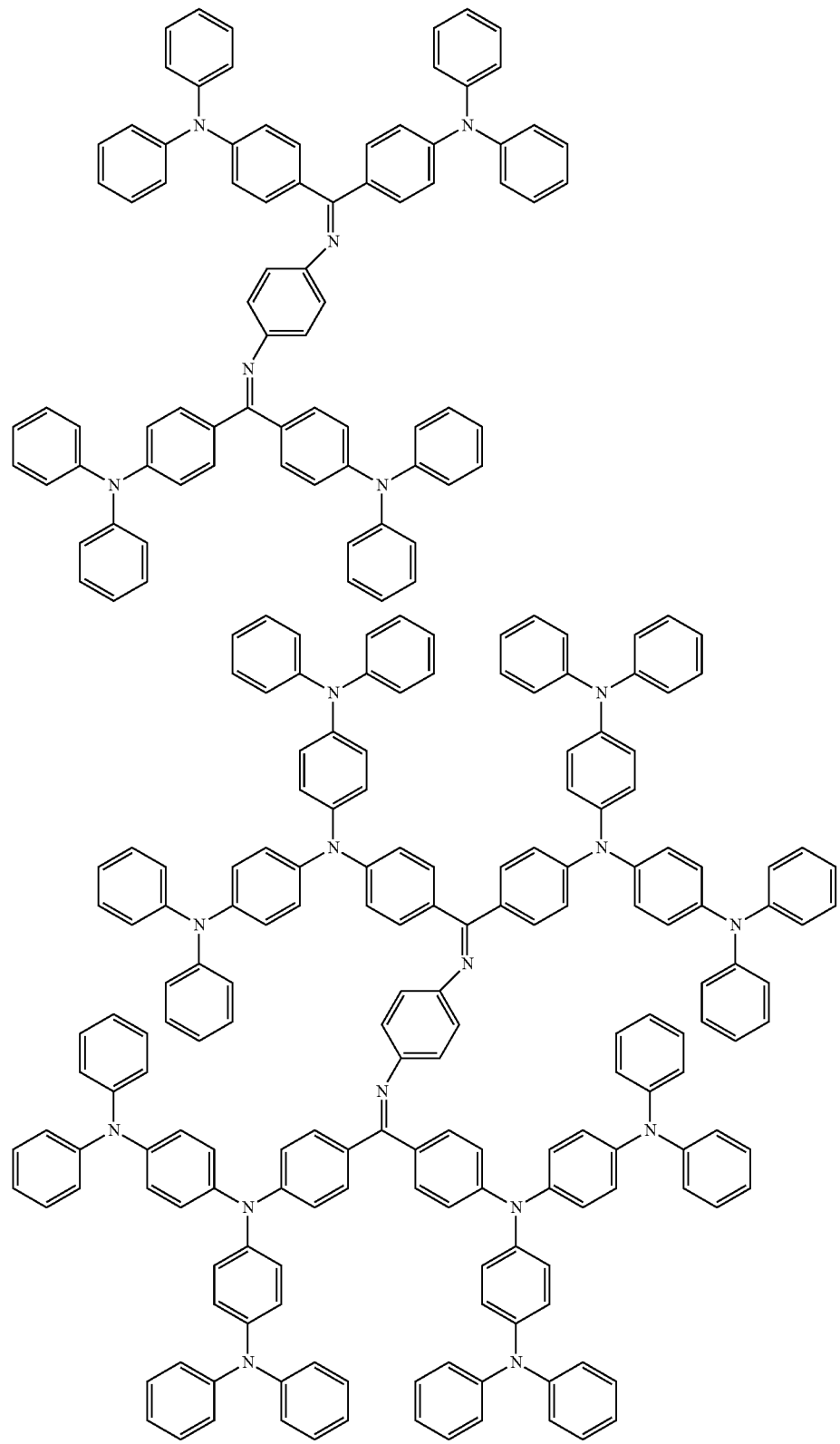

Next, preferred compound examples for use as the electron barrier material are mentioned below.
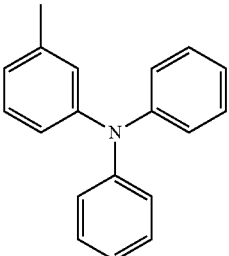
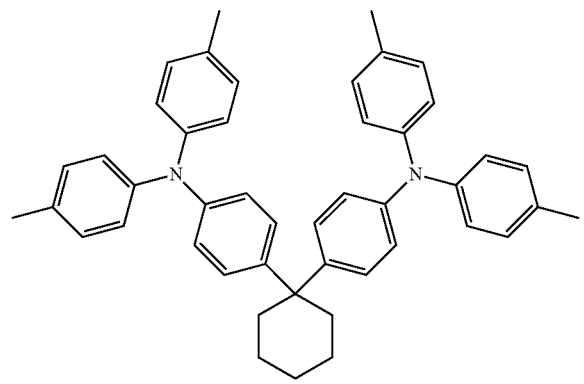
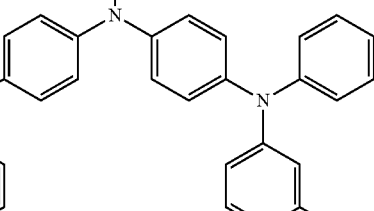
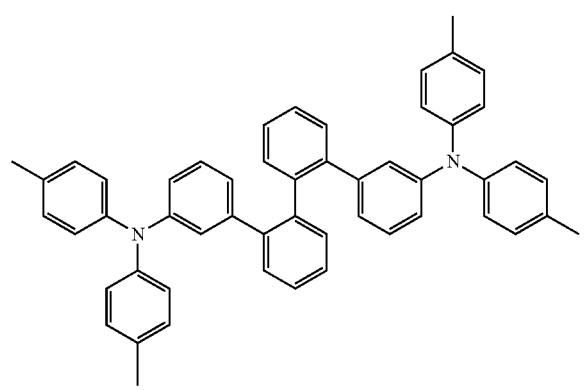
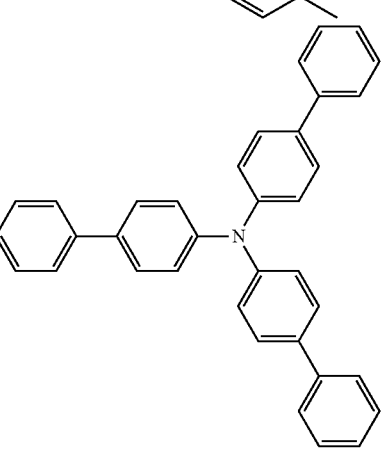
Next, preferred compound examples for use as the electron transporting material are mentioned below.
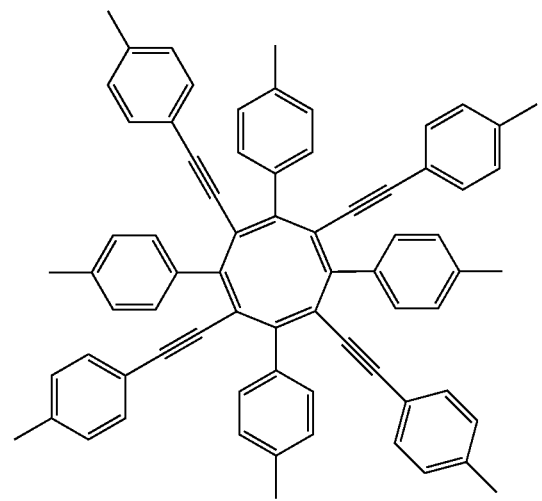
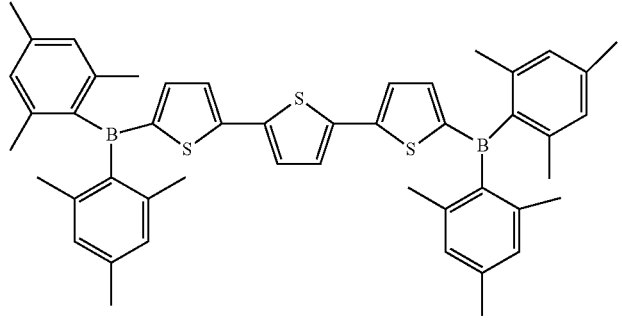

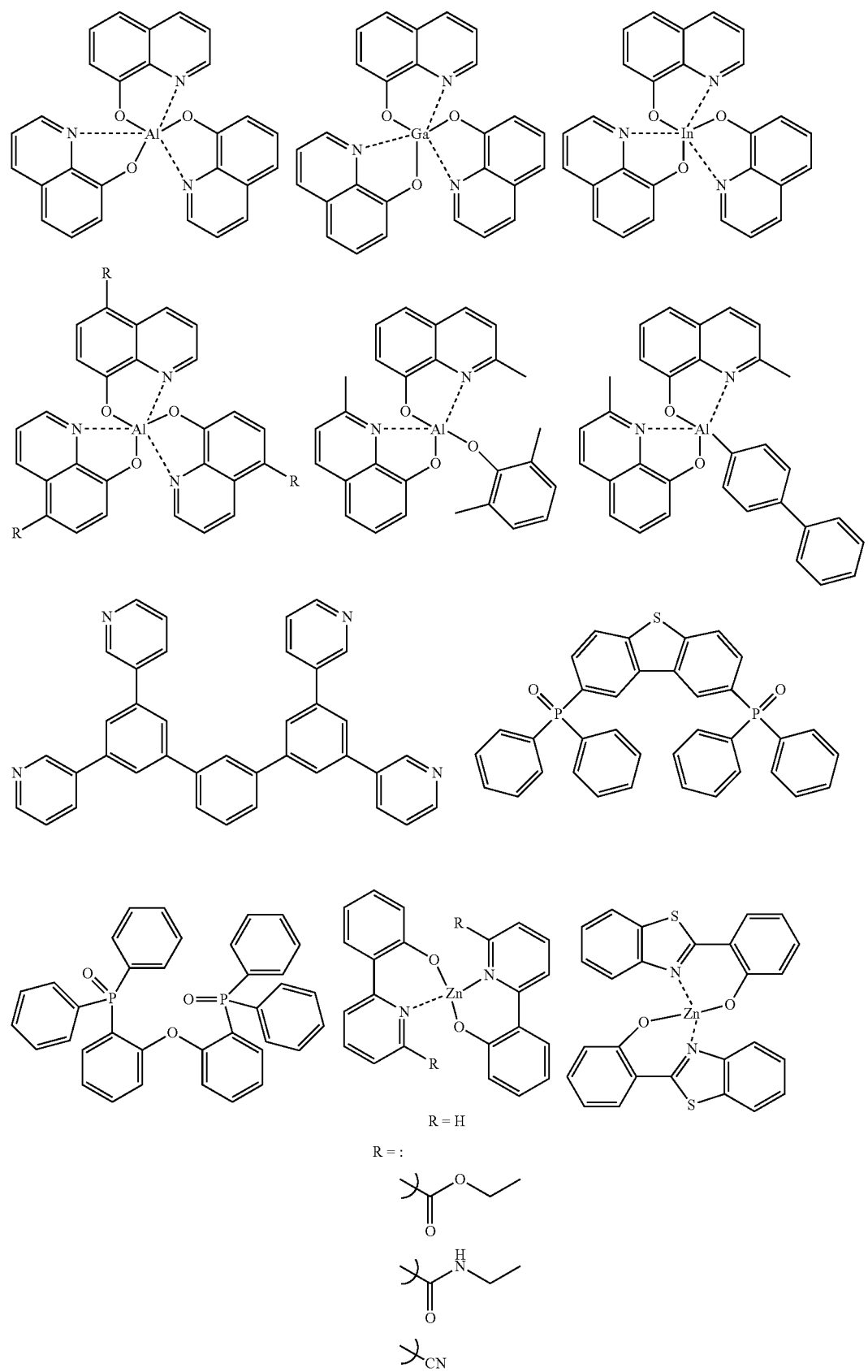

-continued
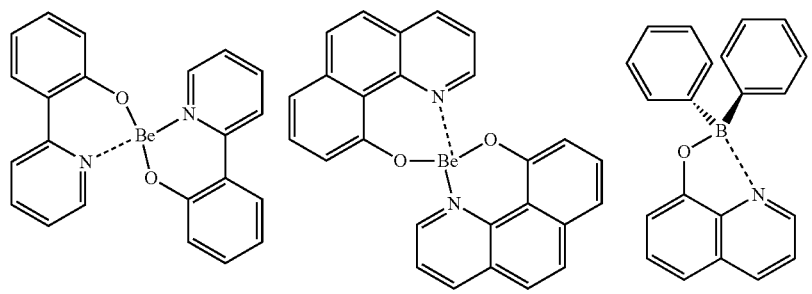
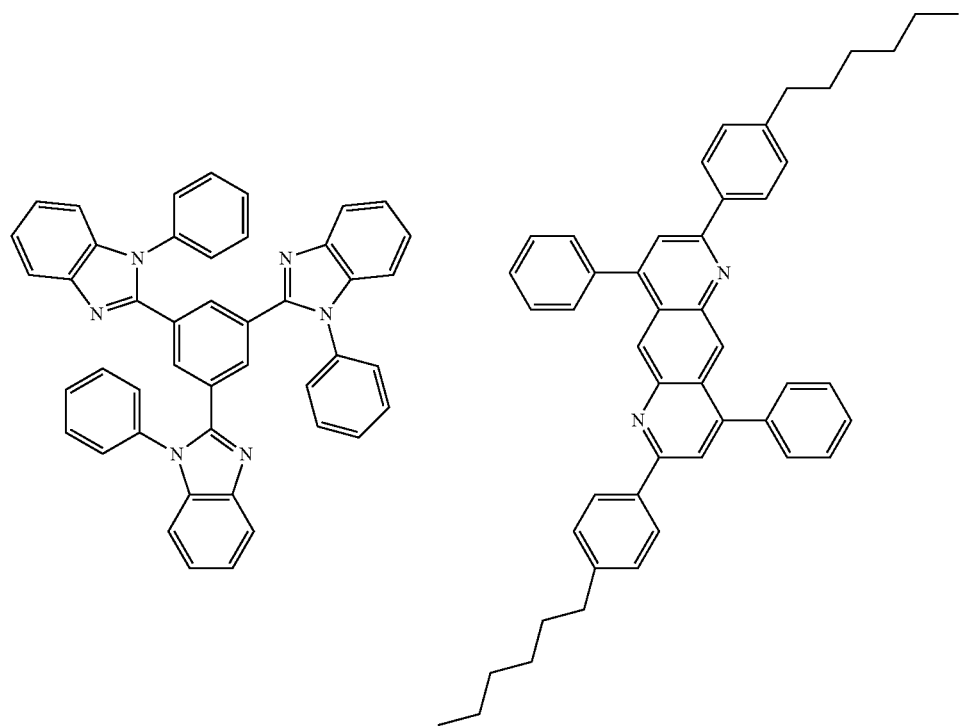
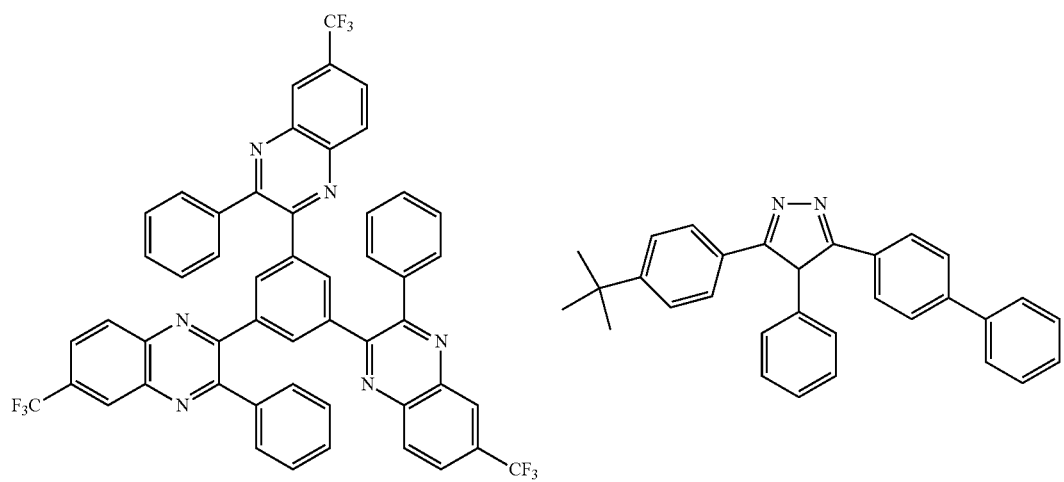

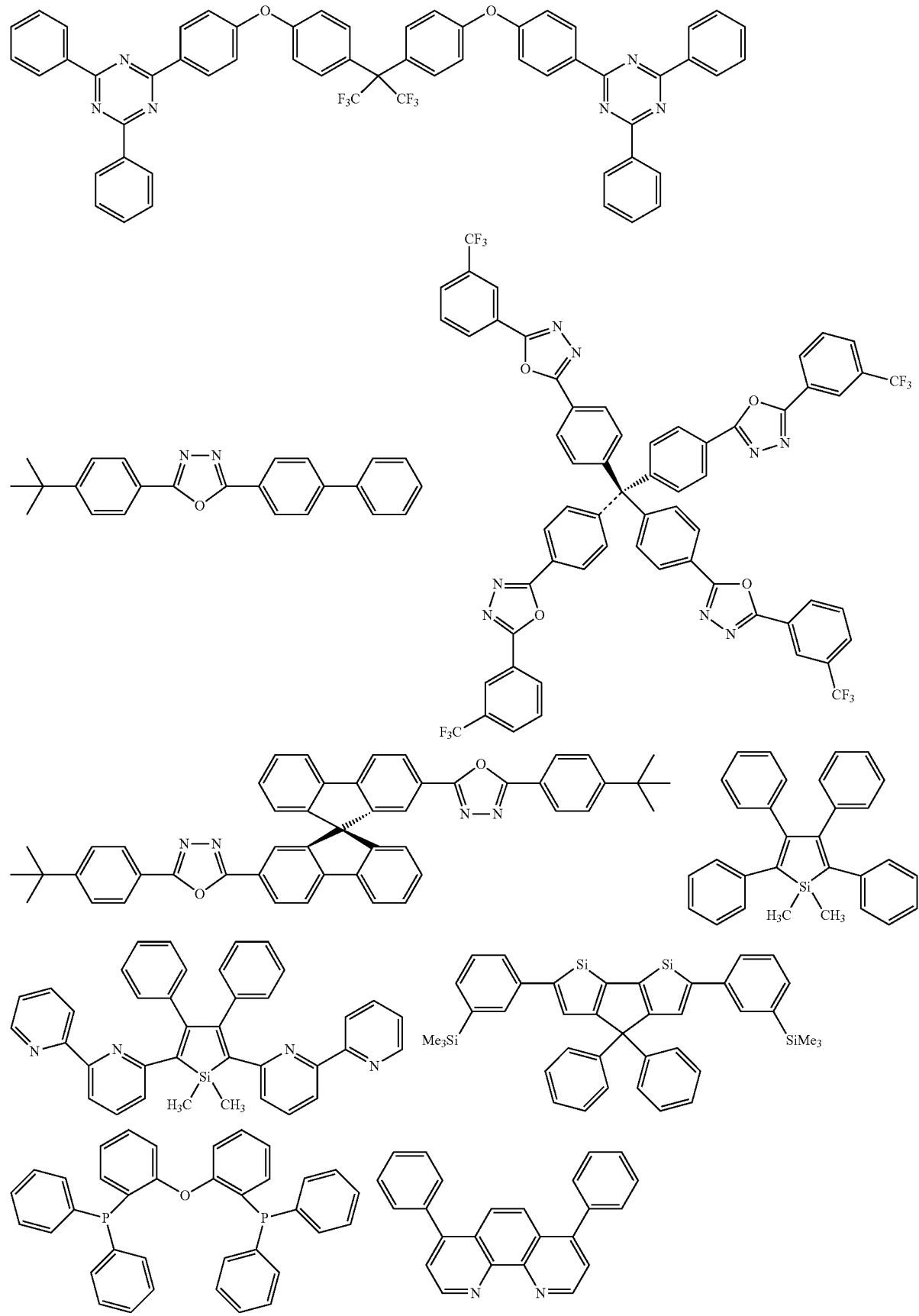

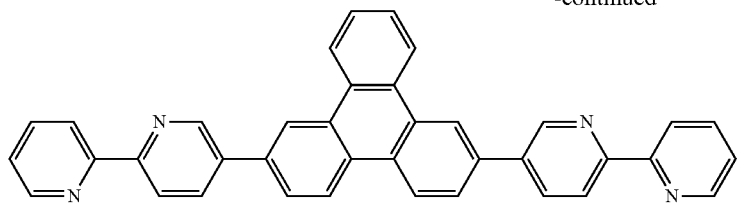

Next, preferred compound examples for use as the electron injection material are mentioned below.

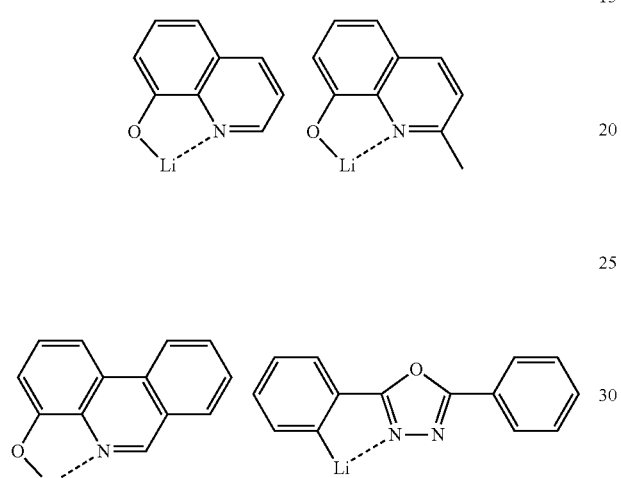

Further, preferred compound examples for use as additional materials are mentioned below. For example, these are considered to be added as a stabilization material.

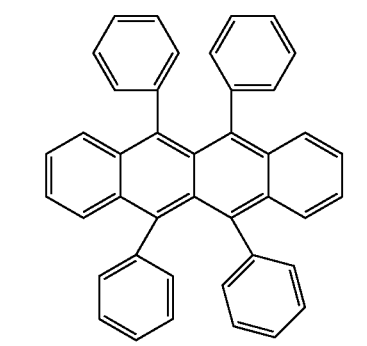

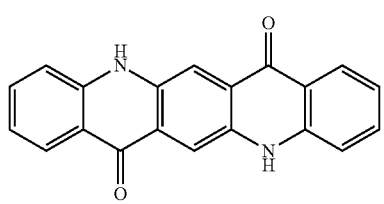

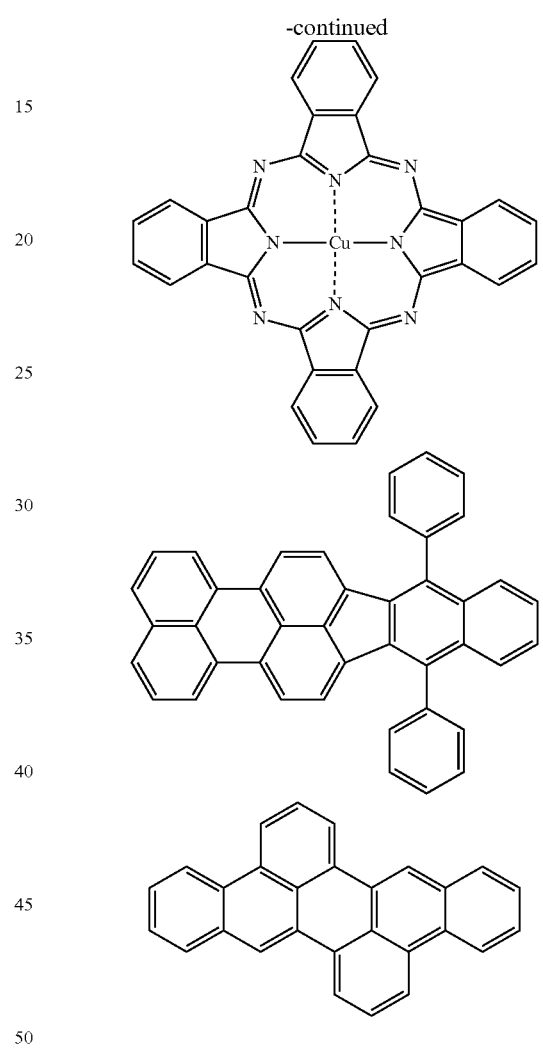

The organic electroluminescent device thus produced by the aforementioned method emits light on application of an electric field between the anode and the cathode of the device. In this case, when the light emission is caused by the excited singlet energy, light having a wavelength that corresponds to the energy level thereof may be confirmed as fluorescent light and delayed fluorescent light. When the light emission is caused by the excited triplet energy, light having a wavelength that corresponds to the energy level thereof may be confirmed as phosphorescent light. The normal fluorescent light has a shorter light emission lifetime than the delayed fluorescent light, and thus the light emission lifetime may be distinguished between the fluorescent light and the delayed fluorescent light.

The phosphorescent light may substantially not be observed with a normal organic compound at room temperature since the excited triplet energy is converted to heat or the like due to the instability thereof, and is immediately deactivated with a short lifetime. The excited triplet energy of the normal organic compound may be measured by observing light emission under an extremely low temperature condition.

The organic electroluminescent device of the invention may be applied to any of a single device, a structure with plural devices disposed in an array, and a structure having anodes and cathodes disposed in an X-Y matrix. The organic electroluminescent device of the present invention has the charge trap concentration decreasing layer provided in the interface between the light-emitting layer and the electron transporting layer, and can therefore be protected from performance deterioration with time in driving, and the device enables high-brightness emission for a long period of time and enables low-voltage driving. The organic electroluminescent device of the invention may be applied to a further wide range of purposes. For example, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLES

The features of the invention will be described more specifically with reference to examples below. The materials, processes, procedures and the like shown below may be appropriately modified unless they deviate from the substance of the invention. Accordingly, the scope of the invention is not construed as being limited to the specific examples shown below. The light emission characteristics were evaluated by using a source meter (2400 Series, produced by Keithley Instruments Inc.), a semiconductor parameter analyzer (E5273A, produced by Agilent Technologies, Inc.), an optical power meter (1930C, produced by Newport Corporation), an optical spectrometer (USB2000, produced by Ocean Optics, Inc.), a spectroradiometer (SR-3, produced by Topcon Corporation), and a streak camera (Model C4334, produced by Hamamatsu Photonics K.K.). For thermal stimulated current (TSC) measurement, a thermal stimulated current indicator (product name TSC-FETT EL2000) manufactured by Rigaku Corporation was used to carry out the measurement under the condition described in the section of definition of "charge trap concentration reducing layer" mentioned hereinabove.

Regarding measurement of each energy level in the energy diagram, a photoelectronic spectrometer (AC3 by Riken Keiki Co., Ltd.) was used for HOMO, and a UV-visible light-near IR spectrometer (LAMBDA950 by Perkin Elmer Co., Ltd.) was used for LUMO.

(Example 1) Production and Evaluation of Organic Electroluminescent Device Having Charge Trap Concentration Decreasing Layer of Liq On a glass substrate having, as formed thereon, an anode of indium-tin oxide (ITO) having a thickness of 100 nm, constituent layers were layered at a vacuum degree of $10^{-5}$ Pa according to a vacuum evaporation method. First, HAT-CN was formed to have a thickness of 10 nm on ITO, and Tris-PCz was formed thereon to have a thickness of 30 nm. Next, 4CzIPN and mCBP were deposited trough co-evaporation from different evaporation sources to form a layer having a thickness of 30 nm to be a light-emitting layer. At this time, the concentration of 4CzIPN was 15% by weight. Next, Liq was vapor-deposited to have a thickness of 1 nm to be a charge trap concentration reducing layer. Subsequently, T2T was vapor-deposited to have a thickness of 10 nm to be an electron transporting layer, and BPy-TP2 was vapor-deposited thereon to have a thickness of 40 nm to be a second electron transporting layer. Further, lithium fluoride (LiF) was vapor-deposited in a thickness of 0.8 nm, and then aluminum (Al) was vapor-deposited to have a thickness of 100 nm, thereby forming a cathode to give an organic electroluminescent device (organic EL device).

Apart from this, an organic EL device was produced in the same manner as above except that, in forming the charge trap concentration reducing layer, the Liq deposition thickness was changed to 2 nm or 3 nm.

Further, for comparison, an organic EL device was produced also in the same manner as above except that the charge trap concentration reducing layer was not formed.

Figure 5:
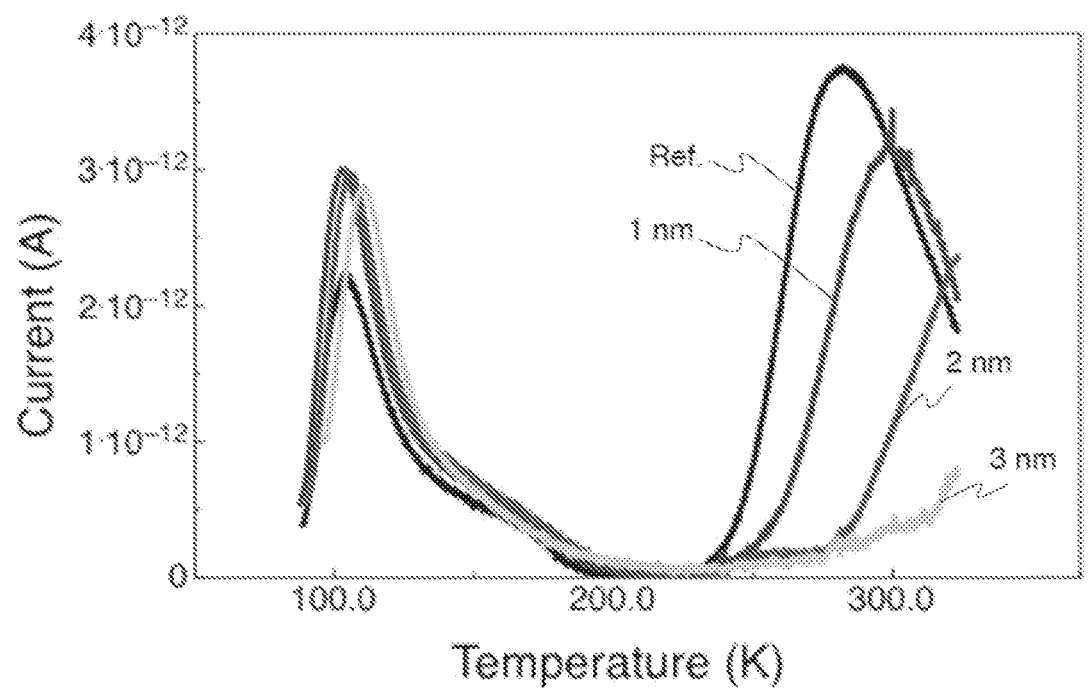
FIG. 5 This shows a TSC profile of an organic electroluminescent device having a charge trap concentration reducing layer of Example 1, and that of an organic electroluminescent device not having a charge trap concentration reducing layer.
Figure 6:
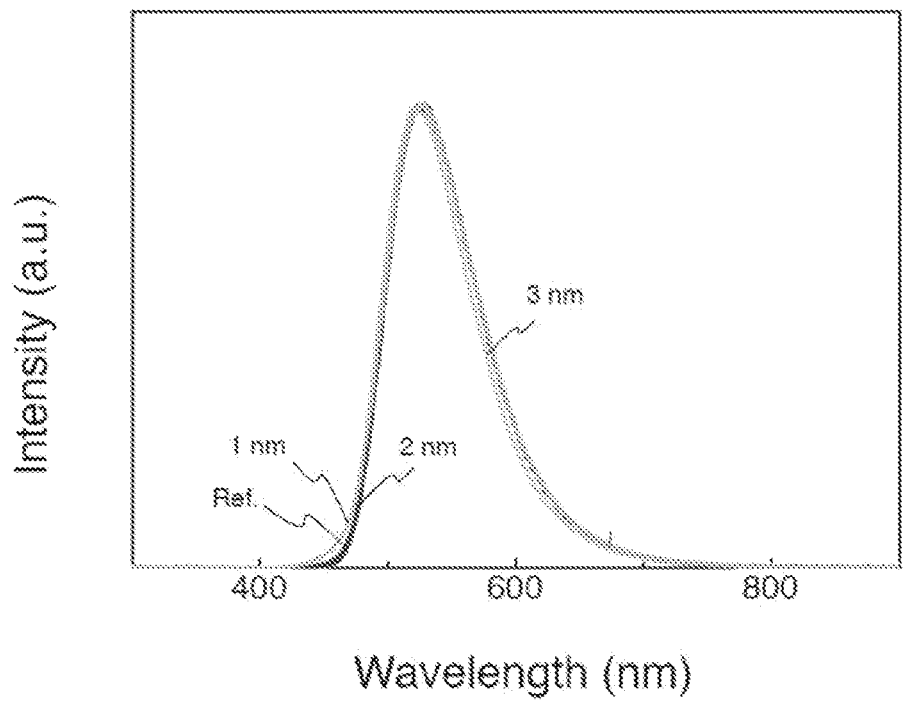
FIG. 6 This shows an emission spectrum of an organic electroluminescent device having a charge trap concentration reducing layer of Example 1, and that of an organic electroluminescent device not having a charge trap concentration reducing layer.
Figure 7:
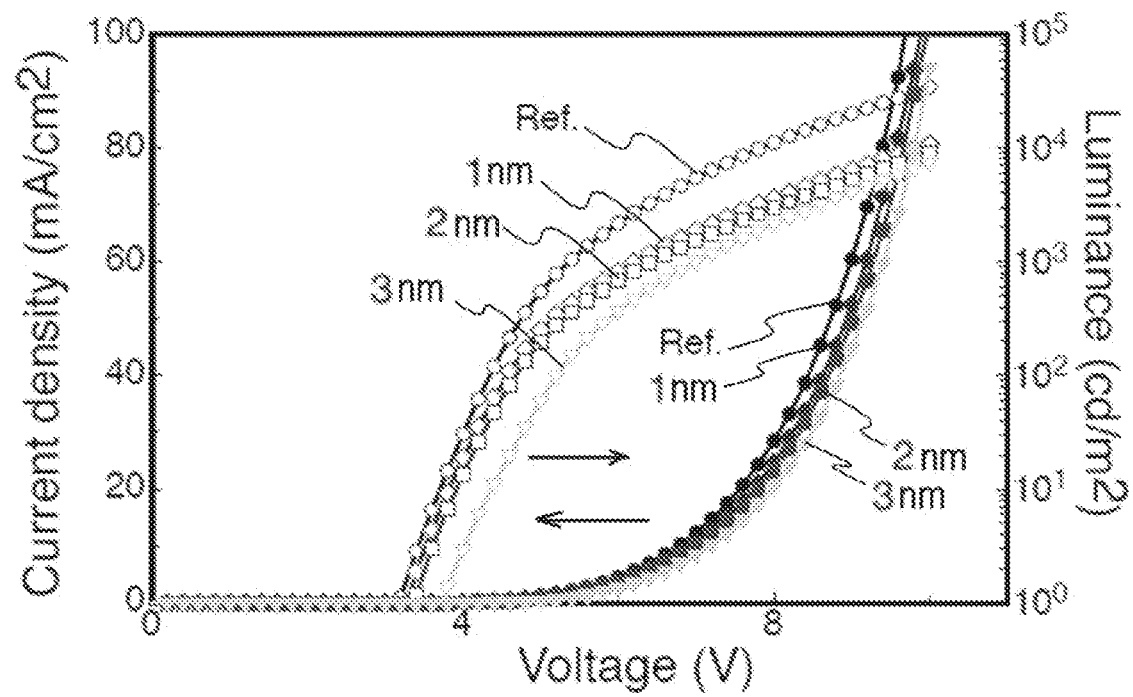
FIG. 7 This is a graph showing a voltage-current density-luminance characteristic of an organic electroluminescent device having a charge trap concentration reducing layer of Example 1, and that of an organic electroluminescent device not having a charge trap concentration reducing layer.
Figure 8:
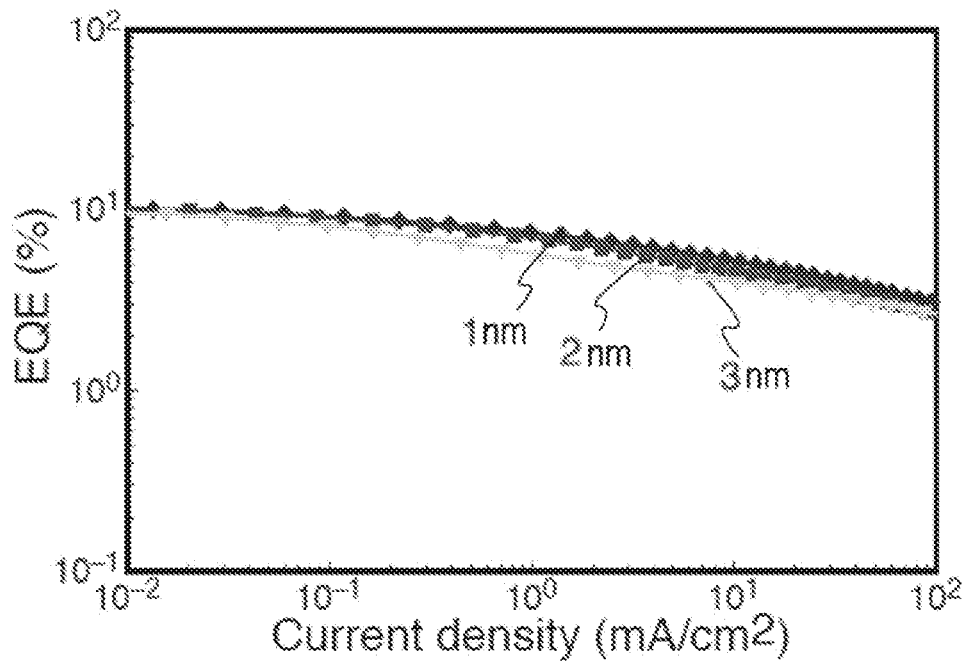
FIG. 8 This is a graph showing a current density-external quantum efficiency characteristic of an organic electroluminescent device having a charge trap concentration reducing layer of Example 1.
Figure 9:
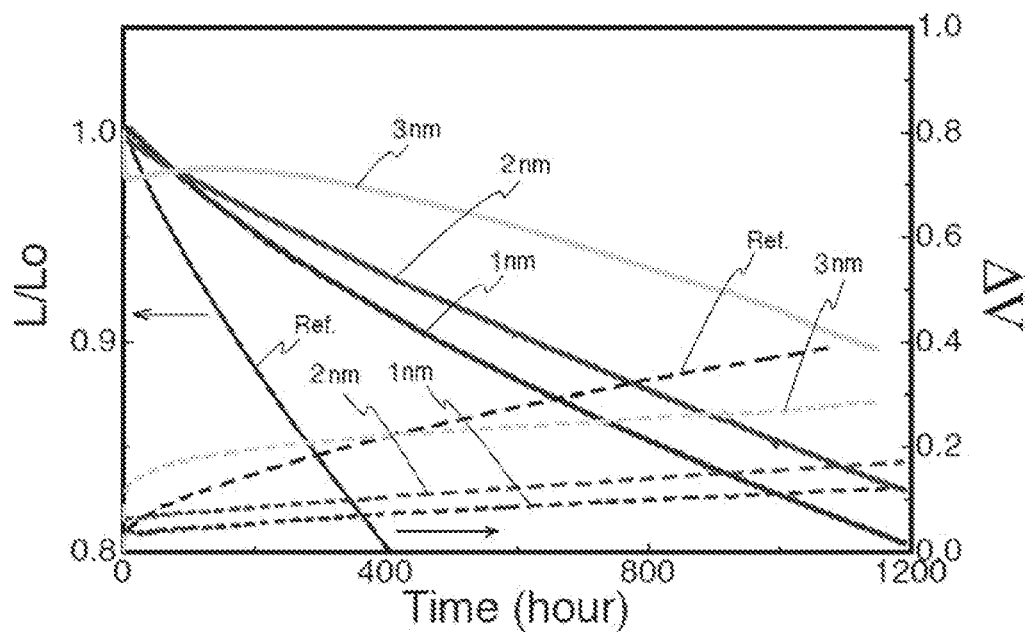
FIG. 9 This is a graph showing a time-dependent change of a luminance ratio and a voltage variation of an organic electroluminescent device having a charge trap concentration reducing layer of Example 1, and that of an organic electroluminescent device not having a charge trap concentration reducing layer.

The TSC profile of the produced organic EL device is shown in FIG. 5, the emission spectrum thereof is in FIG. 6, the voltage-current-density-luminance characteristic thereof is in FIG. 7, the current density-external quantum efficiency characteristic thereof is in FIG. 8, and the time-dependent change of a luminance ratio and a voltage variation thereof is in FIG. 9. In these drawings, "Ref" means the organic EL device not having a charge trap concentration reducing layer, "1 nm", "2 nm" and "3 nm" each mean an organic EL device where the charge trap concentration reducing layer was formed in the indicated thickness. In FIG. 9, "$L_0/L$" means a luminance ratio of the measured luminance L relative to the initial luminance $L_0$ (1000 cd/m$^2$), and $\Delta V$ means a voltage variation amount from the initial voltage. In the following FIGS. 13, 16, 17, 20, 25 and 30, "$L_0/L$" and "$\Delta V$" are the same as these. The device characteristics of the organic EL devices produced in Example 1 are summarized in Table 1.

The TSC profile in FIG. 5 is referred to, in which the peak strength between 250 and 320 K of the organic EL device where the charge trap concentration reducing layer was formed to have a thickness of 1 nm is obviously smaller than that of the organic EL device (Ref.) not having the charge trap concentration reducing layer. For the organic EL devices where the charge trap concentration reducing layer was formed to have a thickness of 2 nm or 3 nm, the TSC measurement range was limited up to 320 K. and therefore the profile thereof on a higher temperature range is unknown. However, assuming from the current change up to the temperature, the peak strength on the high-temperature side of these organic EL devices would be smaller than the peak strength between 250 and 320 K of the organic EL device not having a charge trap concentration reducing layer. This confirms that the Liq layer functions as a charge trap concentration reducing layer.

As in FIG. 9, the organic EL device where the charge trap concentration reducing layer was formed is significantly protected from luminance ratio reduction and voltage variation increase with time as compared with the organic EL device not having a charge trap concentration reducing layer, and it is known that the results are more remarkable with the increase in the thickness of the charge trap concentration reducing layer. This confirms that the charge trap concentration reducing layer greatly contributes toward lifetime prolongation of the organic EL device. Regarding the external quantum efficiency, the organic EL device where the charge trap concentration reducing layer was formed has a somewhat smaller external quantum efficiency than that of the organic EL device not having a charge trap concentration reducing layer, but the effect of lifetime prolongation of the former is remarkable, and accordingly, the usefulness of the former organic EL device could be evaluated to have greatly improved.

(Example 2) Production and Evaluation of Organic Electroluminescent Device Having Charge Trap Concentration Reducing Layer of Liq and Functional Layer of Liq An organic electroluminescent device (organic EL device) was produced in the same manner as in Example 1, except that the thickness of the charge trap concentration reducing layer was changed to 1 nm or 3 nm and that a functional layer of Liq was formed to have a thickness of 1 nm, 2 nm or 3 nm according to a vapor deposition method between the electron transporting layer and the second electron transporting layer.

Figure 10:
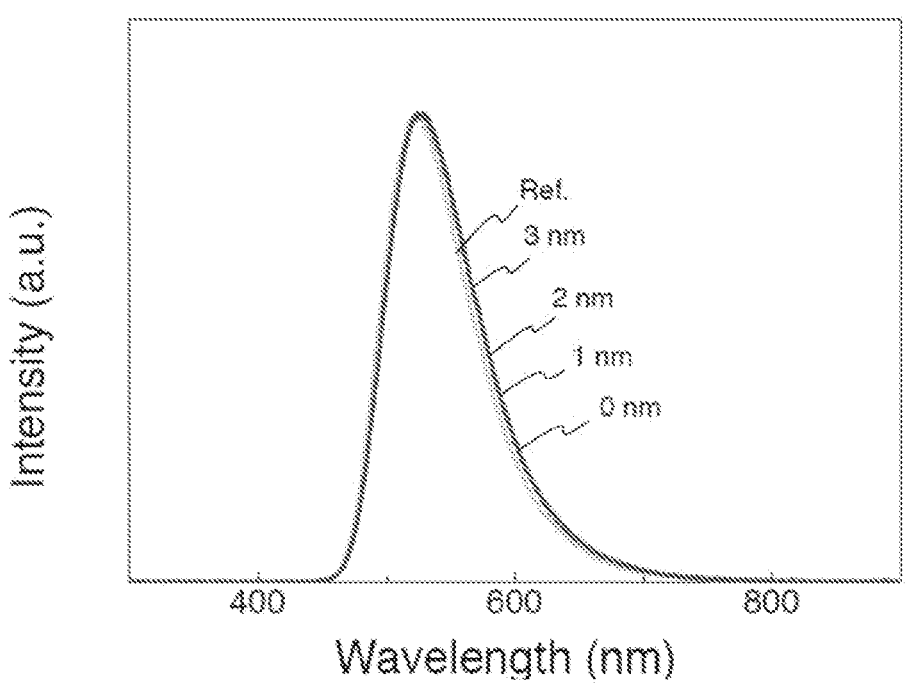
FIG. 10 This shows an emission spectrum of an organic electroluminescent device having a charge trap concentration reducing layer having a thickness of 1 nm, and having a functional layer having a different thickness of Example 2, that of an organic electroluminescent device having a charge trap concentration reducing layer having a thickness of 1 nm and not having a functional layer, and that of an organic electroluminescent device having neither a charge trap concentration reducing layer nor a functional layer.
Figure 11:
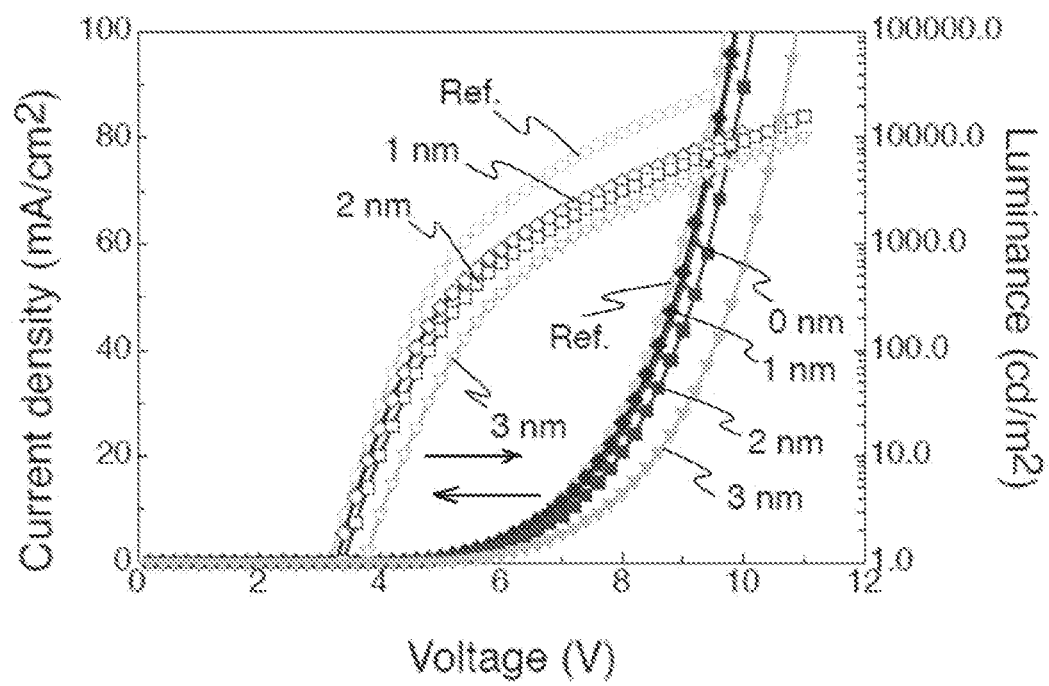
FIG. 11 This is a graph showing a voltage-current density-luminance characteristic of an organic electroluminescent device having a charge trap concentration reducing layer having a thickness of 1 nm, and having a functional layer having a different thickness of Example 2, that of an organic electroluminescent device having a charge trap concentration reducing layer having a thickness of 1 nm and not having a functional layer, and that of an organic electroluminescent device having neither a charge trap concentration reducing layer nor a functional layer.
Figure 12:
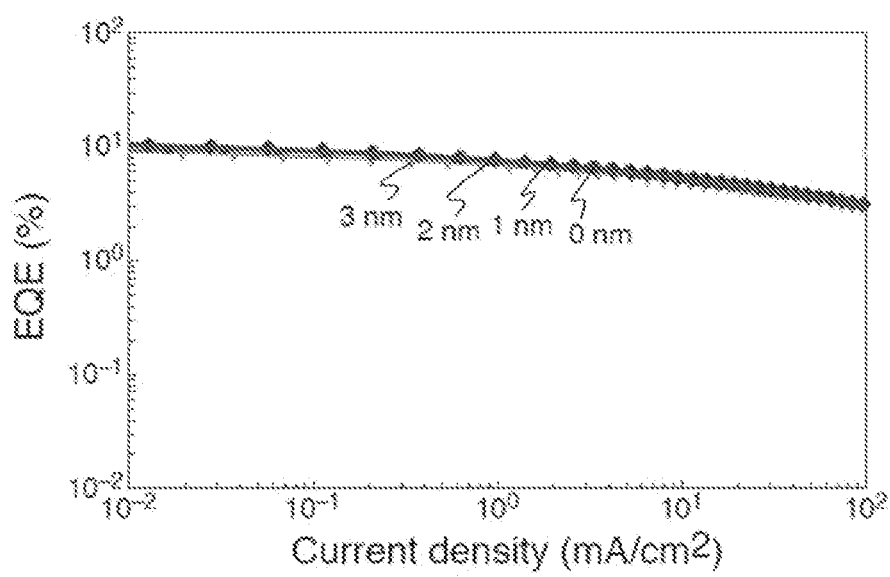
FIG. 12 This is a graph showing a current density-external quantum efficiency characteristic of an organic electroluminescent device having a charge trap concentration reducing layer having a thickness of 1 nm, and having a functional layer having a different thickness of Example 2, and that of an organic electroluminescent device having a charge trap concentration reducing layer having a thickness of 1 nm and not having a functional layer.
Figure 13:
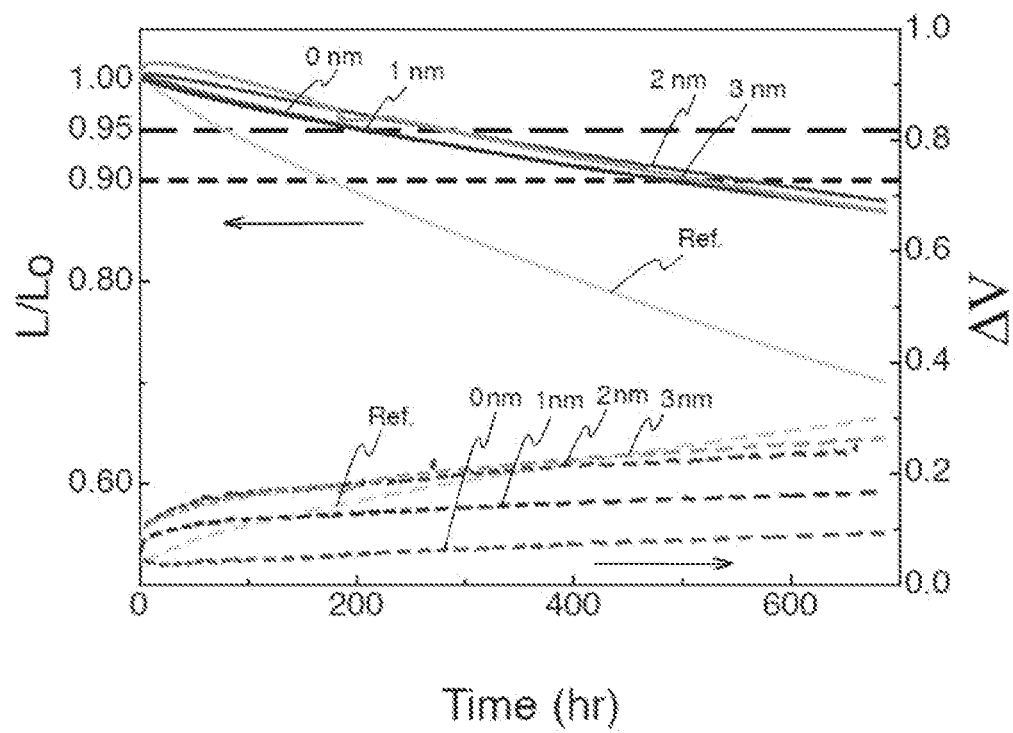
FIG. 13 This is a graph showing a time-dependent change of a luminance ratio and a voltage variation of an organic electroluminescent device having a charge trap concentration reducing layer having a thickness of 1 nm, and having a functional layer having a different thickness, that of an organic electroluminescent device having a charge trap concentration reducing layer having a thickness of 1 nm and not having a functional layer, and that of an organic electroluminescent device having neither a charge trap concentration reducing layer nor a functional layer.
Figure 14:
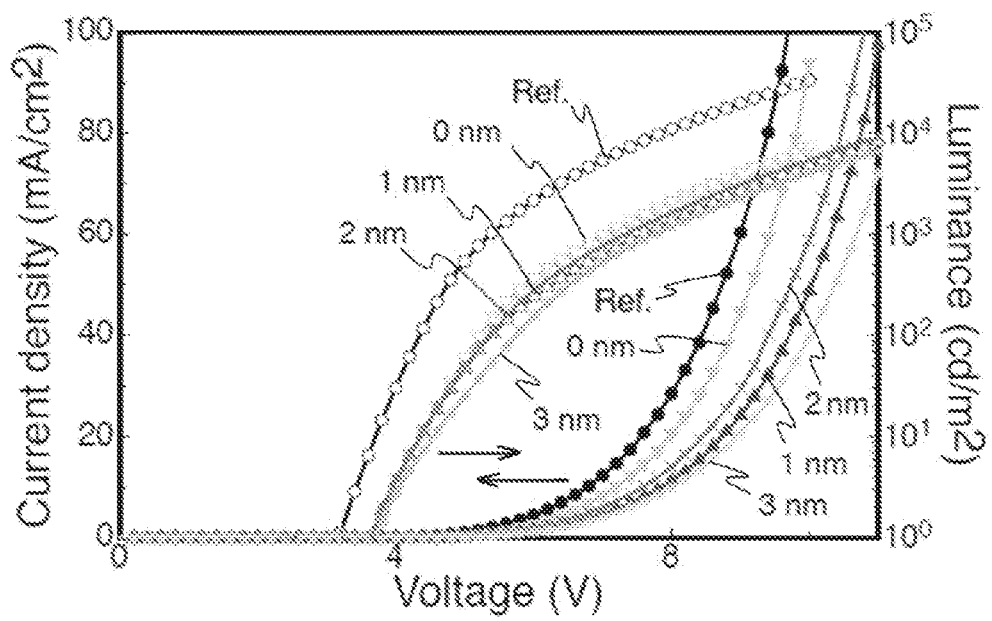
FIG. 14 This is a graph showing a voltage-current density-luminance characteristic of an organic electroluminescent device having a charge trap concentration reducing layer having a thickness of 3 nm, and having a functional layer having a different thickness of Example 2, that of an organic electroluminescent device having a charge trap concentration reducing layer having a thickness of 3 nm and not having a functional layer, and that of an organic electroluminescent device having neither a charge trap concentration reducing layer nor a functional layer.
Figure 15:
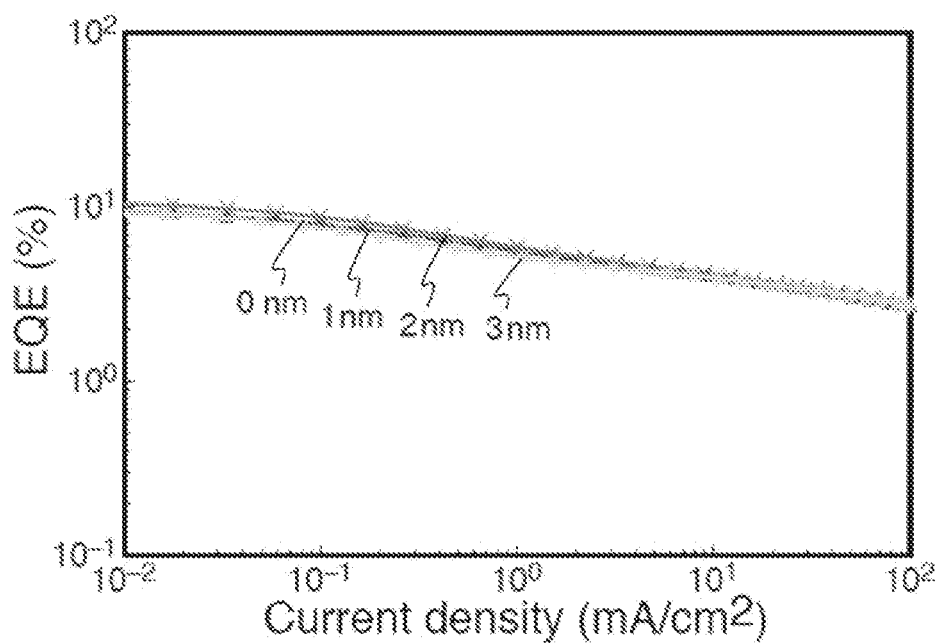
FIG. 15 This is a graph showing a current density-external quantum efficiency characteristic of an organic electroluminescent device having a charge trap concentration reducing layer having a thickness of 3 nm, and having a functional layer having a different thickness of Example 2, and that of an organic electroluminescent device having a charge trap concentration reducing layer having a thickness of 3 nm and not having a functional layer.

The emission spectrum of the organic EL device where the charge trap concentration reducing layer was formed to have a thickness of 1 nm and the functional layer was formed to have a different layer is shown in FIG. 10; the voltage-current density-luminance characteristic thereof is in FIG. 11; the current-density-external quantum efficiency characteristic thereof is in FIG. 12, and the time-dependent change of a luminance ratio and a voltage variation thereof is in FIG. 13. The charge trap concentration reduction layer was formed to have a thickness of 3 nm, and the voltage-current density-luminance characteristic of the organic EL device where the functional layer was formed to have a different thickness is shown in FIG. 14, the current density-external quantum efficiency characteristic thereof is in FIG. 15, and the time-dependent change of a luminance ratio and a voltage variation thereof is in FIG. 16. In these drawings, the measured results of the organic EL device produced in the same manner as previously except that a functional layer was not formed and those of the organic EL device also produced in the same manner as previously except that a charge trap concentration reducing layer and a functional layer were not formed are also shown. In these drawings, "Ref." means the organic EL device having neither a charge trap concentration reducing layer nor a functional layer; "0 nm" means an organic EL device where the charge trap concentration reducing layer was formed in a thickness of 1 nm or 3 nm but a functional layer was not formed; "1 nm", "2 nm" and "3 nm" each mean an organic EL device where the functional layer was formed in the indicated thickness and the charge trap concentration reducing layer was formed in a thickness of 1 nm or 3 nm.

The device characteristics of the organic EL devices produced in Example 2 are summarized in Table 1.

Figure 16:
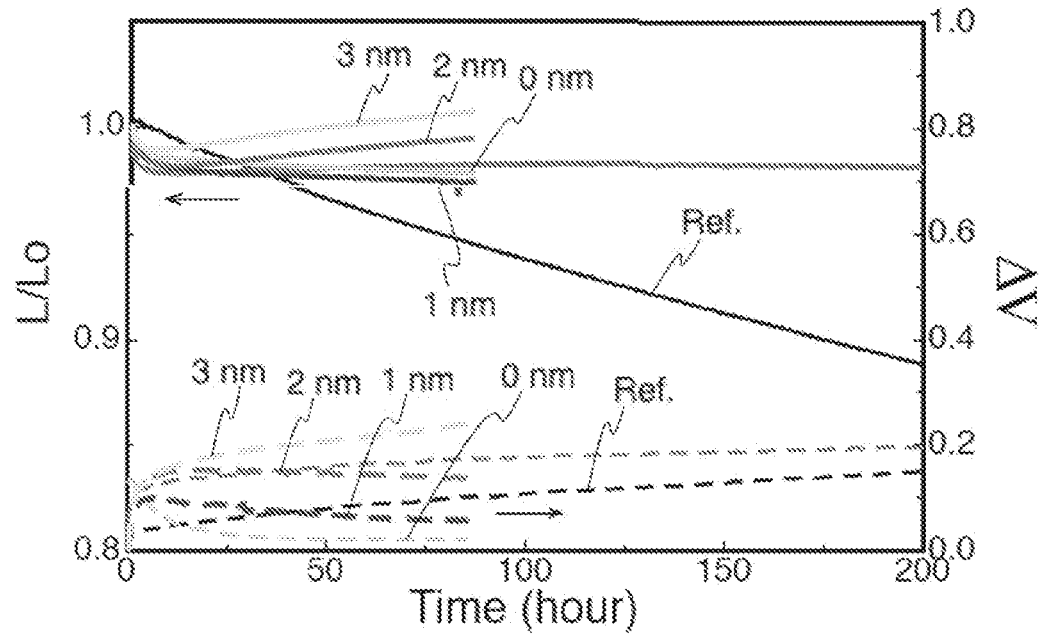
FIG. 16 This is a graph showing a time-dependent change of a luminance ratio and a voltage variation of an organic electroluminescent device having a charge trap concentration reducing layer having a thickness of 3 nm, and having a functional layer having a different thickness of Example 2, that of an organic electroluminescent device having a charge trap concentration reducing layer having a thickness of 3 nm and not having a functional layer, and that of an organic electroluminescent device having neither a charge trap concentration reducing layer nor a functional layer.

As in FIGS. 13 and 16, the organic EL device where the charge trap concentration reducing layer and the functional layer were formed is more significantly protected from luminance ratio reduction than the organic EL device where the charge trap concentration reducing layer was formed but a functional layer was not formed. The effect is remarkable in the case where the charge trap concentration reducing layer was 3 nm (see FIG. 16). This confirms that the lifetime of the organic EL device can be further prolonged when a functional layer is additionally formed therein along with the charge trap concentration reducing layer.

TABLE 1

| | Charge Trap Concentration Reducing Layer (nm) | Functional Layer (nm) | Maximum External Quantum Efficiency (%) | Turn-on Voltage (V) | CIE CIEx | CIEy | 1000 cd/m² LT90 (hr) | Current Density J (mA/cm²) | Deep Trap Interfacial Charge Density (cm$^{-2}$) |
|---|---|---|---|---|---|---|---|---|---|
| Example 1 | 1 | 0 | 10.6 | 3.3 | 0.34 | 0.59 | 485 | 4.65 | 2.80 × 10$^{11}$ |
| | 2 | 0 | 10.5 | 3.4 | 0.34 | 0.58 | 630 | 5.57 | 1.13 × 10$^{11}$ |
| | 3 | 0 | 9.7 | 3.8 | 0.34 | 0.58 | 1115 | 7.79 | 4.32 × 10$^{10}$ |
| Comparative Example 1 | 0 | 1 | 15.0 | 3.0 | 0.34 | 0.59 | 290 | 1.98 | — |
| | 0 | 2 | 14.8 | 3.2 | 0.34 | 0.59 | 140 | 2.00 | — |
| | 0 | 3 | 14.2 | 3.4 | 0.34 | 0.59 | 30 | 2.10 | — |
| Example 2 | 1 | 1 | 11.5 | 3.3 | 0.34 | 0.59 | 490 | 4.70 | — |
| | 1 | 2 | 10.0 | 3.4 | 0.34 | 0.59 | 560 | 5.05 | — |
| | 1 | 3 | 9.5 | 3.6 | 0.34 | 0.59 | 520 | 5.28 | — |
| | 3 | 1 | 10.3 | 3.8 | 0.34 | 0.58 | 1130 | 7.04 | — |
| | 3 | 2 | 10.6 | 3.8 | 0.34 | 0.58 | 1380 | 6.81 | — |
| | 3 | 3 | 9.1 | 3.8 | 0.34 | 0.58 | 1045 | 7.11 | — |
| Ref. | 0 | 0 | 14.9 | 3.2 | 0.33 | 0.59 | 175 | 1.86 | 3.94 × 10$^{11}$ |

(Comparative Example 1) Production and Evaluation of Organic Electroluminescent Device not Having Charge Trap Concentration Reducing Layer but Having Functional Layer of Liq An organic EL device was produced in the same manner as in Example 1, except that the charge trap concentration reducing layer was not formed but a functional layer of Liq having a thickness of 1 nm, 2 nm or 3 nm was formed according to a vapor deposition method between the electron transporting layer and the second electron transporting layer. The device characteristics of the organic EL devices produced in Comparative Example 1 are shown in Table 1.

Figure 17:
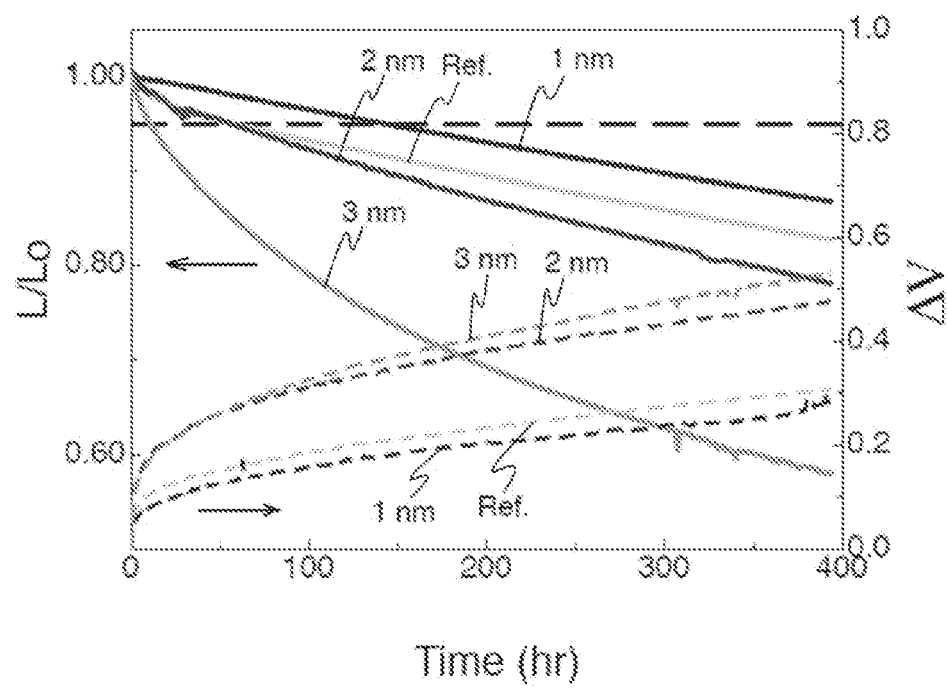
FIG. 17 This is a graph showing a time-dependent change of a luminance ratio and a voltage variation of an organic electroluminescent device not having a charge trap concentration reducing layer and having a functional layer having a different thickness of Comparative Example 1.

The time-dependent change of the luminance ratio and the voltage variation of the produced organic EL device is shown in FIG. 17. In FIG. 17, in addition, the measured results of the organic EL device produced in the same manner as herein except that the functional layer of Liq was not formed are shown. In FIG. 17, "Ref" means the organic EL device not having the functional layer of Liq, and "1 nm", "2 nm" and "3 nm" each mean an organic EL device where the functional layer of Liq was formed in the indicated thickness.

As in FIG. 17, the organic EL device having the functional layer of Liq formed between the electron transporting layer and the second electron transporting layer to have a thickness of 1 nm has a lifetime of the same level as that of the organic EL device not having the functional layer, but when the thickness of the functional layer in the former is increased, the luminance ratio reduction conversely tends to be larger. From this, it is known that even when the Liq layer is arranged only between the electron transporting layer and the second electron transporting layer, the effect of lifetime prolongation could not be attained.

(Comparative Example 2) Production and Evaluation of Organic Electroluminescent Device Having Alq3 Layer Between Light-Emitting Layer and Electron Transporting Layer An organic EL device was produced in the same manner as in Example 1, except that the charge trap concentration reducing layer of Liq was not formed and, in place of it, an organic layer of Alq3 represented by the following formula (Alq3 layer) was formed according to a vapor deposition method between the light-emitting layer and the electron transporting layer in a thickness of 1 nm, 3 nm or 5 nm.

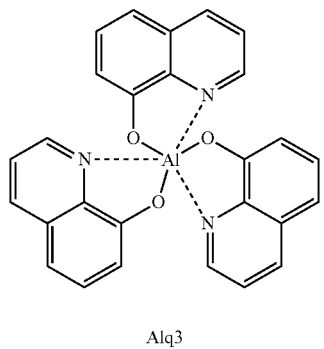

Alq3

Figure 18:
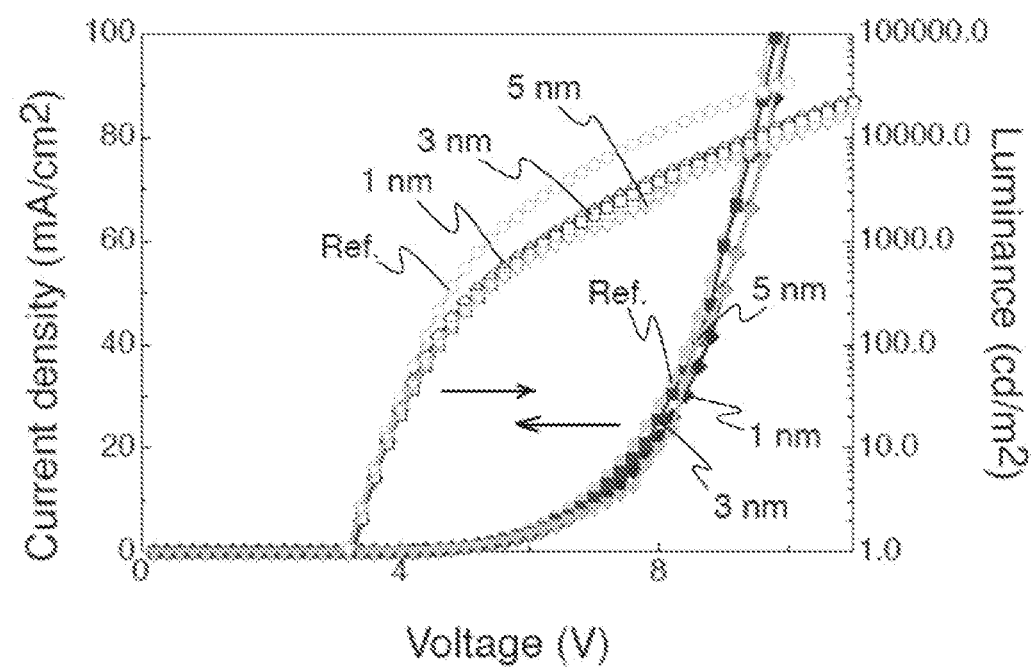
FIG. 18 This is a graph showing a voltage-current density-luminance characteristic of an organic electroluminescent device having an Alq3 layer having a different thickness of Comparative Example 2 and that of an organic electroluminescent device not having an Alq3 layer.
Figure 19:
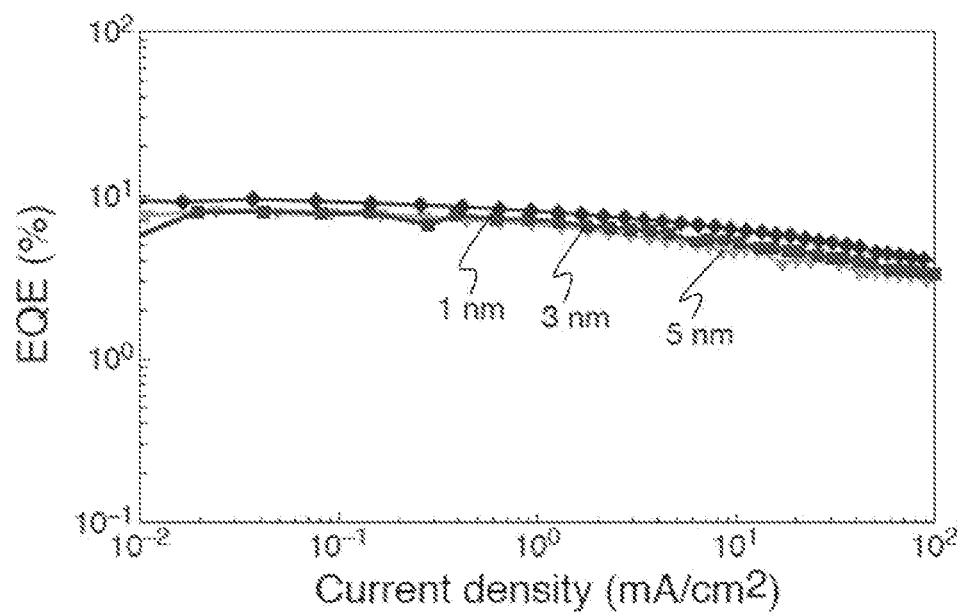
FIG. 19 This is a graph showing a current density-external quantum efficiency characteristic of an organic electroluminescent device having an Alq3 layer having a different thickness of Comparative Example 2.
Figure 20:
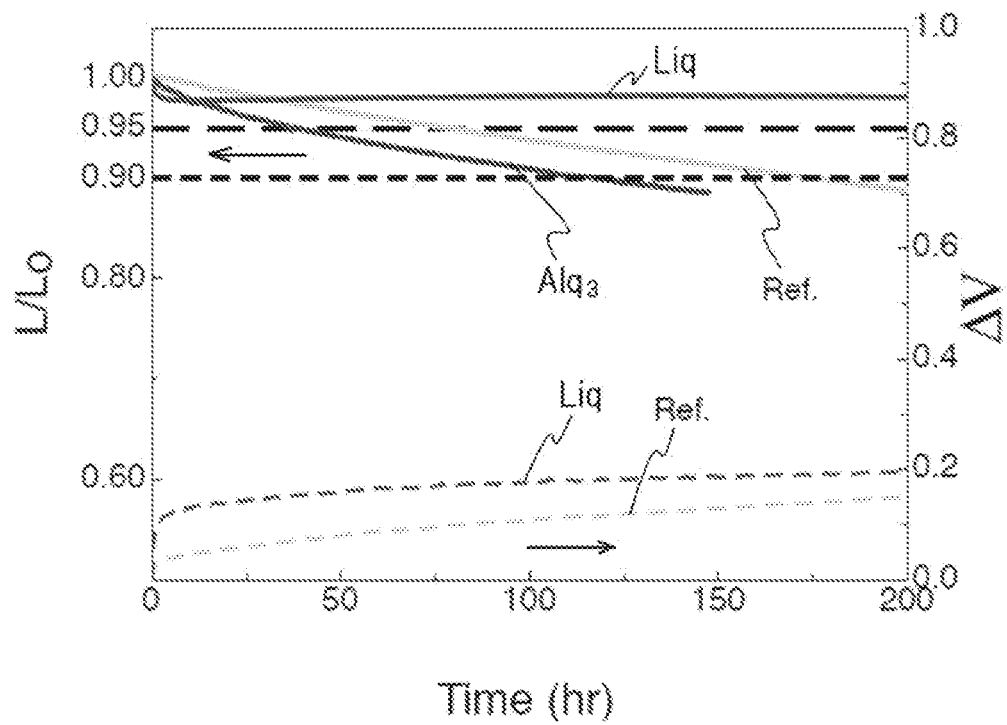
FIG. 20 This is a graph showing a time-dependent change of a luminance ratio and a voltage variation of an organic electroluminescent device having an Alq3 layer of Comparative Example 2, that of an organic electroluminescent device having a Liq1 layer, and that of an organic electroluminescent device having neither an Alq3 layer nor a Liq layer.

The voltage-current density-luminance characteristic of the produced organic EL device is shown in FIG. 18; the current density-external quantum efficiency characteristic thereof is in FIG. 19; and the time-dependent change of luminance and driving voltage thereof is in FIG. 20. In addition, in FIG. 18 and FIG. 20, the measured results of an organic EL device produced in the same manner as previously except that the Alq3 layer was not formed are additionally shown. In FIG. 18, "Ref." means the organic EL device not having the Alq3 layer. In FIG. 18 and FIG. 19, "1 nm", "3 nm" and "5 nm" each mean an organic EL device where the Alq3 layer was formed in the indicated thickness. In FIG. 20, "Ref." means the organic EL device not having the Alq3 layer; "Alq3" means the organic EL device where the Alq3 layer was formed in a thickness of 3 nm; "Liq" means the organic EL device where a Liq layer was formed in a thickness of 3 nm in place of the Alq3 layer.

As in FIG. 20, the luminance reduction in the organic EL device where the Alq3 layer was formed between the light-emitting layer and the electron transporting layer is rather larger than the organic EL device not having the Alq3 layer (Ref.). From this, it is known that the Alq3 layer is not effective for prolonging the lifetime of the organic EL device.

(Example 3) Production and Evaluation of Organic Electroluminescent Device Having Charge Trap Concentration Reducing Layer of Liq and Having Light-Emitting Layer with T2T (Second Host Material)

An organic electroluminescent device (organic EL device) was produced in the same manner as in Example 1, except that the charge trap concentration reducing layer was formed in a thickness of 1 nm and that the light-emitting layer having a thickness of 30 nm was formed through co-evaporation from different evaporation sources of 4CzIPN, mCBP and T2T. Specifically, four types of organic EL devices each having a different 4CzIPN concentration were produced in which the T2T concentration in the light-emitting layer was fixed at 10% by mass, and the concentration of 4CzIPN was 10% by weight, 15% by weight or 20% by weight.

Regarding the lowest excited triplet energy level of the materials for the light-emitting layer used in this example, 4CzIPN had 2.40 eV, mCBP had 2.90 eV, and T2T had 2.70 eV.

Figure 21:
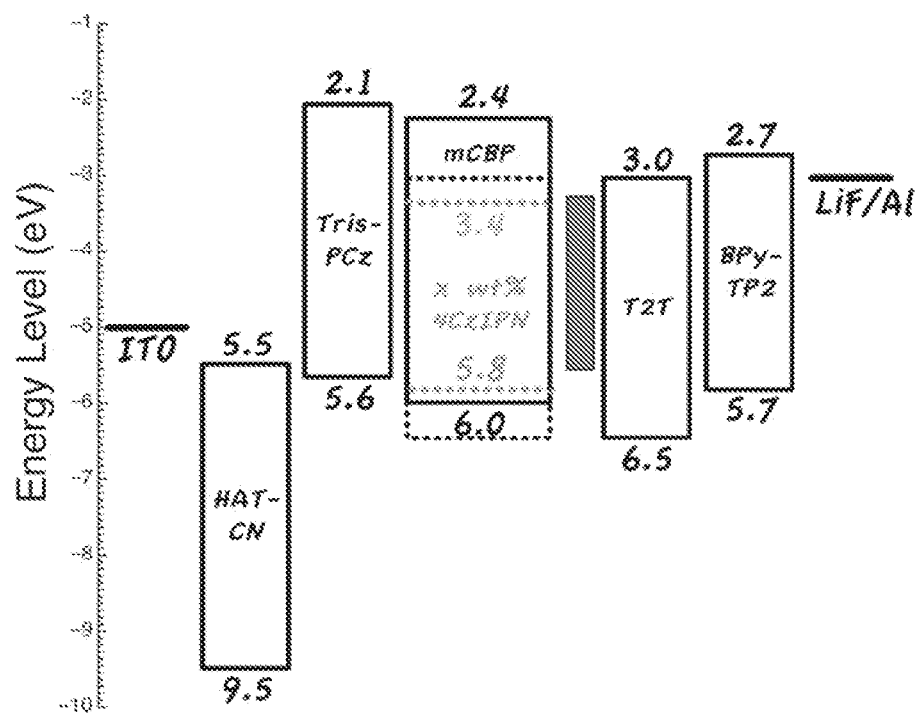
FIG. 21 This is an energy diagram of an organic electroluminescent device having a charge trap concentration reducing layer of Example 3, in which the light-emitting layer contains T2T (second host material).
Figure 22:
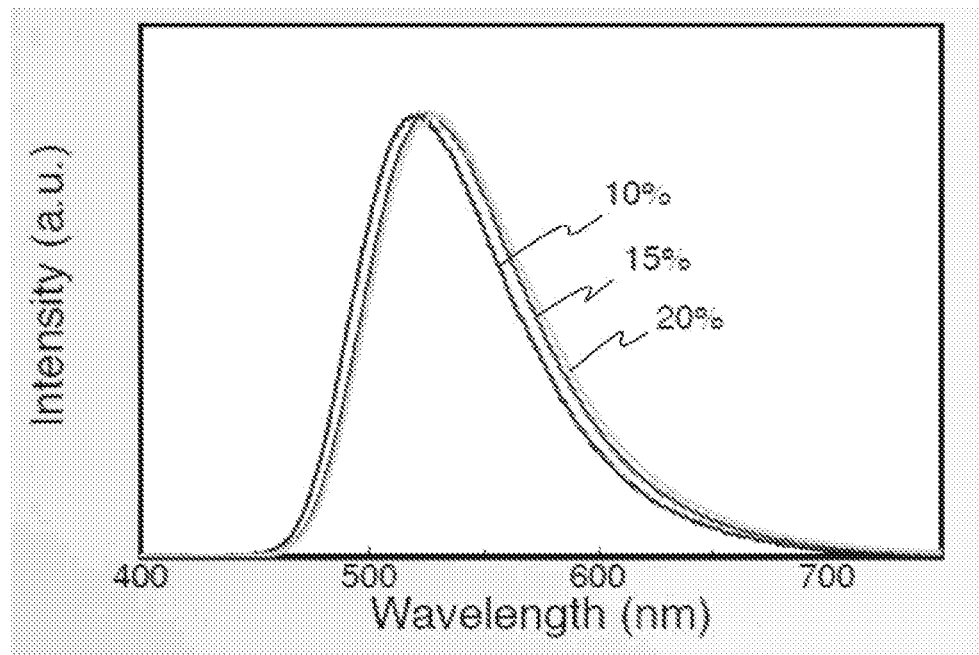
FIG. 22 This is an emission spectrum of an organic electroluminescent device having a charge trap concentration reducing layer of Example 3, in which the light-emitting layer contains T2T (second host material).
Figure 23:
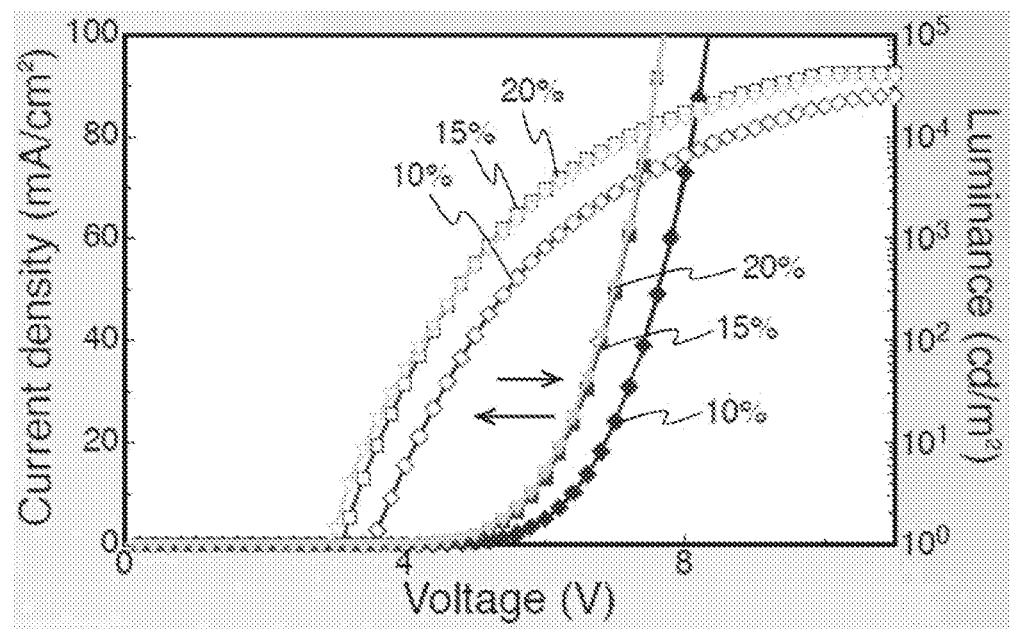
FIG. 23 This is a graph showing a voltage-current density-luminance characteristic of an organic electroluminescent device having a charge trap concentration reducing layer of Example 3, in which the light-emitting layer contains T2T (second host material).
Figure 24:
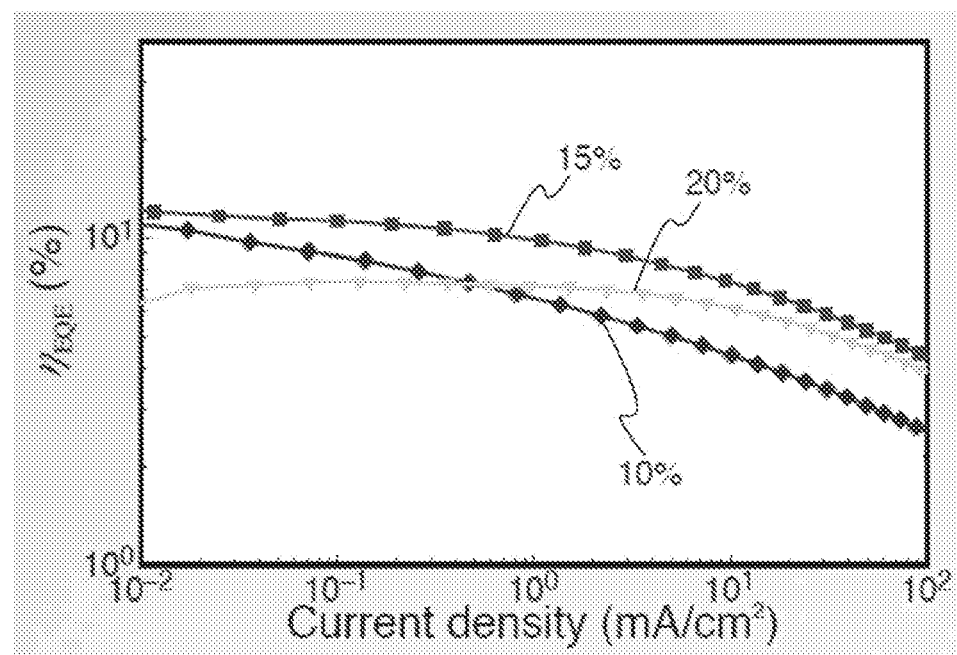
FIG. 24 This is a graph showing a current density-external quantum efficiency characteristic of an organic electroluminescent device having a charge trap concentration reducing layer of Example 3, in which the light-emitting layer contains T2T (second host material).
Figure 25:
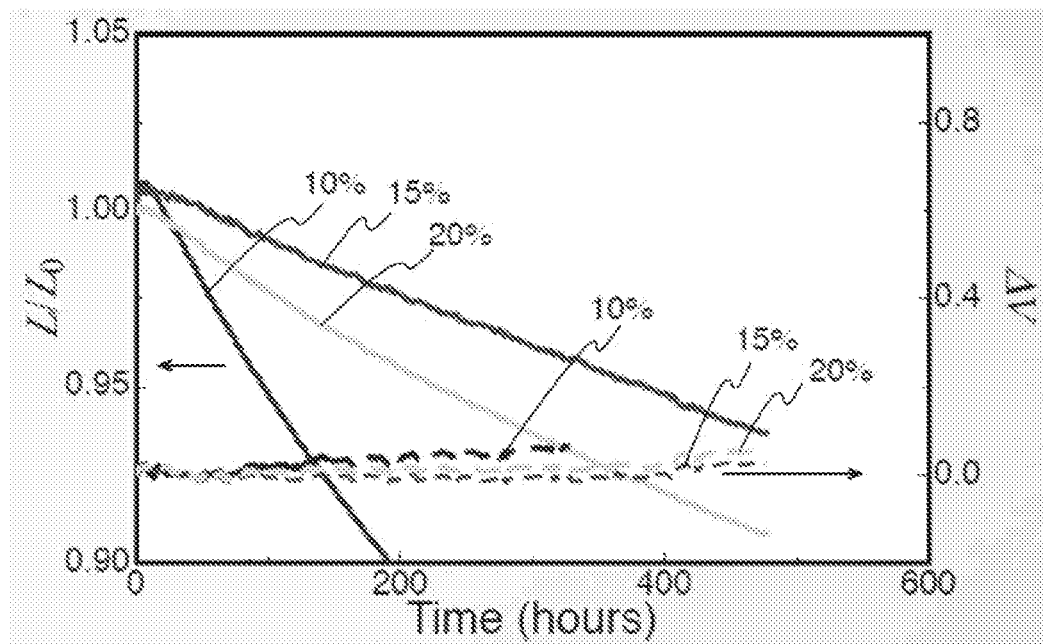
FIG. 25 This is a graph showing a time-dependent change of a luminance ratio and a voltage variation of an organic electroluminescent device having a charge trap concentration reducing layer of Example 3, in which the light-emitting layer contains T2T (second host material).

The energy diagram of the produced organic EL device is shown in FIG. 21, the emission spectrum thereof is in FIG. 22, the voltage-current density-luminance characteristic thereof is in FIG. 23, the current density-external quantum efficiency characteristic thereof is in FIG. 24, and the time-dependent change of luminance ratio and voltage variation is in FIG. 25. Regarding the numeral values in FIG. 21, the lower value represents an absolute value of the HOMO level of each organic layer and the upper value represents the LUMO level of each organic layer. In the organic layer (light-emitting layer) on the 3rd position from the ITO side, the upper and lower solid lines each indicate the energy level of mCBP, the outside dotted line indicates the energy level of T2T, and the inner dotted line indicates the energy level of 4CzIPN. In FIGS. 22 to 25, "5%", "10%", "15%" and "20%" each represent the organic EL device where the light-emitting layer contains 4CzIPN in the indicated concentration.

Among the organic EL devices shown in FIG. 25, the characteristic diagram of the device where the 4CzIPN concentration is 15% is compared with the characteristic diagram of the device where the thickness of the charge trap concentration reducing layer is 1 nm among the organic EL devices shown in FIG. 9 (Example 1). It is known that the time-dependent luminance ratio reduction and the voltage variation increase are more suppressed in the organic EL device of this example (organic EL device where the light-emitting layer contains T2T) than in the organic EL device of Example 1 (organic EL device where the light-emitting layer does not contain T2T). From this, it is known that, when the charge trap concentration reducing layer is formed and additionally T2T (second host material) is added to the light-emitting layer, the lifetime of the organic EL device can be prolonged further more.

(Example 4) Production and Evaluation of Organic Electroluminescent Device Having Charge Trap Concentration Reducing Layer of Liq, Containing T2T (Second Host Material) in Light-Emitting Layer, and Containing Liq in Second Electron Transporting Layer An organic electroluminescent device (organic EL device) was produced in the same manner as in Example 3, except that the concentration of 4CzIPN in the light-emitting layer was 10% by weight, and that the second electron transporting layer having a thickness of 40 nm was formed through co-evaporation from different evaporation sources of BPy-TP2 and Liq. In that manner, two types of organic EL devices each having a different Liq concentration were produced, in which the concentration of Liq in the second electron transporting layer was 50% by weight or 75% by weight.

Figure 26:
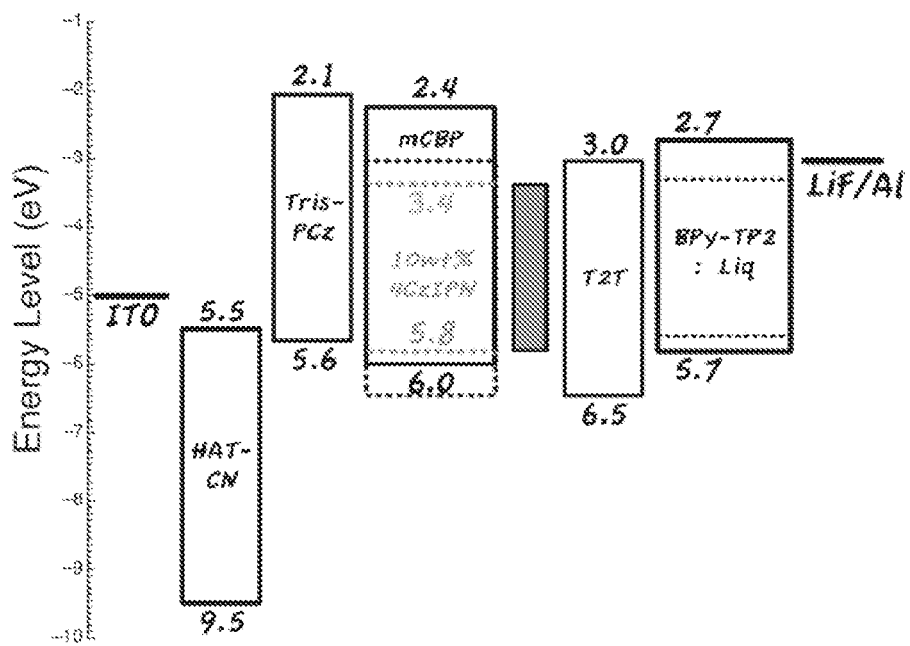
FIG. 26 This is an energy diagram of an organic electroluminescent device having a charge trap concentration reducing layer of Example 4, in which the light-emitting layer contains T2T (second host material) and the second electron transporting layer contains Liq.
Figure 27:
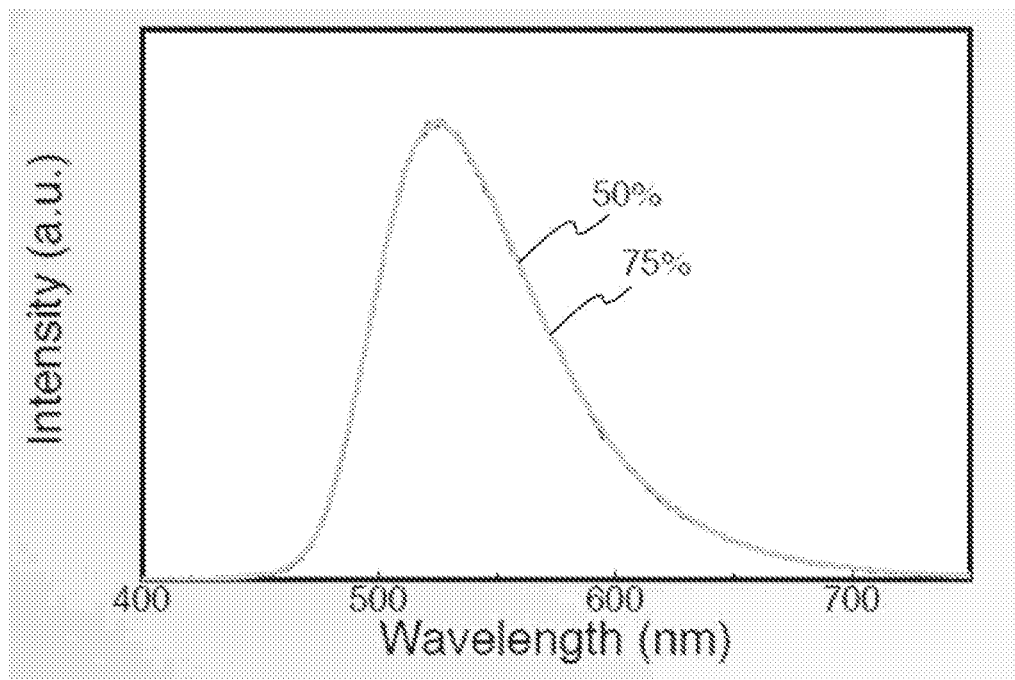
FIG. 27 This is an emission spectrum of an organic electroluminescent device having a charge trap concentration reducing layer of Example 4, in which the light-emitting layer contains T2T (second host material) and the second electron transporting layer contains Liq.
Figure 28:
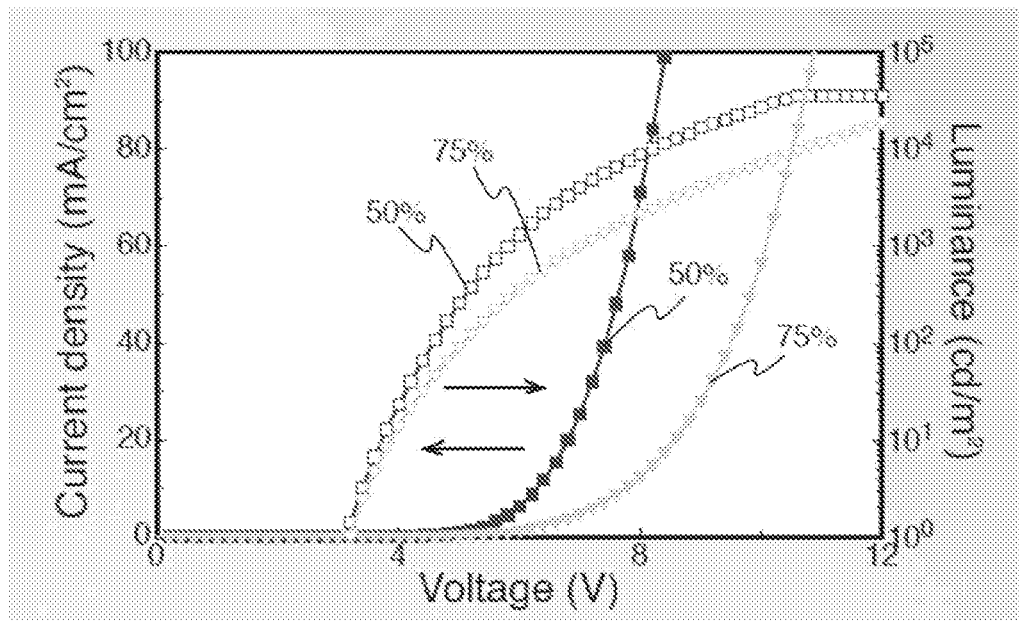
FIG. 28 This is a graph showing a voltage-current density-luminance characteristic of an organic electroluminescent device having a charge trap concentration reducing layer of Example 4, in which the light-emitting layer contains T2T (second host material) and the second electron transporting layer contains Liq.
Figure 29:
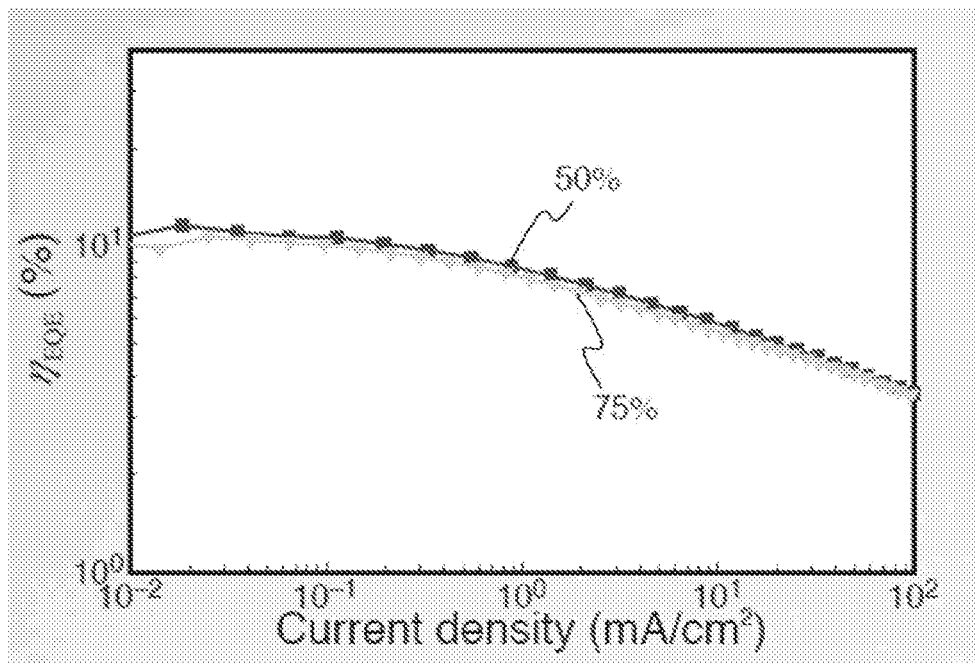
FIG. 29 This is a graph showing a current density-external quantum efficiency characteristic of an organic electroluminescent device having a charge trap concentration reducing layer of Example 4, in which the light-emitting layer contains T2T (second host material) and the second electron transporting layer contains Liq.
Figure 30:
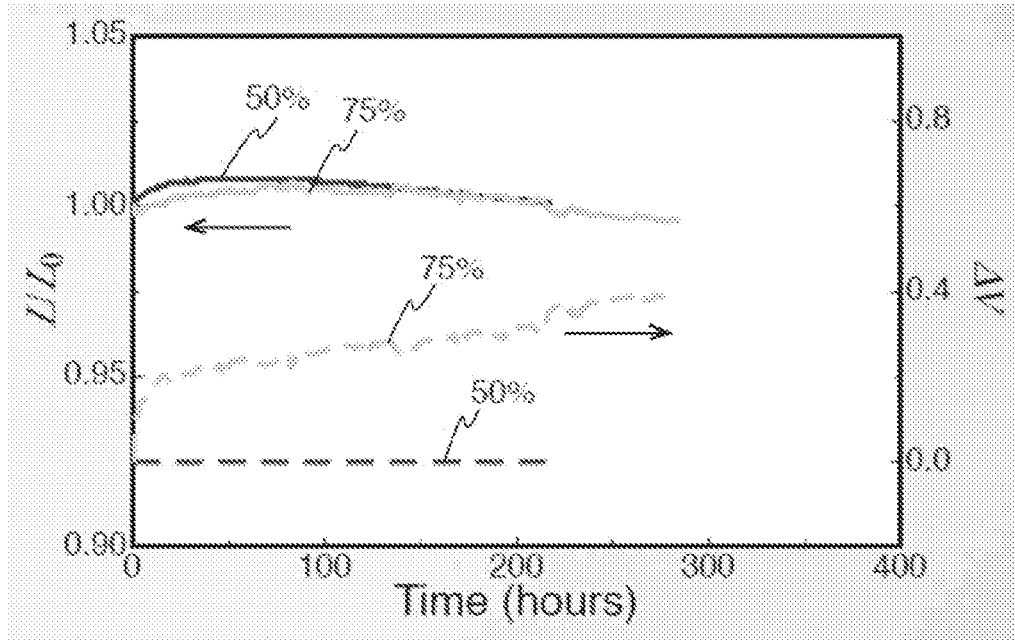
FIG. 30 This is a graph showing a time-dependent change of a luminance ratio and a voltage variation of an organic electroluminescent device having a charge trap concentration reducing layer of Example 4, in which the light-emitting layer contains T2T (second host material) and the second electron transporting layer contains Liq.

The energy diagram of the produced organic EL device is shown in FIG. 26, the emission spectrum thereof is in FIG. 27, the voltage-current density-luminance characteristic thereof is in FIG. 28, the current density-external quantum efficiency characteristic thereof is in FIG. 29, and the time-dependent change of luminance ratio and voltage variation is in FIG. 30. The meanings of the numerical data in FIG. 26 are the same as the meanings of the numerical data in FIG. 21. In the organic layer (second electron transporting layer) on the 1st position from the LiF/Al side, the upper and lower solid lines each indicate the energy level of Bpy-TP2, and the dotted line indicates the energy level of Liq. In FIGS. 27 to 30, "50%" and "75% each represent the organic EL device where the second electron transporting layer contains Liq in the indicated concentration.

Of the characteristic diagram shown in FIG. 30 and the characteristic diagram shown in FIG. 25 (Example 3), those where the 4CzIPN concentration is 10% are compared. It is known that the luminance ratio reduction rate of the organic EL device of this example (organic EL device where the second electron transporting layer contains Liq) is noticeably smaller than the luminance ratio reduction rate of the organic EL device of Example 3 (organic EL device where the second electron transporting layer does not contain Liq). From this, it is known that, when the charge trap concentration reducing layer is formed and T2T (second host material) is added to the light-emitting layer, and further Liq (the same material as the constituent material in the charge trap concentration reducing layer) is added to the second electron transporting layer, the lifetime of the organic EL device can be greatly prolonged.

An organic EL device was produced and tested also in the same manner as above except that the 4CzIPN concentration in the light-emitting layer in Example 4 was fixed at 15% and the Liq concentration in the second electron transporting layer was 50% or 75%, and the same results as in Example 4 were confirmed.

Figure 31:
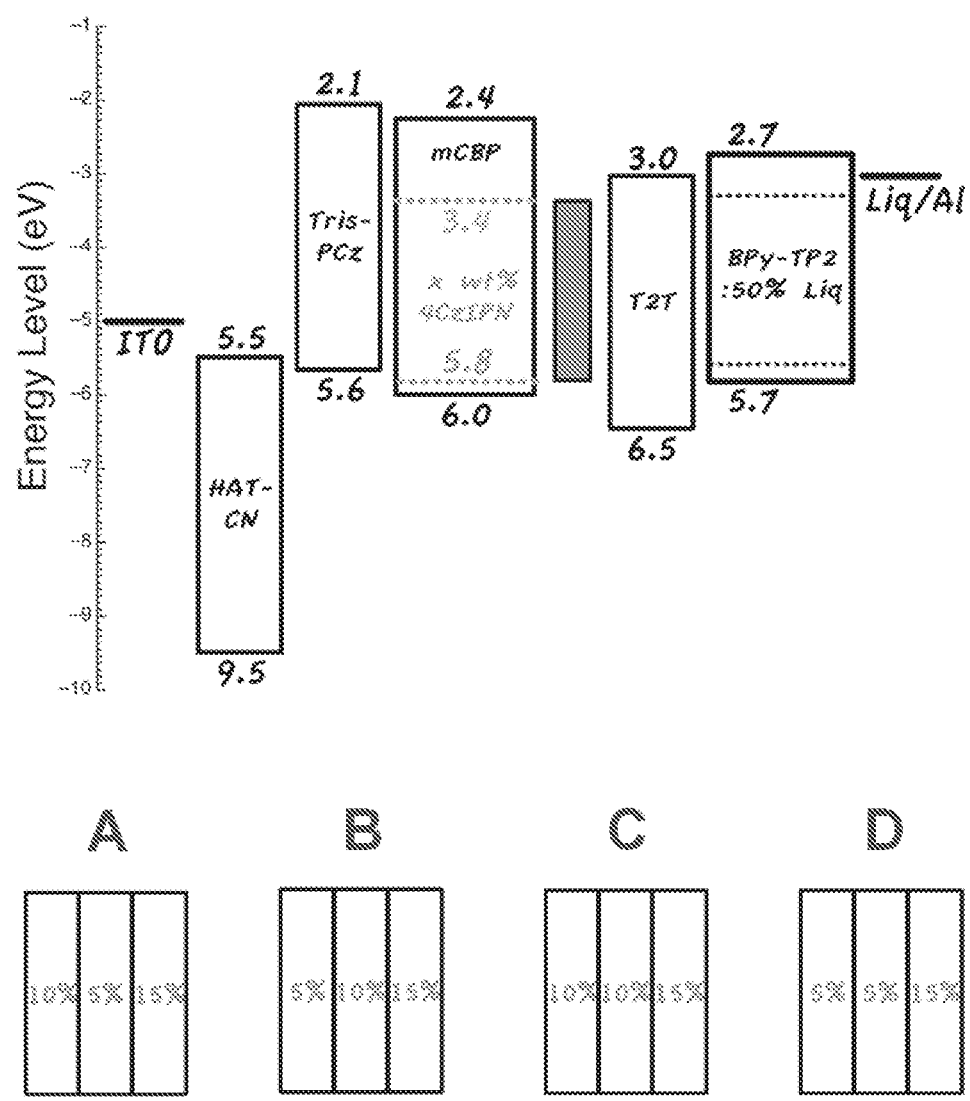
FIG. 31 This shows an energy diagram of an organic electroluminescence device having a charge trap concentration reducing layer and a Liq-containing second electron transporting layer of Example 5, in which the light-emitting layer has a multilayer structure, and multilayer structures A to D.

(Example 5) Production and Evaluation of Organic Electroluminescent Device Having Charge Trap Concentration Reducing Layer of Liq, Having Second Electron Transporting Layer Containing Liq, and Having Light-Emitting Layer Having Multilayer Structure An organic electroluminescent device (EL device) was produced in the same manner as in Example 1, except that the second electron transporting layer contained 50% of Liq and the light-emitting layer was changed to have a multilayer structure of any of A to D in FIG. 31. The numerical values in A to D in FIG. 31 each indicate the 4CzIPN concentration in the structure.

Figure 32:
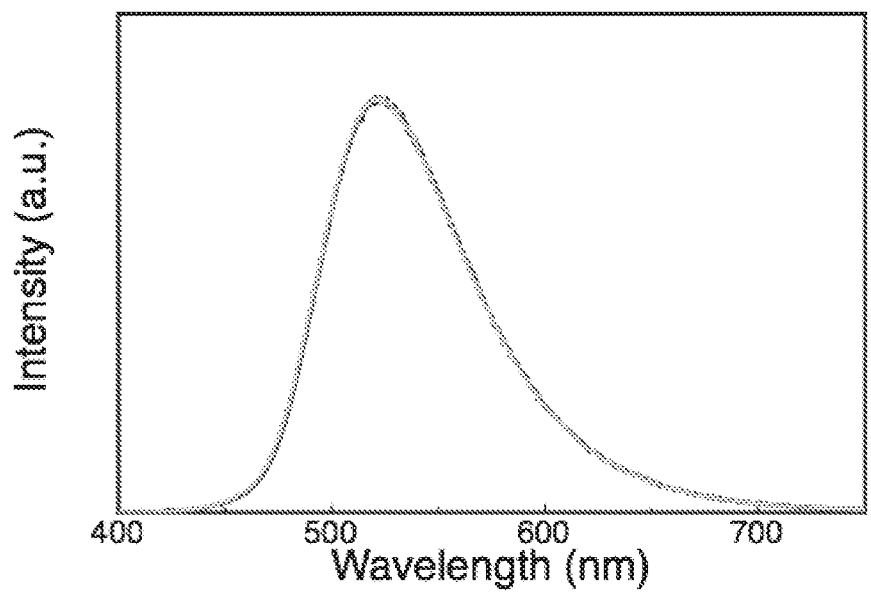
FIG. 32 This is an emission spectrum of an organic electroluminescent device having a charge trap concentration reducing layer and a Liq-containing second electron transporting layer of Example 5, in which the light-emitting layer has a multilayer structure.
Figure 33:
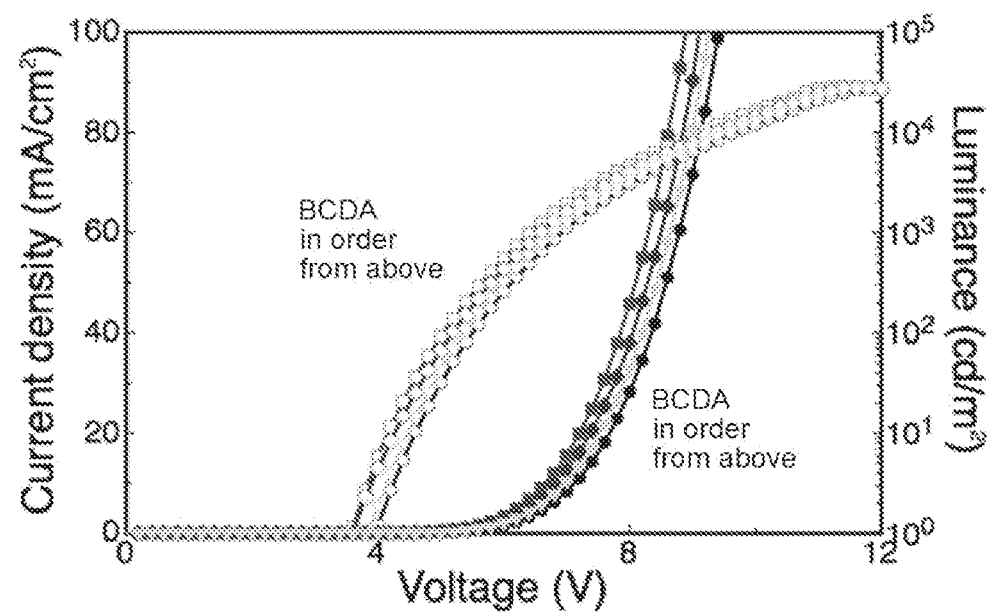
FIG. 33 This is a graph showing a voltage-current density-luminance characteristic of an organic electroluminescent device having a charge trap concentration reducing layer and a Liq-containing second electron transporting layer of Example 5, in which the light-emitting layer has a multilayer structure.
Figure 34:
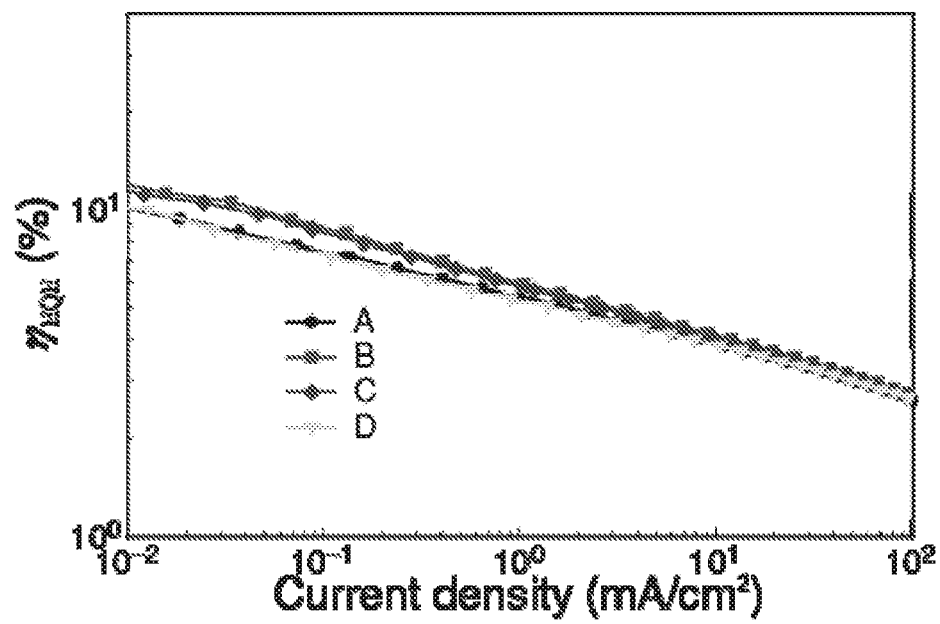
FIG. 34 This is a graph showing a current density-external quantum efficiency characteristic of an organic electroluminescent device having a charge trap concentration reducing layer and a Liq-containing second electron transporting layer of Example 5, in which the light-emitting layer has a multilayer structure.
Figure 35:
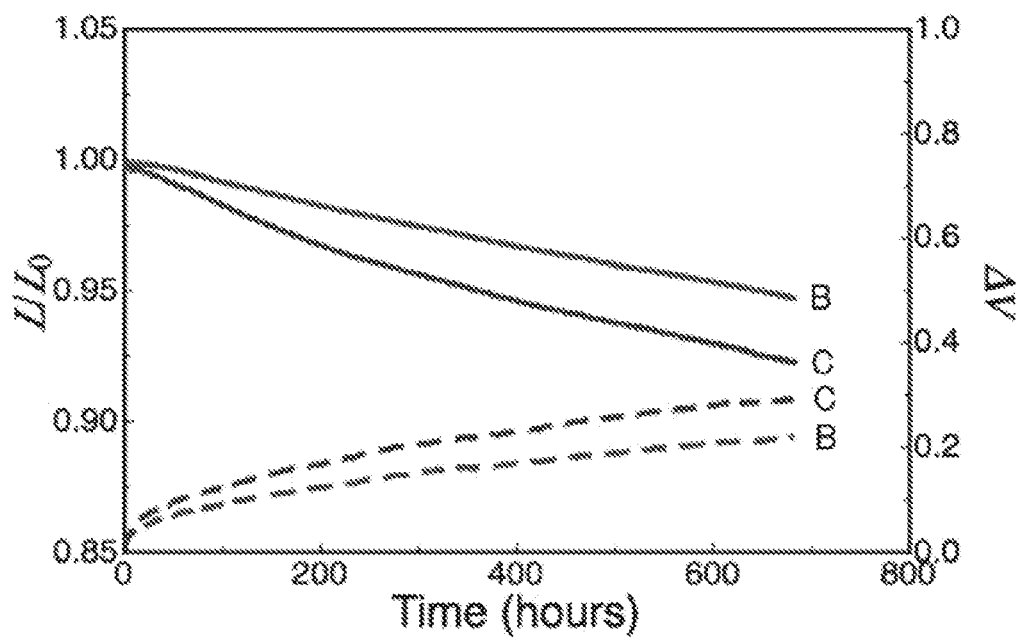
FIG. 35 This is a graph showing a time-dependent change of a luminance ratio and a voltage variation of an organic electroluminescent device having a charge trap concentration reducing layer and a Liq-containing second electron transporting layer of Example 5, in which the light-emitting layer has a multilayer structure.

The energy diagram of the produced organic EL device is shown in FIG. 31, the emission spectrum thereof is in FIG. 32, the voltage-current density-luminance characteristic thereof is in FIG. 33, the current density-external quantum efficiency characteristic is in FIG. 34, and the time-dependent change of the luminance ratio and the voltage variation thereof is in FIG. 35. FIG. 32 shows that the emission spectrum was the same in all of A to D.

From the results in FIG. 35, it is known that both the multilayer structures B and C tested for lifetime had a long lifetime, and in particular, the multilayer structure B succeeded in lifetime prolongation.

(Example 6) Production and Evaluation of Organic Electroluminescent Device Having Charge Trap Concentration Reducing Layer of Liq, Having Light-Emitting Layer Containing T2T (Second Host Material), and Having Second Electron Transporting Layer Containing Liq An organic electroluminescent device (organic EL device) was produced in the same manner as in Example 4, except that the 4CzIPN concentration in the light-emitting layer was 15% by weight, the weight ratio of T2T relative to the total amount of the host material was 15%, 30%, 50% or 70%, and the Liq concentration in the second electron transporting layer was fixed at 50%.

Figure 36:
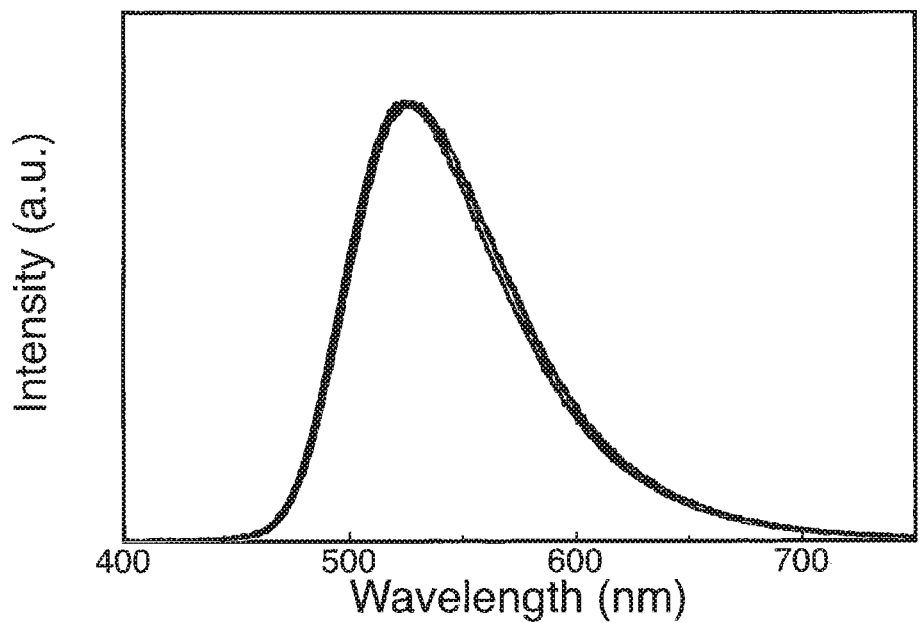
FIG. 36 This is an emission spectrum of an organic electroluminescent device of having a charge trap concentration reducing layer of Example 6, in which the light-emitting layer contains T2T (second host material) and the second electron transporting layer contains Liq.
Figure 37:
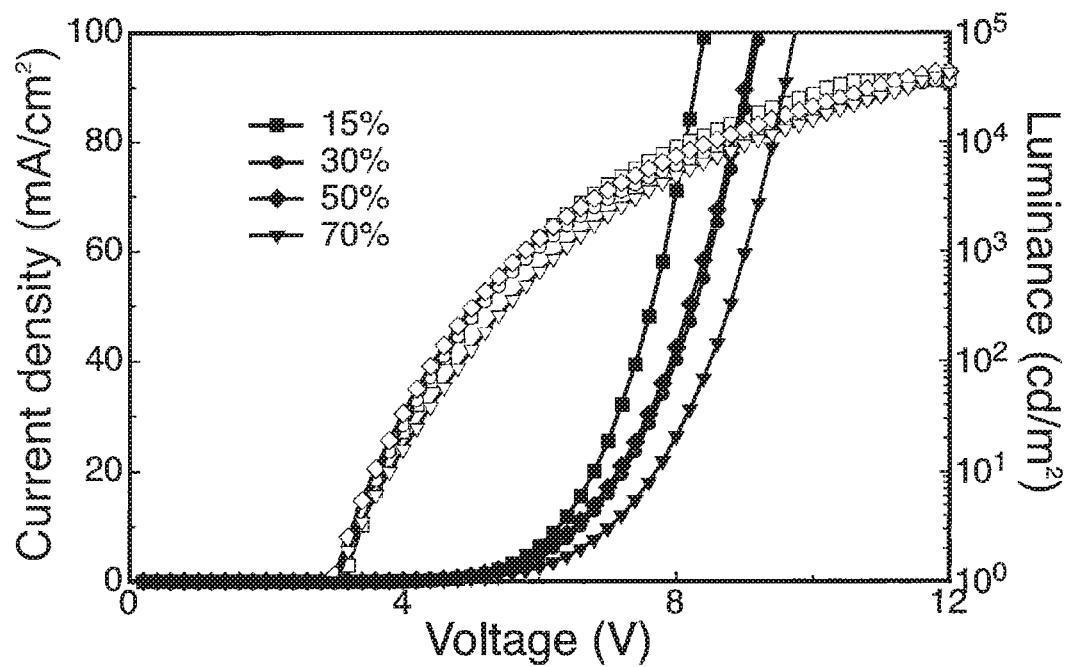
FIG. 37 This is a graph showing a voltage-current density-luminance characteristic of an organic electroluminescent device of having a charge trap concentration reducing layer of Example 6, in which the light-emitting layer contains T2T (second host material) and the second electron transporting layer contains Liq.
Figure 38:
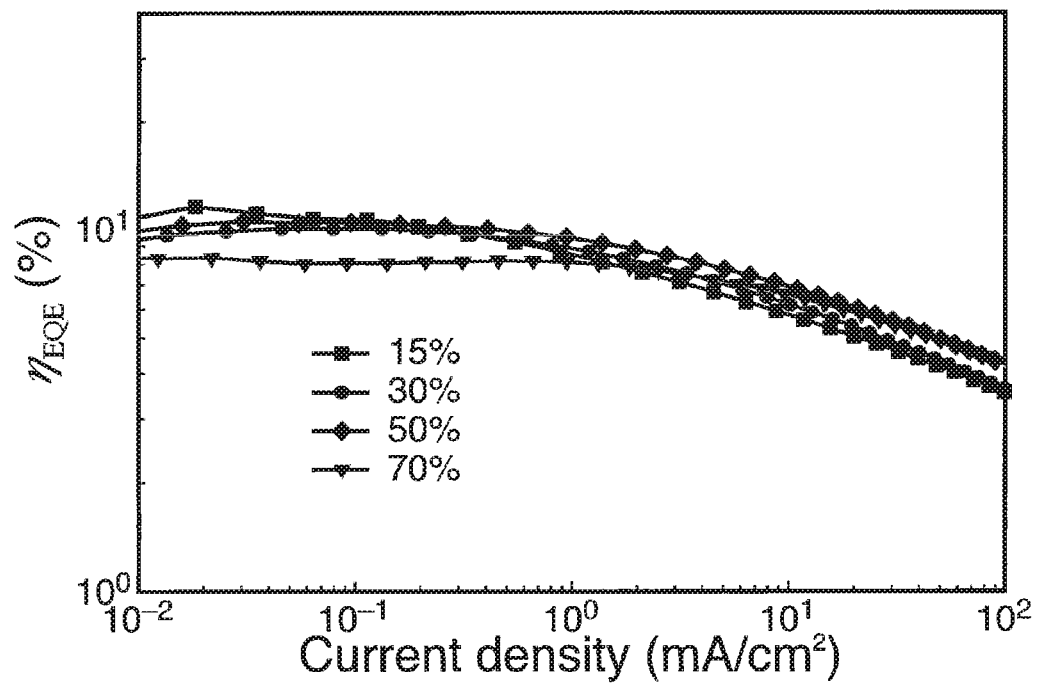
FIG. 38 This is a graph showing a current density-external quantum efficiency characteristic of an organic electroluminescent device of having a charge trap concentration reducing layer of Example 6, in which the light-emitting layer contains T2T (second host material) and the second electron transporting layer contains Liq.
Figure 39:
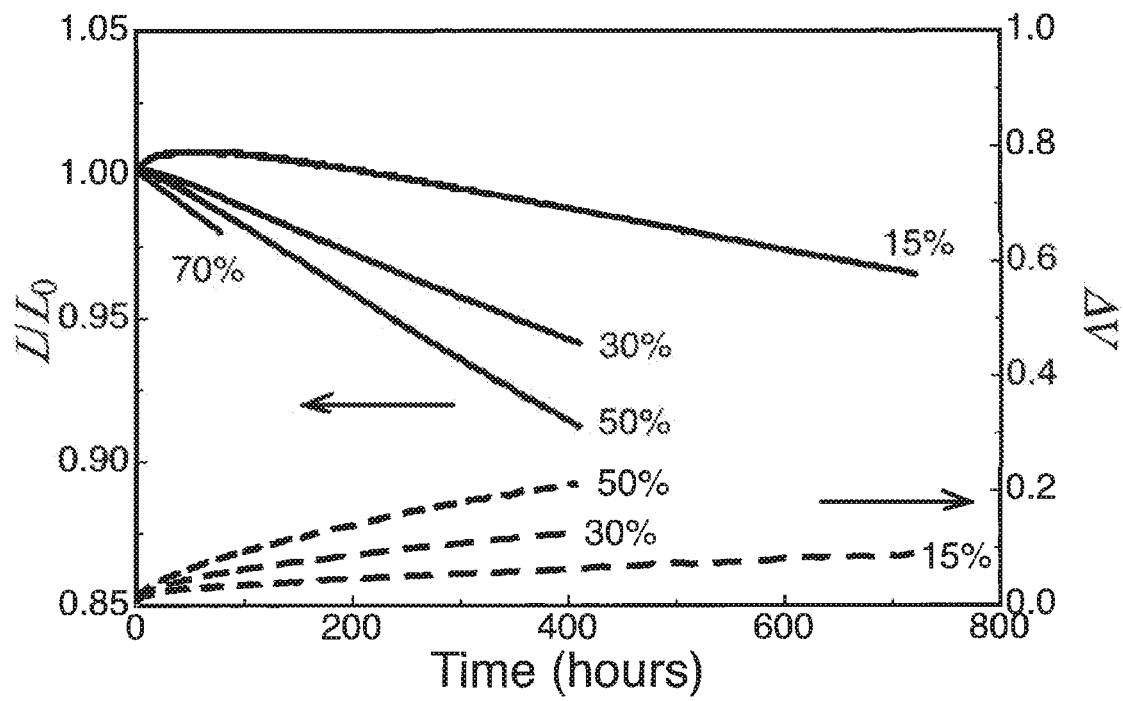
FIG. 39 This is a graph showing a time-dependent change of a luminance ratio and a voltage variation of an organic electroluminescent device of having a charge trap concentration reducing layer of Example 6, in which the light-emitting layer contains T2T (second host material) and the second electron transporting layer contains Liq.

The emission spectrum of the produced organic EL device is shown in FIG. 36, the voltage-current density-luminance characteristic thereof is in FIG. 37, the current density-external quantum efficiency characteristic thereof is in FIG. 38, and the time-dependent change of the luminance ratio and the voltage variation is in FIG. 39. In FIG. 36, all the organic EL devices gave nearly the same emission spectrum. In FIGS. 37 to 39, "15%", "30%", "50%" and "70%" each indicate the ratio of T2T to the total amount of the host material in the light-emitting layer.

Among the characteristic diagram shown in FIG. 39 and the characteristic diagram shown in FIG. 25 (Example 3), those having a 4CzIPN concentration of 15% are compared with each other. It is known that the luminance ratio reduction rate of the organic EL device of this example (organic EL device where the second electron transporting layer contains Liq) containing T2T in an amount of 30% or less of the total amount of the host material is small. From this, it is known that, when the charge trap concentration reducing layer is formed and Liq (the same material as the constituent material in the charge trap concentration reducing layer) is added to the second electron transporting layer, and further T2T (second host material) is used in an amount of 30% or less of the total amount of the host material in the light-emitting layer, the lifetime of the organic EL device can be markedly prolonged.

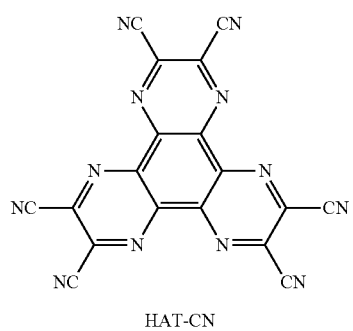

HAT-CN

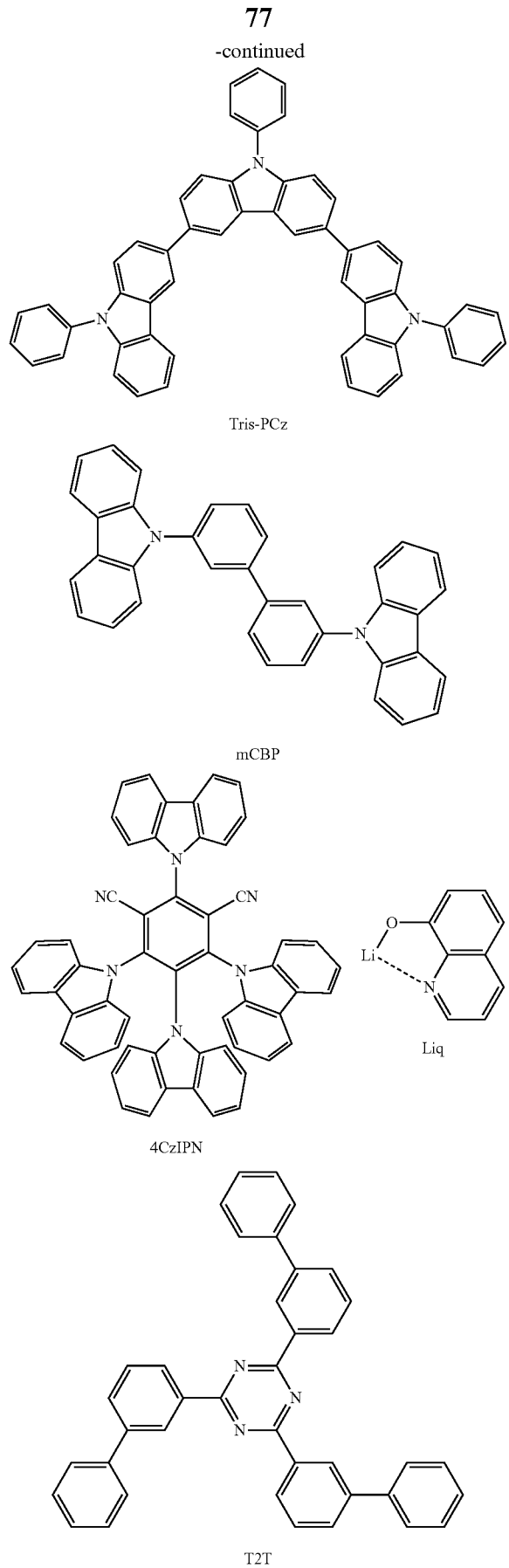

BPy-TP2

INDUSTRIAL APPLICABILITY

The organic electroluminescent device of the present invention is protected from performance deterioration with time in driving and has an extremely long lifetime. Accordingly, the industrial applicability of the present invention is great.

REFERENCE SIGNS LIST

1 Substrate
2 Anode
3 Light-Emitting Layer
4 Charge Trap Concentration Reducing Layer
5 Electron Transporting Layer
6 Cathode
7 Functional Layer
8 Second Electron Transporting Layer
9 Hole Injection Layer
10 Hole Transporting Layer

The invention claimed is:

1. An organic electroluminescent device having a structure of at least an anode, a light-emitting layer, an electron transporting layer and a cathode layered in that order, and having a charge trap concentration reducing layer in the interface between the light-emitting layer and the electron transporting layer in which the charge trap concentration reducing layer is in direct contact with the light-emitting layer, and the charge trap concentration reducing layer has a thickness of from 0.1 to 3 nm.

2. The organic electroluminescent device according to claim 1, wherein the mean thickness of the charge trap concentration reducing layer is 1 to 3 nm.

3. The organic electroluminescent device according to claim 1, wherein the charge trap concentration reducing layer contains a Group-1 atom, a Group-2 atom or a transition metal atom.

4. The organic electroluminescent device according to claim 3, wherein the charge trap concentration reducing layer is a layer containing Li.

5. The organic electroluminescent device according to claim 4, wherein the charge trap concentration reducing layer is a layer formed of a 8-hydroxyquinolinolate derivative.

6. The organic electroluminescent device according to claim 1, wherein the electron transporting layer does not contain a metal atom.

7. The organic electroluminescent device according to claim 1, having a second electron transporting layer on the cathode side of the electron transporting layer, and having a functional layer containing a Group-1 atom, a Group-2 atom or a transition metal atom between the electron transporting layer and the second electron transporting layer.

8. The organic electroluminescent device according to claim 7, wherein the mean thickness of the functional layer is 0.1 to 100 nm.

9. The organic electroluminescent device according to claim 7, wherein the functional layer is a layer containing Li.

10. The organic electroluminescent device according to claim 9, wherein the functional layer is a layer formed of a 8-hydroxyquinolinolate derivative.

11. The organic electroluminescent device according to claim 7, wherein the second electron transporting layer does not contain a metal atom.

12. The organic electroluminescent device according to claim 1, wherein the light-emitting layer contains a first host material and a second host material.

13. The organic electroluminescent device according to claim 12, wherein the first host material and the second host material both have a lowest excited triplet energy level higher than the lowest excited triplet energy level of the light-emitting material that the light-emitting layer contains.

14. The organic electroluminescent device according to claim 12, wherein the second host material has electron transportability.

15. The organic electroluminescent device according to claim 12, wherein the second host material is the same material as the constituent material of the electron transporting layer adjacent to the charge trap concentration reducing layer.

16. The organic electroluminescent device according to claim 12, wherein the second host material is a compound represented by the following general formula (1):

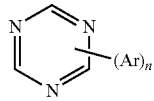

wherein, in the general formula (1), Ar represents a substituted or unsubstituted aryl group, or a substituted or unsubstituted heteroaryl group, n represents an integer of 1 to 3, and when n is 2 or more, plural Ar's may be the same or different.

17. The organic electroluminescent device according to claim 16, wherein the compound represented by the general formula (1) is a compound represented by the following general formula (2):

General Formula (2)

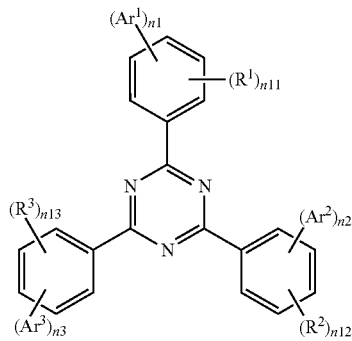

wherein, in the general formula (2), $Ar^1$, $Ar^2$ and $Ar^3$ each independently represent a substituted or unsubstituted aryl group, or a substituted or unsubstituted heteroaryl group, $R^1$, $R^2$ and $R^3$ each independently represent a substituent, and the substituent is neither a substituted or unsubstituted aryl group nor a substituted or unsubstituted heteroaryl group, n1, n2 and n3 each independently represent an integer of 1 to 5, n11, n12 and n13 each independently represent an integer of 0 to 4.

18. The organic electroluminescent device according to claim 1, wherein the light-emitting layer has a multilayer structure having a different light-emitting material concentration in each layer.

19. The organic electroluminescent device according to claim 7, wherein at least one of the electron transporting layer and the second electron transporting layer contains a compound containing a Group-1 atom, a Group-2 atom or a transition metal atom.

20. The organic electroluminescent device according to claim 19, wherein the second electron transporting layer contains a compound containing a Group-1 atom, a Group-2 atom or a transition metal atom.

21. The organic electroluminescent device according to claim 19, wherein the compound is a compound containing Li.

22. The organic electroluminescent device according to claim 19, wherein the compound is a 8-hydroxyquinolinolate derivative.

23. The organic electroluminescent device according to claim 7, wherein the second electron transporting layer contains the same material as the constituent material of the charge trap concentration reducing layer.

* * * * *